US012167084B2

(12) United States Patent
Coover et al.

(10) Patent No.: US 12,167,084 B2
(45) Date of Patent: *Dec. 10, 2024

(54) METHODS AND APPARATUS FOR PLAYBACK USING PRE-PROCESSED INFORMATION AND PERSONALIZATION

(71) Applicant: GRACENOTE, INC., Emeryville, CA (US)

(72) Inventors: Robert Coover, Orinda, CA (US); Cameron Aubrey Summers, Oakland, CA (US); Joseph Renner, Oakland, CA (US); Markus Cremer, Orinda, CA (US); Warren Mansfield, Emeryville, CA (US)

(73) Assignee: GRACENOTE, INC., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/462,252

(22) Filed: Sep. 6, 2023

(65) Prior Publication Data
US 2024/0056635 A1    Feb. 15, 2024

Related U.S. Application Data

(63) Continuation of application No. 16/661,989, filed on Oct. 23, 2019, now Pat. No. 11,792,481.
(Continued)

(51) Int. Cl.
H04N 21/442    (2011.01)
G06F 3/16    (2006.01)
(Continued)

(52) U.S. Cl.
CPC ....... H04N 21/44224 (2020.08); G06F 3/165 (2013.01); G06N 3/04 (2013.01);
(Continued)

(58) Field of Classification Search
USPC .......................................... 386/201
See application file for complete search history.

(56) References Cited

U.S. PATENT DOCUMENTS 7,548,854 B2    6/2009   Roy et al.
7,903,825 B1    3/2011   Melanson
(Continued)

FOREIGN PATENT DOCUMENTS

JP    2009-532739 A    9/2009
JP    2016-519784 A    7/2016
(Continued)

OTHER PUBLICATIONS

Japanese Patent Office, "Notice of Reaons for Refusal," issued in connection with Japanese Patent Application No. 2021-522530, on Jun. 28, 2022, 6 pages including partial English Translation.
(Continued)

Primary Examiner — Nigar Chowdhury
(74) Attorney, Agent, or Firm — MCDONNELL BOEHNEN HULBERT & BERGHOFF LLP

(57) ABSTRACT

Methods, apparatus, systems and articles of manufacture are disclosed for playback using pre-processed profile information and personalization. Example apparatus disclosed herein include a synchronizer to, in response to receiving a media signal to be played on a playback device, access an equalization (EQ) profile corresponding to the media signal; an EQ personalization manager to generate a personalized EQ setting; and an EQ adjustment implementor to modify playback of the media signal on the playback device based on a blended equalization generation based on the EQ profile and the personalized EQ setting.

20 Claims, 16 Drawing Sheets

Related U.S. Application Data

(60) Provisional application No. 62/850,528, filed on May 20, 2019, provisional application No. 62/816,823, filed on Mar. 11, 2019, provisional application No. 62/816,813, filed on Mar. 11, 2019, provisional application No. 62/750,113, filed on Oct. 24, 2018.

(51) Int. Cl.

| | |
|---|---|
| G06N 3/04 | (2023.01) |
| G06N 3/08 | (2023.01) |
| G10L 25/30 | (2013.01) |
| G10L 25/51 | (2013.01) |
| H03G 5/16 | (2006.01) |
| H04N 9/87 | (2006.01) |
| H04N 21/439 | (2011.01) |
| H04N 21/45 | (2011.01) |
| H04R 3/04 | (2006.01) |
| H03F 3/181 | (2006.01) |

(52) U.S. Cl.
CPC ............... *G06N 3/08* (2013.01); *G10L 25/30* (2013.01); *G10L 25/51* (2013.01); *H03G 5/165* (2013.01); *H04N 9/87* (2013.01); *H04N 21/439* (2013.01); *H04N 21/4524* (2013.01); *H04R 3/04* (2013.01); *H03F 3/181* (2013.01); *H04R 2430/01* (2013.01); *H04R 2499/13* (2013.01)

(56) References Cited

U.S. PATENT DOCUMENTS

| | | |
|---|---|---|
| 9,130,837 B2 | 10/2015 | Jeffrey et al. |
| 9,288,579 B2 | 3/2016 | Choi et al. |
| 9,305,559 B2 | 4/2016 | Sharma et al. |
| 9,380,383 B2 | 6/2016 | Brenner et al. |
| 9,401,153 B2 | 7/2016 | Sharma et al. |
| 10,134,373 B2 | 11/2018 | Jeffrey et al. |
| 10,726,874 B1 | 7/2020 | Smith |
| 2002/0019733 A1 | 2/2002 | Erell |
| 2003/0103079 A1 | 6/2003 | Adatia et al. |
| 2008/0037804 A1 | 2/2008 | Shmunk |
| 2008/0059160 A1 | 3/2008 | Saunders et al. |
| 2009/0157575 A1 | 6/2009 | Schobben et al. |
| 2011/0191101 A1 | 8/2011 | Uhle et al. |
| 2011/0251704 A1 | 10/2011 | Walsh et al. |
| 2012/0063603 A1 | 3/2012 | Evans |
| 2012/0278087 A1 | 11/2012 | Hosokawa |
| 2013/0007201 A1 | 1/2013 | Jeffrey et al. |
| 2013/0178964 A1 | 7/2013 | Bergmann |
| 2013/0272548 A1 | 10/2013 | Visser et al. |
| 2013/0347025 A1* | 12/2013 | Prakash ............ H04N 21/25875 725/25 |
| 2014/0081483 A1* | 3/2014 | Weinmann ............... G08G 1/20 701/14 |
| 2014/0108020 A1 | 4/2014 | Sharma et al. |
| 2014/0142954 A1 | 5/2014 | Cameron et al. |
| 2014/0192136 A1* | 7/2014 | Yu ............................ H04N 7/147 348/14.03 |
| 2014/0211968 A1 | 7/2014 | Choi et al. |
| 2014/0281000 A1* | 9/2014 | Dattagupta ............... H04L 47/11 709/231 |
| 2014/0334644 A1 | 11/2014 | Selig et al. |
| 2014/0336448 A1 | 11/2014 | Banna et al. |
| 2015/0073574 A1 | 3/2015 | Brenner |
| 2015/0193195 A1 | 7/2015 | Lin et al. |
| 2016/0036404 A1 | 2/2016 | Fleischmann et al. |
| 2016/0373197 A1 | 12/2016 | Brenner et al. |
| 2017/0070817 A1 | 3/2017 | Seo et al. |
| 2017/0242657 A1 | 8/2017 | Jarvis |
| 2017/0289718 A1 | 10/2017 | Jarvis et al. |
| 2017/0351480 A1 | 12/2017 | MacNeile et al. |
| 2018/0115592 A1 | 4/2018 | Samineni |
| 2018/0357989 A1 | 12/2018 | Goren et al. |
| 2019/0156799 A1 | 5/2019 | Jeffrey et al. |
| 2019/0295567 A1 | 9/2019 | Sudo |
| 2020/0133622 A1 | 4/2020 | Coover et al. |
| 2020/0133623 A1 | 4/2020 | Coover et al. |
| 2020/0133624 A1 | 4/2020 | Coover et al. |
| 2020/0136580 A1 | 4/2020 | Renner et al. |
| 2020/0142667 A1 | 5/2020 | Querze |
| 2020/0194004 A1 | 6/2020 | Bates |
| 2021/0152858 A1* | 5/2021 | Berger ................. H04N 21/234 |
| 2021/0281943 A1* | 9/2021 | Lehnert ................... G06F 3/041 |

FOREIGN PATENT DOCUMENTS

| | | |
|---|---|---|
| JP | 2017-54121 A | 3/2017 |
| KR | 101400865 | 5/2014 |
| WO | 2007/120453 A1 | 10/2007 |
| WO | 2014/160678 A2 | 10/2014 |
| WO | 2020086771 A1 | 4/2020 |

OTHER PUBLICATIONS

European Patent Office, "Extended European Search Report," issued in connection with European Patent Application No. 19876495.3, on Jul. 15, 2022, 9 pages.

Korean Intellectual Property Office, "Decision to Grant," issued in connection with Korean Patent Application No. 10-2021-7015219, on Sep. 7, 2022, 5 pages including partial English Translation.

United States Patent and Trademark Office, "Advisory Action", issued in connection with U.S. Appl. No. 16/661,973, filed Mar. 16, 2021, (3 pages).

United States Patent and Trademark Office, "Corrected Notice of Allowance," issued in connection with U.S. Appl. No. 16/661,985, filed Apr. 6, 2021, (2 pages).

United States Patent and Trademark Office, "Corrected Notice of Allowance," issued in connection with U.S. Appl. No. 16/661,985, filed Feb. 9, 2021, (2 pages).

United States Patent and Trademark Office, "Notice of Allowance," issued in connection with U.S. Appl. No. 16/661,973, filed May 3, 2021, (9 pages).

United States Patent and Trademark Office, "Notice of Allowance," issued in connection with U.S. Appl. No. 16/661,975, filed May 7, 2021, (8 pages).

International Search Authority, "International Preliminary Report on Patentability", issued in connection with International patent application No. PCT/US2019/057736, mailed Apr. 27, 2021 (5 pages).

United States Patent and Trademark Office, "Corrected Notice of Allowance," issued in connection with U.S. Appl. No. 16/661,975, filed Nov. 8, 2020, (8 pages).

United States Patent and Trademark Office, "Final Office Action" issued in connection with U.S. Appl. No. 16/661,985, filed Dec. 17, 2020, (15 pages).

United States Patent and Trademark Office, "Final Office Action" issued in connection with U.S. Appl. No. 16/661,973, filed Dec. 22, 2020, (20 pages).

United States Patent and Trademark Office, "Notice of Allowance" issued in connection with U.S. Appl. No. 16/661,983, filed Jul. 15, 2020, (28 pages).

United States Patent and Trademark Office, "Non-Final Office Action," issued in connection with U.S. Appl. No. 16/661,975, filed Jun. 23, 2020, (13 pages).

United States Patent and Trademark Office, "Non-Final Office Action" issued in connection with U.S. Appl. No. 16/661,973, filed Jun. 26, 2020, (16 pages).

International Search Authority, "International Search Report", issued in connection with International patent application No. PCT/US2019/057736, mailed Feb. 14, 2020 (4 pages).

International Search Authority, "Written Opinion", issued in connection with International patent application No. PCT/US2019/057736, mailed Feb. 14, 2020 (5 pages).

(56) References Cited

OTHER PUBLICATIONS

United States Patent and Trademark Office, "Notice of Allowance" issued in connection with U.S. Appl. No. 16/661,985, filed Jun. 9, 2020, (22 pages).

* cited by examiner

METHODS AND APPARATUS FOR PLAYBACK USING PRE-PROCESSED INFORMATION AND PERSONALIZATION

RELATED APPLICATION

This patent arises from an application claiming benefit of U.S. Provisional Patent Application Ser. No. 62/750,113, which was filed on Oct. 24, 2018; U.S. Provisional Patent Application Ser. No. 62/816,813, which was filed on Mar. 11, 2019; U.S. Provisional Patent Application Ser. No. 62/816,823, which was filed on Mar. 11, 2019; and U.S. Provisional Patent Application Ser. No. 62/850,528, which was filed on May 20, 2019. U.S. Provisional Patent Application Ser. No. 62/750,113; U.S. Provisional Patent Application Ser. No. 62/816,813; U.S. Provisional Patent Application Ser. No. 62/816,823; and U.S. Provisional Patent Application Ser. No. 62/850,528 are hereby incorporated herein by reference in their entirety. Priority to U.S. Provisional Patent Application Ser. No. 62/750,113; U.S. Provisional Patent Application Ser. No. 62/816,813; U.S. Provisional Patent Application Ser. No. 62/816,823; and U.S. Provisional Patent Application Ser. No. 62/850,528 is hereby claimed.

FIELD OF THE DISCLOSURE

This disclosure relates generally to audio playback settings, and, more particularly, to methods and apparatus for playback using pre-processed profile information and personalization.

BACKGROUND

In recent years, a multitude of media of varying characteristics has been delivered using an increasing number of channels. Media can be received using more traditional channels (e.g., the radio, mobile phones, etc.), or using more recently developed channels, such as using Internet-connected streaming devices. As these channels have developed, systems which are able to process and output audio from multiple sources have been developed as well. These audio signals may have differing characteristics (e.g., dynamic range, volume, etc.). Some automobile media systems, for example, are capable of delivering media from compact discs (CD's), Bluetooth connecting devices, universal serial bus (USB) connected devices, Wi-Fi connected devices, auxiliary inputs, and other sources.

BRIEF DESCRIPTION OF THE DRAWINGS

In general, the same reference numbers will be used throughout the drawing(s) and accompanying written description to refer to the same or like parts.

DETAILED DESCRIPTION

Figure 1:
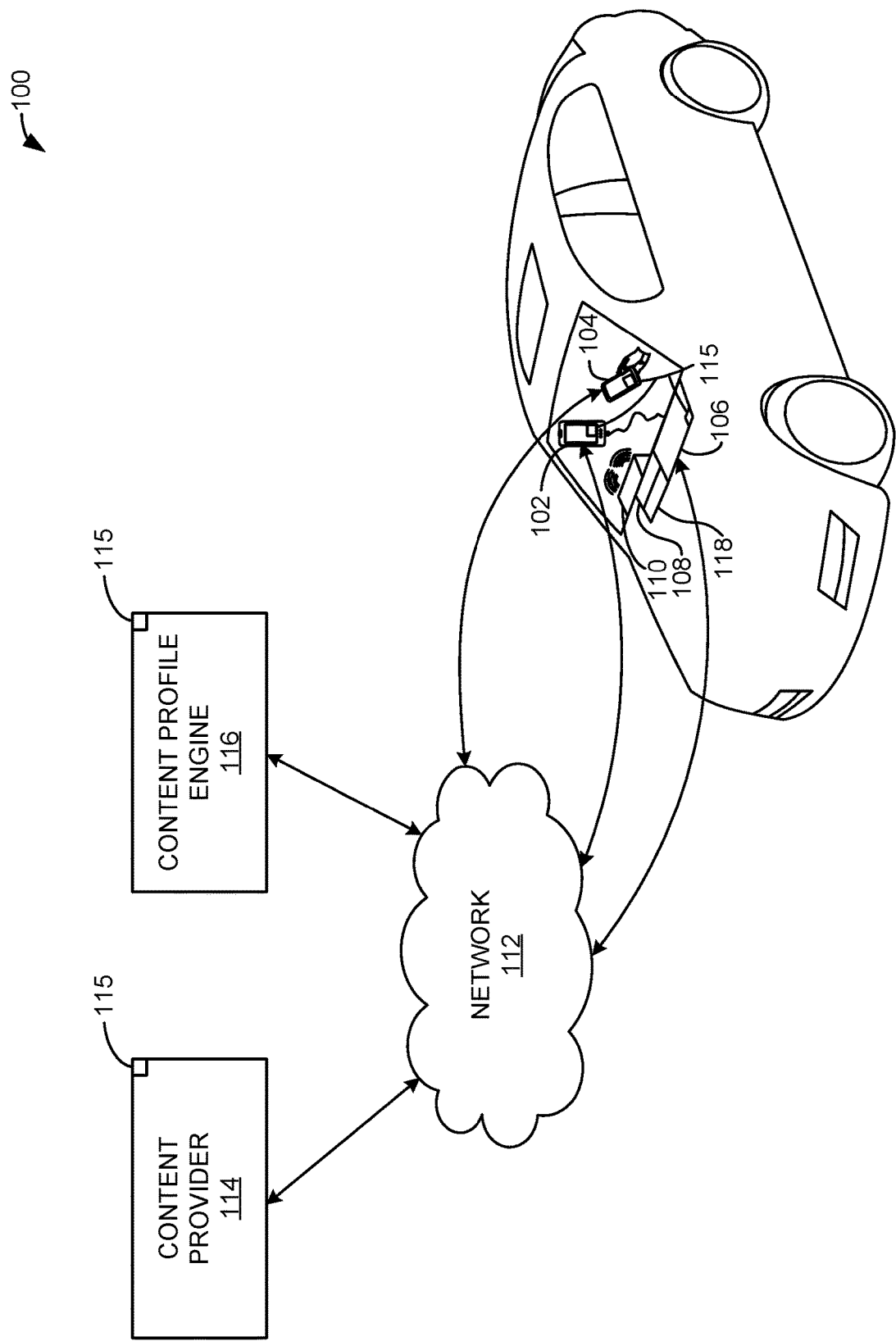
FIG. 1 is a block diagram illustrating an example environment constructed in accordance with the teachings of this disclosure for dynamic playback setting adjustment based on real-time analysis of media characteristics.

In conventional media processing implementations, audio signals associated with different media may have different characteristics. For example, different audio tracks may have different frequency profiles (e.g., varying volume levels at different frequencies of the audio signal), different overall (e.g., average) volumes, pitch, timbre, etc. For example, media on one CD may be recorded and/or mastered differently than media of another CD. Similarly, media retrieved from a streaming device may have significantly different audio characteristics than media retrieved from an uncompressed medium such as a CD and may also differ from media retrieved from the same device via a different application and/or audio compression level. As users increasingly listen to media of a variety of different sources and of a variety of genres and types, differences in audio characteristics between sources and between media of the same source can become very noticeable, and potentially irritating to a listener. Audio equalization is a technique utilized to adjust volume levels of different frequencies in an audio signal. For example, equalization can be performed to increase the presence of low frequency signals, mid-frequency signals, and/or high-frequency signals based on a preference associated with a genre of music, an era of music, a user preference, a space in which the audio signal is output, etc. However, the optimal or preferred equalization settings may vary depending on the media being presented. Hence, a listener may need to frequently adjust equalization settings to optimize the listening experience based on a change in media (e.g., a change in the genre, a change in era, a change in overall volume of the track, etc.).

In some conventional approaches, an equalization setting can be selected that is associated with a specific genre or type of music. For example, in a media unit on a vehicle, a listener may be able to select an equalizer for "Rock," which is configured to boost frequencies that a user may want to hear more of, and cut other frequencies which may be overpowering, based on typical characteristics of Rock music. However, such genre-specific broadly applied, equalization settings fail to address significant differences between different songs, and further still require a user to manually change the equalization setting when they begin a new track of a different genre, which occurs frequently on radio stations and audio streaming applications.

In a first implementation, example methods, apparatus, systems and articles of manufacture disclosed herein, dynamically adjust audio playback settings (e.g., equalization settings, volume settings, etc.) based on real-time characteristics of audio signals. Examples disclosed herein determine a frequency representation (e.g., a CQT representation) of a sample (e.g., a three second sample) of the audio signal and query a neural network to determine equalization settings specific to the audio signal. In some examples disclosed herein, the equalization settings include a plurality of filters (e.g., low-shelf filters, peaking filters, high shelf filters, etc.), one or more of which can be selected and applied to the audio signal. In example methods, apparatus, systems and articles of manufacture disclosed herein, the neural network that outputs equalization settings is trained using a library of reference media corresponding to a plurality of equalization profiles that are optimized for the media (e.g., as determined by audio engineers).

In the first implementation, example methods, apparatus, systems, and articles of manufacture disclosed herein, query audio samples (e.g., including three seconds of audio) against the neural network on a regular basis (e.g., every second) to determine equalization settings for the profile, to account for changes in the audio signal over time (e.g., different portions of the track having different characteristics, transitions in songs, transitions in genres, etc.). Example methods, apparatus, systems, and articles of manufacture disclosed herein, utilize a smoothing filter (e.g., an exponential smoothing algorithm, a one-pole recursive smoothing filter, etc.) to transition between filter settings to avoid perceptible changes in the equalization settings.

Additionally, example methods, systems, and articles of manufacturing for modifying the playback of content using pre-processed profile information are described in accordance with a second implementation. Example methods, systems, and articles of manufacture access a stream of content to be delivered to a playback device, identify a piece of content within the stream of content to be delivered to the playback device, determine a profile for the identified piece of content, and deliver the determined profile to the playback device. These operations may be performed automatically (e.g., in real-time) on-the-fly.

In the second implementation, example methods, systems, and articles of manufacture receive a stream of content at a playback device, access profile information associated with the stream of content, and modify playback of the stream of content based on the accessed profile information. For example, example methods, systems, and articles of manufacture receive and/or access an audio stream along with profile information identifying a mood or other characteristics assigned to the audio stream and modify playback settings of the playback device (e.g., equalization settings) based on the profile information.

In the second implementation, example methods, systems and articles of manufacture may, therefore, pre-process a content stream provided by a content provider to determine a profile for the content stream, and deliver the profile to a playback device, which may play the content stream with an adjusted, modified, and/or optimized playback experience, among other things.

In a third implementation, example methods, apparatus, systems, and articles of manufacture disclosed herein, analyze and equalize incoming audio signals (e.g., from a storage device, from a radio, from a streaming service, etc.) without a need for user input or adjustments. The techniques disclosed herein analyze incoming audio signals to determine average volume values during a buffer period for a plurality of frequency ranges, standard deviation values during the buffer period for the plurality of frequency ranges, and an energy of the incoming audio signal. By utilizing average frequency values over the buffer period, sudden short-term changes in the incoming audio signal are smoothed out when determining an equalization curve to apply, thereby avoiding drastic changes in the equalization settings.

In the third implementation, example methods, apparatus, systems, and articles of manufacture disclosed herein generate an input feature set including the average volume values during the buffer period for the plurality of frequency ranges and/or the standard deviation values during the buffer period for the plurality of frequency ranges and input the input feature set into a neural network. The example methods, apparatus, systems, and articles of manufacture disclosed herein utilize a neural network trained on a plurality of reference audio signals and a plurality of equalization curves generated by audio engineers. In some examples, the reference audio signals and corresponding equalization curves are tagged (e.g., associated) with an indication of the specific audio engineer that generated the equalization curve, to enable the neural network to learn the different equalization styles and preferences of the different audio engineers. Example methods, apparatus, systems, and articles of manufacture disclosed herein receive gains/cuts (e.g., volume adjustments) corresponding to specific frequency ranges from the neural network. In some examples, the gains/cuts are applied to a frequency representation of the incoming audio signal and then the equalized frequency representation is analyzed to determine whether there are any abnormalities (e.g., sharp spikes or dips in the volume level across frequencies).

In accordance with the third implementation, example methods, apparatus, systems, and articles of manufacture disclosed herein employ a thresholding technique to remove abnormalities in the equalized audio signal prior to finalizing the equalization curve (e.g., the gains/cuts for a plurality of frequency ranges) that is to be applied to the audio signal. In some examples, the thresholding technique analyzes sets of adjacent frequency values (e.g., three or more adjacent frequency values) and determines whether the difference in volume between these adjacent frequency values (e.g., as determined by calculating the second derivative over the frequency range) exceeds a threshold when the EQ gains/cuts 241 from the neural network are applied. In some examples, in response to determining the difference in volume between adjacent frequency values exceeds the threshold, a volume corresponding to a central one of the frequency values can be adjusted to the midpoint between the volume levels at the adjacent frequency values, thereby eliminating the spike or dip in the frequency representation of the equalized audio signal. This adjustment has the subjective effect of a more pleasant EQ curve when compared to an EQ curve that has dips and peaks (e.g., localized outliers) across the spectral envelope.

In the third implementation, example methods, apparatus, systems, and articles of manufacture disclosed herein measure an energy value (e.g., an RMS value) for the incoming audio signal and an energy value after the equalization curve is applied to a representation of the incoming audio signal to attempt to normalize overall volume before and after equalization. For example, if the equalization curve being applied to the audio signal boosts volume in more frequency ranges than it cuts volume, the overall energy of the equalized audio signal may be higher. In some such examples, volume normalization can be performed on the equalized audio signal to remove any noticeable volume changes between the incoming audio signal and the equalized audio signal.

In the third implementation, example methods, apparatus, systems, and articles of manufacture disclosed herein improve audio equalization techniques by dynamically adjusting equalization settings to account for changes in a source (e.g., radio, media stored on a mobile device, compact disc, etc.) providing the incoming audio signal or characteristics (e.g., genre, era, mood, etc.) of media represented in the incoming audio signal. Example techniques disclosed herein utilize a neural network intelligently trained on audio signals equalized by expert audio engineers, enabling the neural network to learn preferences and skills from various audio engineers. Example techniques disclosed herein further improve the equalization adjustments provided by the neural network by performing thresholding techniques to ensure the final equalization curve is smooth and does not have major volume disparities between adjacent frequency ranges.

FIG. 1 is a block diagram illustrating an example environment 100 constructed in accordance with the teachings of this disclosure for dynamic playback settings adjustment based on real-time analysis of media characteristics. The example environment 100 includes media devices 102, 104 that transmit audio signals to a media unit 106. The media unit 106 processes the audio signals (e.g., performing audio equalization techniques as disclosed herein) and transmits the signals to an audio amplifier 108, which subsequently outputs the amplified audio signal to be presented via an output device 110.

In the example of FIG. 1, the media devices 102, 104 and/or the media unit 106 communicate, via a network 112, such as the Internet, with an example content provider 114 or content source (e.g., a broadcaster, a network, a website, and so on), that provides various types of multimedia content, such as audio content and/or video content. Example content providers 114 may include terrestrial or satellite radio stations, online music services, online video services, television broadcasters and/or distributors, networked computing devices (e.g., mobile devices on a network), local audio or music applications, and so on. It should be noted that the content (e.g., audio and/or video content) may be obtained from any source. For example, the term "content source" is intended include users and other content owners (such as artists, labels, movie studios, etc.). In some examples, the content source is a publicly accessible website such as YouTube™.

In some examples, the network 112 may be any network or communication medium that enables communication between the content provider 114, the media device 102, the media device 104, the media unit 106, and/or other networked devices. The example network 112 may be or include a wired network, a wireless network (e.g., a mobile network), a radio or telecommunications network, a satellite network, and so on. For example, the network 112 may include one or more portions that constitute a private network (e.g., a cable television network or a satellite radio network), a public network (e.g., over-the-air broadcast channels or the Internet), and so on.

The example media device 102 of the illustrated example of FIG. 1 is a portable media player (e.g., an MP3 player). The example media device 102 stores or receives audio signals and/or video signals corresponding to media from the content provider 114. For example, the media device 102 can receive audio signals and/or video signals from the content provider 114 over the network 112. The example media device 102 is capable of transmitting the audio signals to other devices. In the illustrated example of FIG. 1, the media device 102 transmits audio signals to the media unit 106 via an auxiliary cable. In some examples, the media device 102 may transmit audio signals to the media unit 106 via any other interface. In some examples, the media device 102 and the media unit 106 may be the same device (e.g., the media unit 106 may be a mobile device, which is capable of performing audio equalization techniques disclosed herein on audio being presented on the mobile device).

The example media device 104 of the illustrated example of FIG. 1 is a mobile device (e.g., a cell phone). The example media device 104 stores or receives audio signals corresponding to media and is capable of transmitting the audio signals to other devices. In the illustrated example of FIG. 1, the media device 104 transmits audio signals to the media unit 106 wirelessly. In some examples, the media device 104 may use Wi-Fi, Bluetooth®, and/or any other technology to transmit audio signals to the media unit 106. In some examples, the media device 104 may interact with components of a vehicle or other devices for a listener to select media for presentation in the vehicle. The media devices 102, 104 may be any devices which are capable of storing and/or accessing audio signals. In some examples, the media devices 102, 104 may be integral to the vehicle (e.g., a CD player, a radio, etc.).

The example media unit 106 of the illustrated example of FIG. 1 is capable of receiving audio signals and processing them. In the illustrated example of FIG. 1, the example media unit 106 receives media signals from the media devices 102, 104 and processes them to perform audio equalization techniques as disclosed herein. The example media unit 106 is capable of monitoring audio that is being output by the output device 110 to determine the average volume level of audio segments, audio characteristics (e.g., frequency, amplitude, time values, etc.) in real time. In some examples, the example media unit 106 is implemented as software and is included as part of another device, available either through a direct connection (e.g., a wired connection) or through a network (e.g., available on the cloud). In some examples, the example media unit 106 may be incorporated with the audio amplifier 108 and the output device 110 and may output audio signals itself following processing of the audio signals.

In some examples, the media device 102, the media device 104, and/or the media unit 106 can communicate with the content provider 114, and/or a content profile engine 116 via the network 112. In additional or alternative examples, the media device 102 and/or the media device 104 can include a tuner configured to receive a stream of audio or video content and play the stream of audio or video content by processing the stream and outputting information (e.g., digital or analog) usable by a display of the media device 102 and/or the media device 104 to present or play back the audio or video content to a user associated with the media device 102 and/or the media device 104. The media device 102 and/or the media device 104 may also include a display or other user interface configured to display the processed stream of content and/or associated metadata. The display may be a flat-panel screen, a plasma screen, a light emitting diode (LED) screen, a cathode ray tube (CRT), a liquid crystal display (LCD), a projector, and so on.

In some examples, the content provider 114, the content profile engine 116, the media device 102, the media device 104, and/or the media unit 106 may include one or more fingerprint generators 115 configured to generate identifiers for content being transmitted or broadcast by the content provider 114 and/or received or accessed by the media device 102, the media device 104, and/or the media unit 106. For example, the fingerprint generators 115 may include a reference fingerprint generator (e.g., a component that calculates a hash value from a portion of content) that is configured to generate reference fingerprints or other identifiers of received content, among other things.

In some examples, the media unit 106 can be configured to modify the playback experience of content played by the media device 102 and/or the media device 104. For example, the media unit 106 can access a profile associated with a stream of content and utilize the profile to modify, adjust, and/or otherwise control various playback settings (e.g., equalization settings) associated with a quality or character for the playback of the content. In an example where the content is video or other visual content, the playback settings may include color palette settings, color layout settings, brightness settings, font settings, artwork settings, and so on.

The example audio amplifier 108 of the illustrated example of FIG. 1 is a device that is capable of receiving the audio signal that has been processed (e.g., equalized) by the media unit 106 and performing the appropriate playback setting adjustments (e.g., amplification of specific bands of the audio signal, volume adjustments based on a user input, etc.) for output to the output device 110. In some examples, the audio amplifier 108 may be incorporated into the output device 110. In some examples, the audio amplifier 108 amplifies the audio signal based on an amplification output value from the media unit 106. In some examples, the audio amplifier 108 amplifies the audio signal based on an input from a listener (e.g., a passenger or driver in a vehicle adjusting a volume selector). In additional or alternative examples, the audio is output directly from the media unit 106 instead of being communicated to an amplifier.

The example output device 110 of the illustrated example of FIG. 1 is a speaker. In some examples, the output device 110 may be multiple speakers, headphones, or any other device capable of presenting audio signals to a listener. In some examples, the output device 110 may be capable of outputting visual elements as well (e.g., a television with speakers). In some examples, the output device 110 may be integrated in the media unit 106. For example, if the media unit 106 is a mobile device, the output device 110 may be a speaker integrated in or otherwise connected with (e.g., via Bluetooth®, auxiliary cable, etc.) the mobile device. In some such examples, the output device 110 may be headphones connected to the mobile device.

In some examples, the content profile engine 116 can access, via the network 112, a stream of content provided by the content provider 114, and perform various processes to determine, generate, and/or select a profile or profile information for the stream of content. For example, the content profile engine 116 can identify the stream of content (e.g., using audio or video fingerprint comparisons), and determine a profile for the identified stream of content. The content profile engine 116 may deliver the profile to the media device 102, the media device 104, and/or the media unit 106, which receives the profile along with the stream of content, and plays the stream of content using certain playback settings that are associated and/or selected based on information within the received profile, among other things.

In the example of FIG. 1, the environment includes an audio EQ engine 118 capable of providing a trained model for use by the media unit 106. In some examples, the trained model resides on the audio EQ engine 118, while in some examples the trained model is exported for direct use on the media unit 106. Machine learning techniques, whether deep learning networks or other experiential/observational learning system, can be used to optimize results, locate an object in an image, understand speech and convert speech into text, and improve the relevance of search engine results, for example.

While the illustrated example environment 100 of FIG. 1 is described in reference to a playback setting adjustment (e.g., audio equalization) implementation in a vehicle, some or all of the devices included in the example environment 100 may be implemented in any environment, and in any combination. For example, the media unit 106, along with any of the audio amplifier 108 and/or the output device 110 may be implemented (e.g., entirely or partially) in a mobile phone, which can perform playback setting adjustment (e.g., audio equalization) utilizing techniques disclosed herein on any media being presented from the mobile device (e.g., streaming music, media stored locally on the mobile device, radio, etc.). In some examples, the environment 100 may be in an entertainment room of a house, wherein the media devices 102, 104 may be personal stereo systems, one or more televisions, laptops, other personal computers, tablets, other mobile devices (e.g., smart phones), gaming consoles, virtual reality devices, set top boxes, or any other devices capable of accessing and/or transmitting media. Additionally, in some examples, the media may include visual elements as well (e.g., television shows, films, etc.).

In some examples, the content profile engine 116 may be part of the content provider 114, the media device 102, the media device 104, and/or the media unit 106. As another example, the media device 102 and/or the media device 104 can include the content provider 114 (e.g., the media device 102 and/or the media device 104 is a mobile device having a music playback application and the content provider 114 is a local store of songs and other audio), among other configurations.

Figure 2:
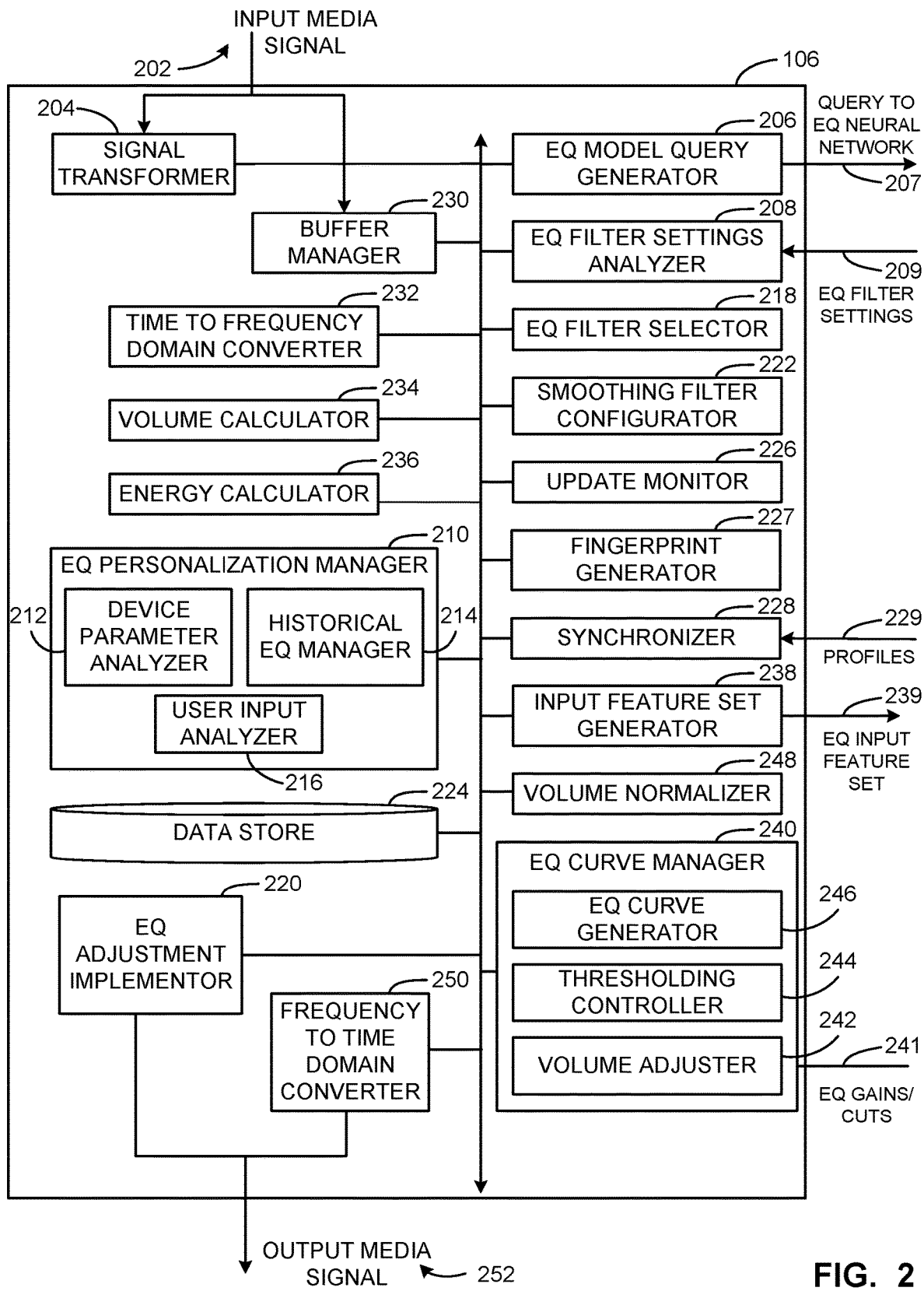
FIG. 2 is a block diagram showing additional detail of the media unit of FIG. 1 to perform techniques for audio equalization in accordance with at least a first implementation, a second implementation, and a third implementation of the teachings of this disclosure.

FIG. 2 is a block diagram showing additional detail of the media unit 106 of FIG. 1 to perform techniques for audio equalization in accordance with at least the first implementation, the second implementation, and the third implementation of the teachings of this disclosure. The example media unit 106 receives an input media signal 202 and processes the signal to determine audio and/or video characteristics. The audio and/or video characteristics are then utilized to determine appropriate audio and/or video playback adjustments based on the characteristics of the input media signal 202. When the input media signal 202 is an audio signal, the media unit 106 transmits an output audio signal to the audio amplifier 108 for amplification prior to output by the output device 110.

The example media unit 106 includes an example signal transformer 204, an example equalization (EQ) model query generator 206, an example EQ filter settings analyzer 208, an example EQ personalization manager 210, an example device parameter analyzer 212, an example historical EQ manager 214, an example user input analyzer 216, an example EQ filter selector 218, an example EQ adjustment implementor 220, an example smoothing filter configurator 222, an example data store 224, and an example update monitor 226. The example media unit 106 further includes an example fingerprint generator 227 and an example synchronizer 228. The example media unit 106 additionally includes an example buffer manager 230, an example time to frequency domain converter 232, an example volume calculator 234, an example energy calculator 236, an example input feature set generator 238, an example EQ curve manager 240, an example volume adjuster 242, and example thresholding controller 244, an example EQ curve generator 246, an example volume normalizer 248, and an example frequency to time domain converter 250.

The example media unit 106 is configured to operate according to at least three implementations. In a first implementation, the media unit 106 equalizes media in real-time according to filter settings received from a neural network in response to a query including a frequency representation of the input media signal 202. In the first implementation, after processing the filter settings, the media unit 106 can generate an output media signal 252 that is equalized according to at least some of the filter settings. In some examples of the first implementation, the media unit 106 can additionally apply one or more smoothing filters to the equalized version of the input media signal 202 prior to outputting the output media signal 252.

In a second implementation, the media unit 106 equalizes media dynamically according to one or more profiles received from a content profile engine (e.g., the content profile engine 116). In the second implementation, after processing the one or more profiles, the media unit 106 can generate the output media signal 252 that is equalized according to at least some of the one or more profiles. In some examples of the second implementation, the media unit 106 can additionally apply personalized equalization to the input media signal 202 prior to outputting the output media signal 252.

In a third implementation, the media unit 106 equalizes media in real-time according to equalization gain and cut values received from a neural network in response to an input feature set including features based on the input media signal 202. In the third implementation, after processing the filter settings, the media unit 106 can generate the output media signal 252 that is equalized according to at least some of the gain and cut values. In some examples of the third implementation, the media unit 106 can apply thresholding to the equalized version of the input media signal 202 to remove local outliers in the output media signal 252.

First Implementation: Filter-Based Equalization

In the first implementation, the example input media signal 202 can be an audio signal that is to be processed and output for presentation. The input media signal 202 may be accessed from a radio signal (e.g., an FM signal, an AM signal, a satellite radio signal, etc.), from a compact disc, from an auxiliary cable (e.g., connected to a media device), from a Bluetooth signal, from a Wi-Fi signal, or from any other medium. The input media signal 202 is accessed by the signal transformer 204, the EQ adjustment implementor 220, and/or the update monitor 226. The input media signal 202 is transformed by the EQ adjustment implementor 220 to be output by the media unit 106 as the output media signal 252.

The example signal transformer 204 of the illustrated example of FIG. 2 transforms the input media signal 202 to a frequency and/or characteristic representation of the audio signal. For example, the signal transformer 204 can transform the input media signal 202 to a CQT representation. In some examples, the signal transformer 204 transforms the input media signal 202 using a Fourier transform. In some examples, the signal transformer 204 continually transforms the input media signal 202 into a frequency and/or characteristic representation, while in other examples the signal transformer 204 transforms the input media signal 202 at a regular interval or in response to a demand (e.g., whenever it is required for dynamic audio playback settings adjustment) from one or more other components of the media unit 106. In some examples, the signal transformer 204 transforms the input media signal 202 in response to a signal from the update monitor 226 (e.g., indicating it is time to update the audio playback settings). The signal transformer 204 of the illustrated example communicates the frequency and/or characteristic representation of the input media signal 202 to the EQ model query generator 206, the fingerprint generator 227, and/or the synchronizer 228.

The EQ model query generator 206 of the illustrated example of FIG. 2 generates and communicates EQ queries 207 based on the frequency and/or characteristic representation of the input media signal 202. The EQ model query generator 206 selects one or more frequency representation(s) corresponding to a sample time frame (e.g., a three second sample) of the input media signal 202 and communicates the frequency representation(s) to a neural network (e.g., the EQ neural network 402 of FIG. 4). The sample time frame corresponds to a duration of the input media signal 202 that should be considered when determining the audio playback settings. In some examples, an operator (e.g., a listener, an audio engineer, etc.) can configure the sample time frame. In some examples, the EQ model query generator 206 communicates the query 207 (including the frequency representation(s) of the input media signal 202) to a neural network via a network. In some examples, the EQ model query generator 206 queries a model that is stored on (e.g., at the data store 224), and executes on, the media unit 106. In some examples the EQ model query generator 206 generates a new query 207 to determine updated audio playback settings in response to a signal from the update monitor 226.

The EQ filter settings analyzer 208 of the illustrated example of FIG. 2 accesses EQ filter settings 209 and calculates filter coefficients to be applied to the input media signal 202. The EQ filter settings analyzer 208 accesses EQ filter settings 209 output by the EQ neural network (e.g., the EQ neural network 402 of FIG. 4), which may include one or more gain values, frequency values, and/or quality factor (Q) values. In some examples, the EQ filter settings 209 include multiple filters (e.g., one low shelf filter, four peaking filters, one high shelf filter, etc.). In some such examples, individual filters include multiple adjustment parameters, such as one or more gain values, one or more frequency values, and/or one or more Q values. For example, for an audio signal to which multiple filters are to be applied, the multiple filters can include respective adjustment parameters including respective gain values, respective frequency values, and respective Q values (e.g., respective quality factor values). In some examples, the EQ filter settings analyzer 208 utilizes different equations to calculate filter coefficients based on the filter types. For example, a first equation may be utilized to determine a first filter coefficient for a low shelf filter, and a second equation may be utilized to determine a second filter coefficient for a high shelf filter. The EQ filter settings analyzer 208 communicates with the EQ filter selector 218 to determine which of the one or more sets of EQ filter settings 209 received by the EQ filter settings analyzer 208 should be processed (e.g., by calculating filter coefficients) to be applied to the input media signal 202.

The example EQ personalization manager 210 of the illustrated example of FIG. 2 generates personalized equalization settings (e.g., a personalized EQ setting, personalized EQ settings, curves, filter settings, etc.) which can be combined with dynamically generated filter settings from the neural network to account for personal preferences of a listener. The EQ personalization manager 210 includes an example device parameter analyzer 212, an example historical EQ manager 214, and an example user input analyzer 216.

The device parameter analyzer 212 analyzes parameters associated with the media unit 106 and/or a source device providing the input media signal 202. For example, the device parameter analyzer 212 can indicate an app from which the input media signal 202 originated. In some such examples, different apps may be associated with different equalization profiles. For example, an audio signal from an app associated with audiobooks may have a different optimal equalization curve relative to an audio signal from an audio signal from an app associated with fitness.

In some examples, the device parameter analyzer 212 determines a location of the device. For example, the device parameter analyzer 212 can determine a location of the media unit 106 and/or the location of a device providing the input media signal 202 to the media unit 106. For example, if the media unit 106 is integrated in a mobile device, and the location of the mobile device is a gym, a different personalized equalization curve may be generated than if the mobile device is located at a user's home or workplace. In some examples, the device parameter analyzer 212 determines whether the location of the mobile device is within a geofence of an area for which a personalized equalization setting (e.g., a personalized EQ setting) is determined (e.g., the gym, home, workplace, a library, etc.).

In some examples, the device parameter analyzer 212 determines a user of the media unit 106 and/or a user of a device supplying the input media signal 202 to the media unit. For example, if the media unit 106 is integrated into a mobile device, the device parameter analyzer 212 may determine a user of the mobile device based on a login associated with the user device and/or another identifier associated with the user device. In some examples, a user may be asked to select a user profile to indicate who is utilizing the mobile device and/or other device associated with the media unit 106.

The device parameter analyzer 212 of the illustrated example outputs and/or adjusts a personalized EQ curve based on any parameters which the device parameter analyzer 212 is able to access (e.g., a location, a user identifier, a source identifier, etc.).

The historical EQ manager 214 of the illustrated example of FIG. 2 maintains historical data pertaining to past equalization curves utilized to enable subsequent personalized EQ curve adjustments. For example, if a user frequently listens to rock music, and frequently utilizes EQ curves which are most suitable for rock music, the historical EQ manager 214 can help adjust and/or generate a personalized EQ curve based on the user's typical music preferences. For example, the historical EQ manager 214 can generate a personalized EQ curve based on a defined historical listening period. For example, the historical EQ manager 214 can generate a personalized EQ curve based on 1 hour of previous listening, based the past 24 hours of listening, and/or for any other time period. Stated differently, the historical EQ manager 214 can generate and/or adjust a personalized EQ curve based on EQ settings associated with a previous period of time. The historical EQ manager 214 takes the EQ curves that are being generated in real time by the EQ filter settings analyzer 208 and/or the neural network and adds those settings for each band (e.g., each of the five bands) of EQ into a long term, personalized EQ filter that averages the settings for the historical period. The average curve that the system has seen for the historical period becomes the personalization EQ curve. This curve will reflect the average EQ of the type of music that the user has been listening to. For instance, if a user has been listening to Heavy Metal for the past 60 minutes, that user will have a different EQ curve stored in his/her user profile than if that user had been listening to Top 40 Pop for the past 60 minutes.

The averaging operation could be a rolling average, an IIR filter, (all pole filter) with the coefficients set to average over the time period, or any other averaging technique. This averaging can alleviate the need to hold a long duration of buffer information. By utilizing historical EQ data, the EQ settings can be made to have a degree of "stickiness," whereby the system gradually learns a listener's preference over time and provides more useful equalization curves.

In some examples, the historical EQ manager 214 determines a small subset of genres that could be used with a table look up for a given EQ curve for each genre (Rock, Country, Spoken, Hip Hop, etc.). Based on this subset of genres, a user can EQ curves can be generated, adjusted, or selected.

The user input analyzer 216 of the illustrated example of FIG. 2 accesses and responds to user inputs corresponding to equalization settings. For example, a user may provide inputs as to whether a specific equalization setting is preferred (e.g., by pressing a "like" button, by providing a user rating, etc.). These inputs can then be utilized when generating the personalized EQ curve to more heavily weight those equalization settings which a user indicated they prefer. In some examples, user preferences are stored for a defined period (e.g., a few months, a year, etc.). In some examples, user preferences are stored in associated with particular user accounts (e.g., user logins identified by the device parameter analyzer 212). In some examples, the user input analyzer 216 receives "reset" signals from a listener, which indicate that the user would like to undo any automated personalized equalization which is being applied to the audio signal. In some examples, the user input analyzer 216 adjusts a strength of the equalization based on a strength input from the listener.

The example EQ filter selector 218 of the illustrated example of FIG. 2 selects one or more of the filters (e.g., one or more of a low shelf filter, a peaking filter, a high shelf filter, etc.) represented by the EQ filter settings received by the EQ filter settings analyzer 208 to be applied to the input media signal 202. The EQ filter selector 218 of the illustrated example selects one or more filters that have the highest magnitude gain (and thus will likely have the largest impact on the input media signal 202). In some examples, such as when a specific number of filters are to be utilized (e.g., five band filters), one or more additional filters represented by the EQ filter settings may be discarded. In some examples, the EQ filter selector 218 determines the filters which will have the least perceptible impact to the listener and discards these filters. For example, the EQ filter selector may integrate over one or more filter's spectral envelope and compare this output between filters to determine which of the filters represented by the EQ filter settings should be discarded. In some examples, the EQ filter selector 218 communicates to the EQ filter settings analyzer 208 and/or the EQ adjustment implementor 220 which of the filters are to be applied to the input media signal 202.

The EQ adjustment implementor 220 of the illustrated example of FIG. 2 applies the filters selected by the EQ filter selector 218 and analyzed by the EQ filter settings analyzer 208. For example, the EQ adjustment implementor 220 can adjust amplitude, frequency, and/or phase characteristics of the input media signal 202 based on the filter coefficients calculated by the EQ filter settings analyzer 208. In some examples, the EQ adjustment implementor 220 smoothly transitions from previous audio playback settings to updated audio playback settings (e.g., new filter configurations) using a smoothing filter as indicated by the smoothing filter configurator 222. The EQ adjustment implementor 220 outputs the output media signal 252 after applying one or more equalization filter(s).

In some examples, the EQ adjustment implementor 220 blends between an equalization profile generated based on EQ filter settings 209 from the neural network and a personalized EQ from the EQ personalization manager 210. For example, a user profile EQ curve can be blended with the real time curve that is generated by the neural network. In some examples, a weight is used to blend the EQ curves; multiple weights may be used as well. As an example, a final EQ curve that the shapes the audio that the user ends up listening to may be 0.5 times the current EQ based on dynamically generated filter settings and is 0.5 times the personalized EQ curve. As another example, the first number could be 0.25 to the current EQ based on dynamically generated filter settings and 0.75 to the personalized EQ curve.

Figure 9A:
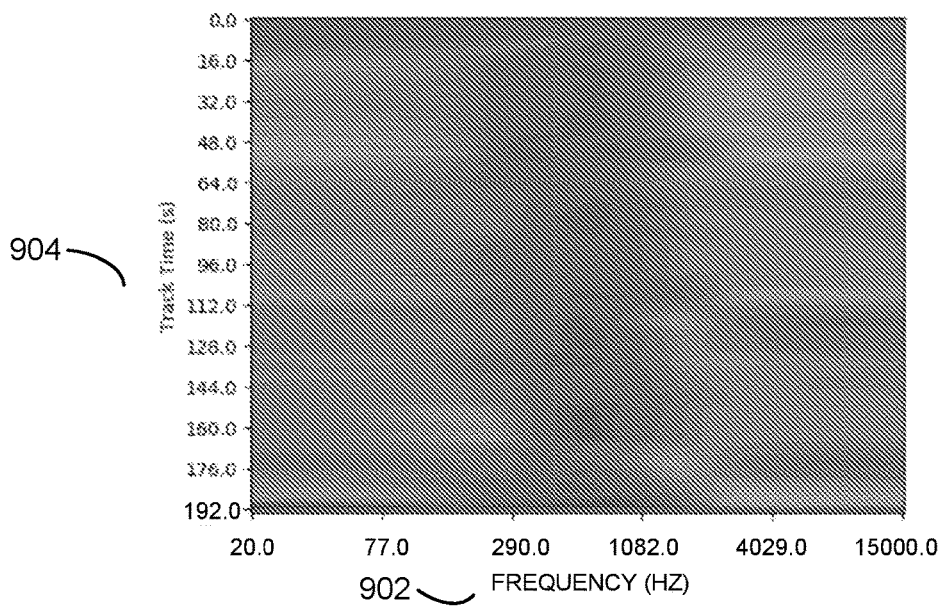
FIG. 9A is a second spectrogram of an audio signal which has undergone dynamic audio playback setting adjustment based on real-time analysis of audio characteristics including a smoothing filter, according to the first implementation.

The example smoothing filter configurator 222 of the illustrated example of FIG. 2 defines parameters for smoothing between audio playback settings. For example, the smoothing filter configurator 222 can provide equations and/or parameters to implement smoothing (e.g., an exponential smoothing algorithm, a one-pole recursive smoothing filter, etc.) by the EQ adjustment implementor 220 when applying audio playback settings. The second spectrogram 900a of FIG. 9A illustrates the benefit of implementing the smoothing filter, displaying a spectrogram of an audio signal which has undergone dynamic audio playback setting adjustment using a smoothing filter.

Figure 4:
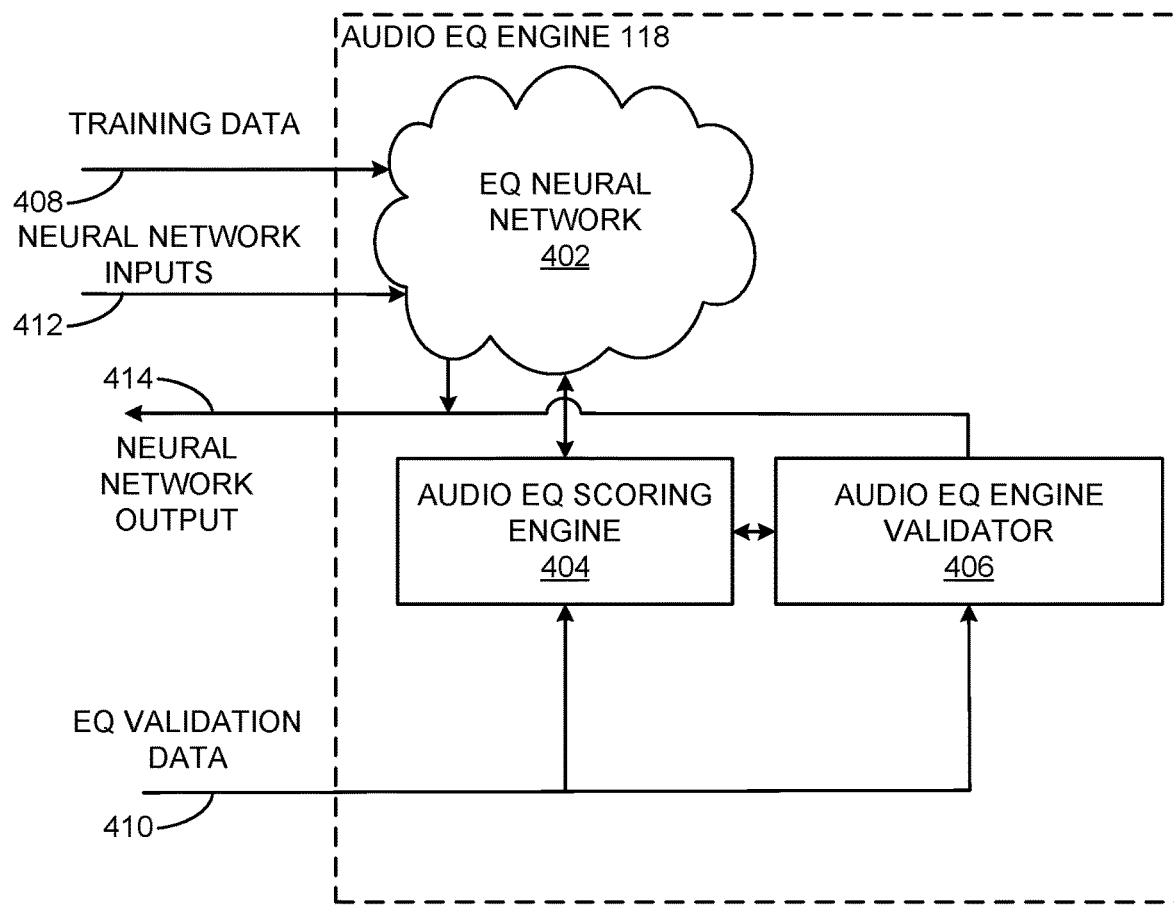
FIG. 4 is a block diagram showing additional detail of the audio equalization (EQ) engine of FIG. 1.

The example data store 224 of the illustrated example of FIG. 2 stores the input media signal 202, an output model from the EQ neural network 402 of FIG. 4, one or more profiles 229, EQ filter settings 209, EQ input feature sets 239, EQ gains/cuts 241, smoothing filter settings, an audio signal buffer, and/or any other data associated with the dynamic playback settings adjustment process implemented by the media unit 106. The data store 224 can be implemented by a volatile memory (e.g., a Synchronous Dynamic Random Access Memory (SDRAM), Dynamic Random Access Memory (DRAM), RAMBUS Dynamic Random Access Memory (RDRAM), etc.) and/or a non-volatile memory (e.g., flash memory, etc.). The data store 224 can additionally or alternatively be implemented by one or more double data rate (DDR) memories, such as DDR, DDR2, DDR3, mobile DDR (mDDR), etc. The data store 224 can additionally or alternatively be implemented by one or more mass storage devices such as hard disk drive(s), compact disk drive(s) digital versatile disk drive(s), etc. While, in the illustrated example, the data store 224 is illustrated as a single database, the data store 224 can be implemented by any number and/or type(s) of databases. Furthermore, the data stored in the data store 224 can be in any data format such as, for example, binary data, comma delimited data, tab delimited data, structured query language (SQL) structures, etc.

The example update monitor 226 of the illustrated example monitors a duration between audio playback setting adjustments and determines when an update duration threshold is satisfied. For example, the update monitor 226 can be configured with a one second update threshold, whereby the EQ model query generator 206 queries the EQ neural network (e.g., the EQ neural network 402 of FIG. 4) every one second to determine new playback settings. In some examples, the update monitor 226 communicates with the signal transformer 204 to simplify a sample (e.g., a three-second sample, a five-second sample, etc.) of the input media signal 202 to initiate the process of determining updated audio playback settings.

In operation, the signal transformer 204 accesses the input media signal 202 and transforms the input audio signal into a frequency and/or characteristic form which is then utilized by the EQ model query generator 206 to query a neural network to determine EQ filter settings 209. The neural network returns EQ filter settings 209 which are analyzed and processed (e.g., converted into applicable filter coefficients) by the EQ filter settings analyzer 208. The EQ filter selector 218 determines one or more of the filters represented by the EQ settings to apply to the input media signal 202. The EQ adjustment implementor 220 applies the selected filters using smoothing based on parameters from the smoothing filter configurator 222. The update monitor 226 monitors a duration since previous audio playback settings were applied and updates the audio playback settings when an update duration threshold is satisfied.

Second Implementation: Profile-Based Equalization

In a second implementation, the fingerprint generator 227 of the illustrated example of FIG. 2 generates identifiers (e.g., fingerprints and/or signatures) for the input media signal 202 (e.g., content) received or accessed by the media device 102, the media device 104, and/or the media unit 106. For example, the fingerprint generator 227 may include a reference fingerprint generator (e.g., a component that calculates a hash value from a portion of content) that is configured to generate reference fingerprints or other identifiers of the input media signal 202 (e.g., received content), among other things. In some examples, the fingerprint generator 227 implements the fingerprint generator 115 of FIG. 1.

The synchronizer 228 of the illustrated example of FIG. 2 synchronizes one or more profiles 229 from the content profile engine 116 to the input media signal 202. In some examples, the media unit 106 can include a sequencer to order (or modify (e.g., adjust) the order in which) media (e.g., songs) is played. In additional or alternative examples, the sequencer can be external to the media unit 106.

In the example of FIG. 2, the synchronizer 228 may utilize a fingerprint or fingerprints associated with the input media signal 202 to synchronize the input media signal 202 to the one or more profiles 229. For example, the one or more profiles 229 may include information that relates one or more settings to a known fingerprint for the input media signal 202 so that the synchronizer 228 can align the settings to a portion of the input media signal 202 in order to synchronize one of the one or more profiles 229 to the input media signal 202 during playback of the input media signal 202.

In some examples, the synchronizer 228 can identify various audio or acoustic events (e.g., a snare hit, the beginning of a guitar solo, an initial vocal) within the input media signal 202 and/or alternative representations thereof, and align the one of the one or more profiles 229 to the events within the input media signal 202 in order to synchronize the one of the one or more profiles 229 to the input media signal 202 during playback of the input media signal 202. In additional or alternative examples, the sequencer may organize the sequence of songs as part of an adaptive radio, a playlist recommendation, a playlist of media (e.g., content) in the cloud (music and/or video) that is specific to currently rendered media (e.g. content (e.g., using its profile)), user's profile, device settings that are known in advance to provide personalized optimal experience, and so on.

In the second implementation, the example EQ personalization manager 210 of the illustrated example of FIG. 2 generates personalized equalization settings (e.g., a personalized EQ setting, personalized EQ settings, curves, filter settings, etc.) which can be combined with the one or more profiles 229 to account for personal preferences of a listener.

The device parameter analyzer 212 analyzes parameters associated with the media unit 106 and/or a source device providing the input media signal 202. For example, the device parameter analyzer 212 can indicate an app from which the input media signal 202 originated. In some such examples, different apps may be associated with different equalization profiles. For example, an audio signal from an app associated with audiobooks may have a different optimal equalization curve relative to an audio signal from an audio signal from an app associated with fitness.

In some examples, the device parameter analyzer 212 determines a location of the device. For example, the device parameter analyzer 212 can determine a location of the media unit 106 and/or the location of a device providing the input media signal 202 to the media unit 106. For example, if the media unit 106 is integrated in a mobile device, and the location of the mobile device is a gym, a different personalized equalization curve may be generated than if the mobile device is located at a user's home or workplace. In some examples, the device parameter analyzer 212 determines whether the location of the mobile device is within a geofence of an area for which a personalized equalization setting (e.g., a personalized EQ setting) is determined (e.g., the gym, home, workplace, a library, etc.).

In some examples, the device parameter analyzer 212 determines a user of the media unit 106 and/or a user of a device supplying the input media signal 202 to the media unit. For example, if the media unit 106 is integrated into a mobile device, the device parameter analyzer 212 may determine a user of the mobile device based on a login associated with the user device and/or another identifier associated with the user device. In some examples, a user may be asked to select a user profile to indicate who is utilizing the mobile device and/or other device associated with the media unit 106.

The device parameter analyzer 212 of the illustrated example outputs and/or adjusts a personalized EQ curve based on any parameters which the device parameter analyzer 212 is able to access (e.g., a location, a user identifier, a source identifier, etc.).

The historical EQ manager 214 of the illustrated example of FIG. 2 maintains historical data pertaining to past equalization curves utilized to enable subsequent personalized EQ curve adjustments. For example, if a user frequently listens to rock music, and frequently utilizes EQ curves which are most suitable for rock music, the historical EQ manager 214 can help adjust and/or generate a personalized EQ curve based on the user's typical music preferences. For example, the historical EQ manager 214 can generate a personalized EQ curve based on a defined historical listening period. For example, the historical EQ manager 214 can generate a personalized EQ curve based on 1 hour of previous listening, based the past 24 hours of listening, and/or for any other time period. Stated differently, the historical EQ manager 214 can generate and/or adjust a personalized EQ curve based on EQ settings associated with a previous period of time. The historical EQ manager 214 takes the one or more profiles 229 that are being generated in real time and adds those settings for each band (e.g., each of the five bands) of EQ into a long term, personalized EQ profile that averages the EQ settings for the historical period. The average curve that the system has seen for the historical period becomes the personalization EQ curve. This curve will reflect the average EQ of the type of music that the user has been listening to. For instance, if a user has been listening to Heavy Metal for the past 60 minutes, that user will have a different EQ curve stored in his/her user profile than if that user had been listening to Top 40 Pop for the past 60 minutes.

The averaging operation could be a rolling average, an IIR filter, (all pole filter) with the coefficients set to average over the time period, or any other averaging technique. This averaging can alleviate the need to hold a long duration of buffer information. By utilizing historical EQ data, the EQ settings can be made to have a degree of "stickiness," whereby the system gradually learns a listener's preference over time and provides more useful equalization curves.

In some examples, the historical EQ manager 214 determines a small subset of genres that could be used with a table look up for a given EQ curve for each genre (Rock, Country, Spoken, Hip Hop, etc.). Based on this subset of genres, a user can EQ curves can be generated, adjusted, or selected.

The user input analyzer 216 of the illustrated example of FIG. 2 accesses and responds to user inputs corresponding to equalization settings. For example, a user may provide inputs as to whether a specific equalization setting is preferred (e.g., by pressing a "like" button, by providing a user rating, etc.). These inputs can then be utilized when generating the personalized EQ curve to more heavily weight those equalization settings which a user indicated they prefer. In some examples, user preferences are stored for a defined period (e.g., a few months, a year, etc.). In some examples, user preferences are stored in associated with particular user accounts (e.g., user logins identified by the device parameter analyzer 212). In some examples, the user input analyzer 216 receives "reset" signals from a listener, which indicate that the user would like to undo any automated personalized equalization which is being applied to the audio signal. In some examples, the user input analyzer 216 adjusts a strength of the equalization based on a strength input from the listener.

In the second implementation, the EQ adjustment implementor 220 is configured to modify playback of the input media signal 202 based on one or more profiles 229 for the input media signal 202. In such additional or alternative examples, the EQ adjustment implementor 220 implements an adjustor to modify playback in the input media signal 202 based on the one or more profiles 229. For example, the EQ adjustment implementor 220 can apply information within the one or more profiles 229 to modify or adjust the settings of an equalizer and or a dynamic processor of the media unit 106, the media device 102, and/or the media device 104, in order to adjust and/or tune the equalization during the playback of the input media signal 202 (e.g., the stream of content). Stated differently, the one or more profiles 229 include information to cause the EQ adjustment implementor 220 to adjust equalization of a portion of the input media signal 202. When the media (e.g., content) is video, the one or more profiles 229 may be used to adjust video settings such as color temperature, dynamic range, color palette, brightness, sharpness, or any other video-related settings.

In addition to the equalization, the EQ adjustment implementor 220 can adjust a variety of different playback settings, such as equalization settings, virtualization settings, spatialization settings, and so on. For example, the EQ adjustment implementor 220 may access information identifying a genre assigned to the input media signal 202 (e.g., stream of content) and modify playback of the input media signal 202 (e.g., stream of content) by adjusting equalization settings of a playback device to settings associated with the identified genre. As another example, the EQ adjustment implementor 220 may access information identifying signal strength parameters for different frequencies of the stream of content and modify playback of the stream of content by adjusting equalization settings of a playback device to settings using the signal strength parameters.

In some examples of the second implementation, the EQ adjustment implementor 220 blends between the one or more profiles 229 generated by the content profile engine 116 and a personalized EQ from the EQ personalization manager 210. For example, a user profile EQ curve can be blended with the real time profiles. In some examples, a weight is used to blend the personalized EQ curve and the one or more profiles 229; multiple weights may be used as well. As an example, a final EQ curve that the shapes the audio that the user ends up listening to may be 0.5 times the current EQ based on dynamically generated filter settings and is 0.5 times the personalized EQ curve. As another example, the first number could be 0.25 to the current EQ based on dynamically generated filter settings and 0.75 to the personalized EQ curve.

Third Implementation: Thresholding-Based Equalization

In the third implementation, the example buffer manager 230 of the illustrated example of FIG. 2 receives the input media signal 202 and stores a portion of the input media signal 202 in the data store 224. The buffer manager 230 can configure the buffer (e.g., the portion of the input media signal 202) to be any duration (e.g., ten seconds, thirty seconds, one minute, etc.). The portion of the input media signal 202 that is stored in the buffer in the data store 224 is utilized to determine equalization features, thereby enabling the equalization features to be representative of a longer duration of the input media signal 202 than if the features were generated based on instantaneous characteristics of the input media signal 202. The duration of the buffer may be tuned based on how responsive the equalization should be. For example, a very brief buffer duration may result in drastic changes in the equalization curve when spectral characteristics of the input media signal 202 change (e.g., during different portions of a song), while a long buffer period averages out these large changes in the input media signal 202 and provides more consistent equalization profiles. The buffer manager 230 can cause portions of the input media signal 202 which are no longer within the buffer period to be discarded. For example, if the buffer period is ten seconds, once a portion of the input media 202 has been in the buffer for ten seconds, this portion will be removed.

In some examples, a neural network is utilized to identify media changes (e.g., track changes, changes in the media source, etc.) and the output is utilized to adjust the equalization in response to the change in media. For example, when a new track is detected by the neural network, short-term instantaneous or average volume (e.g., volume values at frequency ranges throughout a period shorter than the standard buffer period, standard deviation values at frequency ranges throughout the shorter period, etc.) can be calculated to cause a quick adjustment in the EQ input feature set 239 and consequently in the EQ gains/cuts 241 received from the EQ neural network 402 of FIG. 4 (e.g., equalization adjustments output from the EQ neural network 402). In some examples, in-between media changes, a longer volume averaging technique is utilized (e.g., determining equalization profiles based on 30-second volume averages, determining equalization profiles based on 45-second volume averages, etc.) to avoid rapid fluctuations in the equalization profile throughout a track.

In some examples, in addition to or alternatively to utilizing a neural network to identify media changes, a hysteresis-based logic can be implemented to cause faster equalization changes when a more drastic change in characteristics of media represented in the input media signal 202 occurs (e.g., a transition from bass-heavy to treble-heavy media).

In some examples, the media unit 106 can detect a change in source of the input audio signals and trigger a short term equalization update as described above (e.g., calculating short-term instantaneous or average volume and determining an equalization profile based on these changes) to account for differences in the media from the new source relative to the prior source.

The example time to frequency domain converter 232 of the illustrated example of FIG. 2 converts the input media signal 202 from a time-domain representation to a frequency-domain representation. In some examples, the time to frequency domain converter 232 utilizes a Fast Fourier Transform (FFT). In some examples, the time to frequency domain converter 232 converts the input media signal 202 into a linear-spaced and/or log-spaced frequency domain representation. The time to frequency domain converter 232 may utilize any type of transform (e.g., a short-time Fourier Transform, a Constant-Q transform, Hartley transform, etc.) to convert the input media signal 202 from a time-domain representation to a frequency-domain representation. In some examples, the media unit 106 may alternatively perform the audio equalization techniques disclosed herein in the time-domain.

The example volume calculator 234 of the illustrated example of FIG. 2 calculates volume levels at frequency ranges for the input media signal 202. In some examples, the volume calculator 234 calculates an average volume level throughout the buffer duration (e.g., ten seconds, thirty seconds, etc.) for frequency bins (e.g., frequency range) in the linear-spaced frequency representation of the input media signal 202 (e.g., an average volume representation). The volume calculator 234 of the illustrated example of FIG. 2 generates a frequency representation of the average volume of the portion of the input media signal 202 that is stored in the buffer. Additionally or alternatively, the volume calculator 234 of the illustrated example of FIG. 2 calculates a standard deviation throughout the buffer duration for the frequency bins. In some examples, the volume calculator 2342 calculates the volume levels for log-spaced frequency bins (e.g., critical frequency bands, Bark bands, etc.). In some examples, to calculate the average volume level for frequency bins, the volume calculator 234 converts the frequency representation of the input media signal 202 to real values.

The example energy calculator 236 of the illustrated example of FIG. 2 calculates energy values for media signals (e.g., audio signals). In some examples, the energy calculator 236 calculates a root means square (RMS) value of the frequency representation of the audio signal prior to equalization (e.g., based on a frequency representation of the input media signal 202 stored in the buffer) and after an equalization curve is applied (e.g., after the EQ curve generator 240 has applied equalization gains/cuts to the average frequency representation of the audio signal). In some examples, the energy calculator 236 calculates the energy of a single frequency representation of the input media signal 202 (e.g., based on volume levels of any instant throughout the buffer period), and/or calculates the energy of the average frequency representation of the input media signal 202 throughout the buffer period.

In some examples, the energy calculator 236 communicates energy values before and after equalization to the volume normalizer 248, to enable normalization of the volume and avoid perceptible changes in the overall volume after equalization. The energy calculator 236 of the illustrated example of FIG. 2 calculates the energy of the equalized average frequency representation.

The example input feature set generator 238 of the illustrated example of FIG. 2 generates features (e.g., audio features) corresponding to the input media signal 202 to input to the EQ neural network 402 of FIG. 4. In some examples, the input feature set generator 238 generates a set including average volume measurements for the frequency bins of the frequency representation of the input media signal 202 throughout the buffer period and/or average standard deviation measurements for frequency bins of the frequency representation of the input media signal 202 throughout the buffer period. In some examples, the input feature set generator 238 may include any available metadata in the set that is delivered to the EQ neural network 402 of FIG. 4 to assist the EQ neural network 402 of FIG. 4 in determining the appropriate equalization settings to be utilized for the input media signal 202.

The example EQ curve manager 240 of the illustrated example of FIG. 2 determines equalization curves to be utilized to equalize the input media signal 202. The example EQ curve manager 240 includes the example volume adjuster 242, the example thresholding controller 244, and the example EQ curve generator 246.

The example volume adjuster 242 of the illustrated example of FIG. 2 receives the EQ gains/cuts 241 and makes volume adjustments at frequency ranges of the average representation of the input media signal 202. In some examples, the volume adjuster 242 receives the EQ gains/cuts 241 as a plurality of values (e.g., scalars) to be applied at specific frequency ranges of the audio signal. In other examples, these values can be log-based gains and cuts (e.g., in decibels). In some such examples, the EQ gains/cuts 241 correspond to a plurality of log-spaced frequency bins. For example, the EQ gains/cuts 241 may correspond to the 25 critical bands used in the Bark Band representation.

In some examples, to apply the EQ gains/cuts 241 to the buffered portion of the input media signal 202, the volume adjuster 242 converts the linearly-spaced frequency representation of the input media signal 202 (e.g., as generated by the time to frequency domain converter 232) to a log-spaced frequency representation of the input media signal 202. In some such examples, the volume adjuster 242 can add the EQ gains/cuts 241 in decibels to the volume levels in the log-spaced frequency representation to generate an equalized log-spaced frequency version of the buffered portion of the input media signal 202. The volume adjuster 242 of the illustrated example communicates the equalized log-spaced frequency version of the buffered portion of the input media signal 202 to the thresholding controller 244. In some examples, the EQ gains/cuts 241 may be provided in a linear-spaced frequency representation and/or other representation, and applied to a common (i.e., linear-spaced) representation of the buffered portion of the input media signal 202.

In some examples, the volume adjuster 242 accesses information regarding technical limitations of the source of the input media signal 202 and/or other technical characteristics pertaining to the input media signal 202 and utilizes these technical limitations or characteristics to refine which frequency ranges experience changes in volume. For example, the volume adjuster 242 can access information pertaining to a type of encoding of the input media signal 202 (e.g., as determined by a decoder in the media unit 106, as determined by analyzing the input media signal 202 for encoding artifacts, etc.). In some such examples, the volume adjuster 242 can prevent volume adjustments that may have a negative effective on the quality of the audio signal (e.g., adjustments which boost volume in frequency ranges including encoding artifacts).

The example thresholding controller 244 of the illustrated example of FIG. 2 performs techniques to smooth out the equalized version (e.g., from the volume adjuster 242) of the buffered portion of the input media signal 202. In some examples, after the volume adjuster 242 applies the EQ gains/cuts 241 to the buffered portion of the input media signal 202, a frequency representation of the equalized audio signal may have localized outliers (e.g., irregularities appearing as or short-term peaks or dips on a frequency-volume plot of the equalized audio signal) that may result in perceptible artifacts in the equalized audio signal. As utilized herein, the term localized outlier refers to an irregularity on a frequency-volume plot of an equalized audio signal, such as a large difference in volume between adjacent frequency values. In some examples, localized outliers are detected by determining whether the second derivative of volume over a frequency range exceeds a threshold.

The thresholding controller 244 of the illustrated example of FIG. 2 selects a plurality of frequency values at which to initiate the thresholding technique. The thresholding controller 244 determines volume levels at the plurality of frequency values, and then calculates a measure of the difference between these frequency values. In some examples, the thresholding controller 244 calculates the second derivative of the volume values over the plurality of frequency values. As an example, if three frequency values are being analyzed to determine whether a central one of the three frequency values corresponds to a localized outlier (e.g., an irregularity), the following equation may be utilized to calculate the second derivative, where the array val[ ] includes the volume values, the index "i" corresponds to the frequency value index:

$$|(\mathrm{val}[i-2]-(2(\mathrm{val}[i-1])+\mathrm{val}[i])| \quad \text{Equation 1}$$

The thresholding controller 244 can compare the output of Equation 1 to a threshold. In some examples, if the output of Equation 1, or any other equation utilized to calculate the relative difference of volume at one of the frequency values to volumes at adjacent frequency values, satisfies a threshold (e.g., exceeds the threshold), a smoothing calculation may be utilized to remove the irregularity. In some examples, the thresholding controller 244 adjusts the volume level at a detected irregularity by changing the volume to a midpoint between volume levels at adjacent frequency values. FIG. 17B illustrates an example of utilizing this midpoint volume adjustment on a localized outlier illustrated in the equalized audio signal represented in FIG. 17A. In some examples, the thresholding controller 244 may utilize any other technique to change the volume at a detected localized outlier. For example, the thresholding controller 244 may set the volume at the detected localized outlier equal to the volume at an adjacent frequency value or some other value to attempt to remove the localized outlier.

In some examples, the thresholding controller 244 iteratively moves throughout frequency ranges of the equalized audio signal to identify any volume levels which represents irregularities. In some examples, the thresholding controller 244, after analyzing all of the frequency values/ranges of the equalized audio signal, may iterate throughout the equalized audio signal one or more additional times to determine whether any localized outliers remain after the first adjustment phase (e.g., after volume levels for the localized outliers detected were changed). In some examples, the thresholding controller 244 is a neural network and/or other artificial intelligence that has been trained for irregularity (e.g., anomaly) detection. In some such examples, the thresholding controller 244 may eliminate the irregularities in one adjustment, without additional iterations being necessary.

After the thresholding controller 244 has removed the localized outliers from the equalized frequency representation of the audio signal, or once another stopping condition has been reached (e.g., performing ten iterations of localized outlier detection and adjustment throughout the entire frequency range), the thresholding controller 244 can communicate the final equalized representation of the audio signal to the EQ curve generator 246 so that the EQ curve generator 246 can determine an equalization curve to apply to the input media signal 202.

The EQ curve generator 246 of the illustrated example of FIG. 2 determines a final equalization curve to apply to the buffered portion of the input media signal 202. In some examples, the EQ curve generator 246 of the illustrated example of FIG. 2 subtracts the original average log-spaced frequency representation of the buffered portion of the input media signal 202 from the equalized version that is output from the thresholding controller 244 to determine the final equalization curve to utilize for equalization. In some such examples, after this subtraction, the EQ curve generator 246 converts the final equalization curve to a form that can be applied to the frequency-domain representation of the buffered audio signal (e.g., a linear-spaced form). In some such examples, the EQ curve generator 246 of the illustrated example then applies the final EQ curve (e.g., the linear-spaced frequency representation of the final EQ curve) to the corresponding representation (e.g., the linear-spaced frequency representation of the buffered audio signal). The EQ curve generator 246 may communicate the resulting equalized audio signal to the energy calculator 236, the volume normalizer 248, and/or the frequency to time domain converter 250. As used herein, an EQ curve includes gains/cuts and/or other volume adjustments corresponding to frequency ranges of an audio signal.

The example volume normalizer 248 of the illustrated example of FIG. 2 accesses an indication of the change in energy levels before and after equalization of the input media signal 202. The volume normalizer 248 of the illustrated example of FIG. 2 performs volume normalization to account for the overall change of the audio signal before and after equalization. In some examples, if the change in energy level before and after the equalization of the input media signal 202 exceeds a threshold, the volume normalizer 248 applies a scalar volume adjustment to account for the change in energy level. In some examples, the volume normalizer 248 may utilize a dynamic range compressor. In some examples, the energy calculator 236 may calculate a ratio of the energy before and after the equalization process, and the volume normalizer 248 can utilize this ratio to cancel out this change in overall volume. For example, if the overall energy of the audio portion of the input media signal 202 doubled, the volume normalizer 248 can apply an overall volume cut to reduce the volume by one-half. In some examples, the volume normalizer 248 may determine that the change in energy is insufficient to justify a volume normalization. The volume normalizer 248 of the illustrated example communicates the final (volume adjusted, if applicable) equalized audio signal to the frequency to time domain converter 250.

The frequency to time domain converter 250 of the illustrated example of FIG. 2 converts the final equalized audio signal from the frequency domain to the time domain to ultimately be output from the media unit 106.

While an example manner of implementing the media unit 106 of FIG. 1 is illustrated in FIG. 2, one or more of the elements, processes and/or devices illustrated in FIG. 2 may be combined, divided, re-arranged, omitted, eliminated and/or implemented in any other way. Further, the example signal transformer 204, the example EQ model query generator 206, the example EQ filter settings analyzer 208, the example EQ personalization manager 210, the example device parameter analyzer 212, the example historical EQ manager 214, the example user input analyzer 216, the example EQ filter selector 218, the example EQ adjustment implementor 220, the example smoothing filter configurator 222, the example data store 224, the example update monitor 226, the example fingerprint generator 227, the example synchronizer 228, the example buffer manager 230, the example time to frequency domain converter 232, the example volume calculator 234, the example energy calculator 236, the example input feature set generator 238, the example EQ manager 240, the example volume adjuster 242, the example thresholding controller 244, the example EQ curve generator 246, the example volume normalizer 248, and/or the example frequency to time domain converter 250 and/or, more generally, the example media unit 106 of FIG. 2 may be implemented by hardware, software, firmware and/or any combination of hardware, software and/or firmware. Thus, for example, any of the example signal transformer 204, the example EQ model query generator 206, the example EQ filter settings analyzer 208, the example EQ personalization manager 210, the example device parameter analyzer 212, the example historical EQ manager 214, the example user input analyzer 216, the example EQ filter selector 218, the example EQ adjustment implementor 220, the example smoothing filter configurator 222, the example data store 224, the example update monitor 226, the example fingerprint generator 227, the example synchronizer 228, the example buffer manager 230, the example time to frequency domain converter 232, the example volume calculator 234, the example energy calculator 236, the example input feature set generator 238, the example EQ manager 240, the example volume adjuster 242, the example thresholding controller 244, the example EQ curve generator 246, the example volume normalizer 248, and/or the example frequency to time domain converter 250 and/or, more generally, the example media unit 106 of FIG. 2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example signal transformer 204, the example EQ model query generator 206, the example EQ filter settings analyzer 208, the example EQ personalization manager 210, the example device parameter analyzer 212, the example historical EQ manager 214, the example user input analyzer 216, the example EQ filter selector 218, the example EQ adjustment implementor 220, the example smoothing filter configurator 222, the example data store 224, the example update monitor 226, the example fingerprint generator 227, the example synchronizer 228, the example buffer manager 230, the example time to frequency domain converter 232, the example volume calculator 234, the example energy calculator 236, the example input feature set generator 238, the example EQ manager 240, the example volume adjuster 242, the example thresholding controller 244, the example EQ curve generator 246, the example volume normalizer 248, and/or the example frequency to time domain converter 250 and/or, more generally, the example media unit 106 of FIG. 2 is/are hereby expressly defined to include a non-transitory computer readable storage device or storage disk such as a memory, a digital versatile disk (DVD), a compact disk (CD), a Blu-ray disk, etc. including the software and/or firmware. Further still, the example media unit 106 of FIG. 1 may include one or more elements, processes and/or devices in addition to, or instead of, those illustrated in FIG. 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
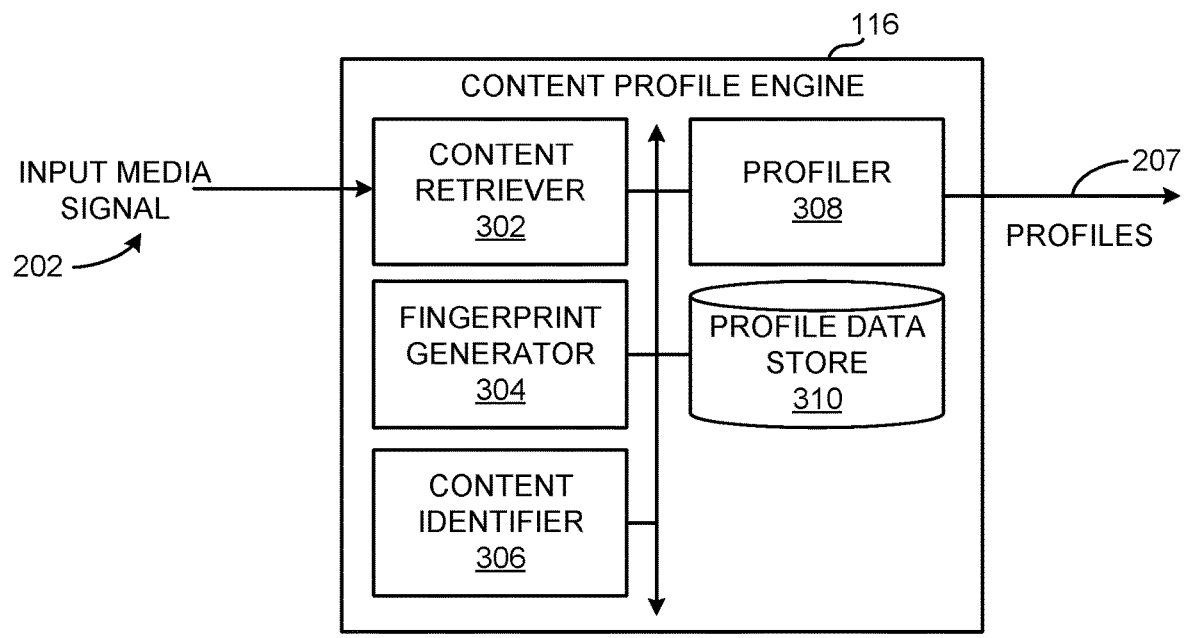
FIG. 3 is a block diagram showing additional detail of the content profile engine of FIG. 1 according to the second implementation.

FIG. 3 is a block diagram showing additional detail of the content profile engine 116 of FIG. 1 according to the second implementation. The example content profile engine 116 includes an example content retriever 302, an example fingerprint generator 304, an example content identifier 306, an example profiler 308, and an example profile data store 310. As described herein, in some examples, the systems and methods identify media (e.g., content) to be streamed or otherwise transmitted to the media device 102, the media device 104, and/or the media unit 106 and generate and/or determine a profile to deliver to the media device 102, the media device 104, and/or the media unit 106 that provides information associated with a mood, style, or other attributes of the content. In some examples, the profile may be an identifier that identifies a content type. For example, the profile may identify the media (e.g., content) as news, an action movie, a sports event, or the like. Different settings on a TV may then be adjusted in real-time (e.g., on-the-fly) based on the profile. Similarly, the profile may identify a radio talk show, a song, a jingle, a song genre, or the like. Accordingly, audio settings may then be adjusted in real-time (e.g., on-the-fly) to enhance the audio delivered to a listener.

In the example of FIG. 3, the content retriever 302 accesses and/or otherwise retrieves the input media signal 202 prior to delivery to the media unit 106 (e.g., a stream of content to be delivered to a playback device (e.g., the media device 102, the media device 104, the media unit 106, etc.)). For example, the content retriever 302 may access the input media signal 202 from the content provider 114 that is providing the input media signal 202 (e.g., the stream of content) to the playback device (e.g., the media device 102, the media device 104, the media unit 106, etc.) over the network 112. As another example, the content retriever 302 may access the input media signal 202 (e.g., the stream of content) from the content provider 114 that is locally stored by the playback device (e.g., the media device 102, the media device 104, the media unit 106, etc.).

In the example of FIG. 3, the content retriever 302 may access various types of media (e.g., various types of content streams), such as audio content streams, video streams, and so on. For example, the content retriever 302 may access a stream of songs or other music, a stream of spoken content, a podcast, YouTube™ videos and clips, and so on.

The fingerprint generator 304 of the illustrated example of FIG. 3 generates identifiers (e.g., fingerprints and/or signatures) for the input media signal 202 (e.g., content) received or accessed by the content profile engine 116. For example, the fingerprint generator 304 may include a reference fingerprint generator (e.g., a component that calculates a hash value from a portion of content) that is configured to generate reference fingerprints or other identifiers of the input media signal 202 (e.g., received content), among other things. In some examples, the fingerprint generator 304 implements the fingerprint generator 115 of FIG. 1.

In the illustrated example of FIG. 3, the content identifier 306 identifies a portion of media (e.g., a portion of content) within the input media signal 202 (e.g., the stream of content) to be delivered to the playback device (e.g., the media device 102, the media device 104, the media unit 106, etc.). The content identifier 306 may identify the portion of media (e.g., portion of content) via a variety of processes, including a comparison of a fingerprint of the input media signal 202 (e.g., content) to reference fingerprints of known media (e.g., content), such as reference fingerprints generated by the fingerprint generator 304. For example, the content identifier 306 may generate and/or access query fingerprints for a frame or block of frames of the portion of the input media signal 202 or the input media signal 202, and perform a comparison of the query fingerprints to the reference fingerprints in order to identify the piece of content or stream of content associated with the input media signal 202.

In the example illustrated in FIG. 3, the profiler 308 determines one or more profiles 229 for the identified piece or a segment/portion within the input media signal 202 (e.g., the stream content) and/delivers the one or more profiles 229 to the playback device (e.g., the media device 102, the media device 104, the media unit 106, etc.). For example, the profiler 308 can determine one or more characteristics for the input media signal 202 and/or determine one or more characteristics for multiple portions of the input media signal 202, such as frames or blocks of frames of the input media signal 202. In some examples, the profiler 308 stores the one or more profiles 229 in the profile data store 310.

The example profiler 308 may render, generate, create, and/or otherwise determine the one or more profiles 229 for the input media signal 202, such as audio content, having a variety of different characteristics. For example, the one or more profiles 229 may include characteristics associated with EQ settings, such as different audio frequencies within the audio content. The one or more profiles 229 may include different types of information. Example profile information may include: (1) information identifying a category associated with the song, such as a category for a style of music (e.g., rock, classical, hip-hop, instrumental, spoken-word, jingle and so on); (2) information identifying a category associated with a video segment, such as style of video (e.g. drama, sci-fi, horror, romance, news, TV show, documentary, advertisement, and so on); (3) information identifying a mood associated with the song or video clip, such as upbeat mood, a relaxed mood, a soft mood, and so on; (4) information identifying signal strength parameters for different frequencies within the content, such as low frequencies for bass and other similar tones, high frequencies for spoken or sung tones; and/or (5) information identifying color palette, brightness, sharpness, motion, blurriness, presence of text and/or subtitles or close caption, specific content with said text or subtitles, scene cuts, black frames, presence of display format adjustment bars/pillars, presence or absence of faces, landscapes, or other objects, presence of specific company, network, or broadcast logos, and so on.

Therefore, the one or more profiles 229 may represent the playback attributes (e.g., "DNA") of the input media signal 202, which may be used by the media unit 106 to control the playback device (e.g., the media device 102, the media device 104, the media unit 106, etc.) in order to optimize or enhance the experience during playback of the input media signal 202, among other things. As illustrated in FIG. 3, the content profile engine 116 may generate and deliver the one or more profiles 229 to the media unit 106, which adjusts the playback settings of the playback device (e.g., the media device 102, the media device 104, the media unit 106, etc.) during playback of the input media signal 202 (e.g., the stream of content), among other things.

In the example of FIG. 3, the profile data store 310 stores one or more profiles, one or more reference fingerprints, and/or any other data associated with the dynamic playback settings adjustment process implemented by the media unit 106 via the one or more profiles 229. The profile data store 310 can be implemented by a volatile memory (e.g., a Synchronous Dynamic Random Access Memory (SDRAM), Dynamic Random Access Memory (DRAM), RAMBUS Dynamic Random Access Memory (RDRAM), etc.) and/or a non-volatile memory (e.g., flash memory, etc.). The profile data store 310 can additionally or alternatively be implemented by one or more double data rate (DDR) memories, such as DDR, DDR2, DDR3, mobile DDR (mDDR), etc. The profile data store 310 can additionally or alternatively be implemented by one or more mass storage devices such as hard disk drive(s), compact disk drive(s) digital versatile disk drive(s), etc. While, in the illustrated example, the profile data store 310 is illustrated as a single database, the profile data store 310 can be implemented by any number and/or type(s) of databases. Furthermore, the data stored in the profile data store 310 can be in any data format such as, for example, binary data, comma delimited data, tab delimited data, structured query language (SQL) structures, etc.

While an example manner of implementing the content profile engine 116 of FIG. 1 is illustrated in FIG. 3, one or more of the elements, processes and/or devices illustrated in FIG. 3 may be combined, divided, re-arranged, omitted, eliminated and/or implemented in any other way. Further, the example content retriever 302, the example fingerprint generator 304, the example content identifier 306, the example profiler 308, the example profile data store 310 and/or, more generally, the example content profile engine 116 of FIG. 3 may be implemented by hardware, software, firmware and/or any combination of hardware, software and/or firmware. Thus, for example, any of the example content retriever 302, the example fingerprint generator 304, the example content identifier 306, the example profiler 308, the example profile data store 310, and/or, more generally, the example content profile engine 116 of FIG. 3 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example content retriever 302, the example fingerprint generator 304, the example content identifier 306, the example profiler 308, the example profile data store 310, and/or, more generally, the example content profile engine 116 of FIG. 3 is/are hereby expressly defined to include a non-transitory computer readable storage device or storage disk such as a memory, a digital versatile disk (DVD), a compact disk (CD), a Blu-ray disk, etc. including the software and/or firmware. Further still, the example content profile engine 116 of FIG. 3 may include one or more elements, processes and/or devices in addition to, or instead of, those illustrated in FIG. 3, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

FIG. 4 is a block diagram showing additional detail of the audio EQ engine 118 of FIG. 1. The example audio EQ engine 118 is configured to operate according to at least two implementations. In some examples, the trained model resides on the audio EQ engine 118 (e.g., in the EQ neural network 402), while in some examples the trained model is exported for direct use on the media unit 106.

Machine learning techniques, whether deep learning networks or other experiential/observational learning system, can be used to optimize results, locate an object in an image, understand speech and convert speech into text, and improve the relevance of search engine results, for example. While many machine learning systems are seeded with initial features and/or network weights to be modified through learning and updating of the machine learning network, a deep learning network trains itself to identify "good" features for analysis. Using a multilayered architecture, machines employing deep learning techniques can process raw data better than machines using conventional machine learning techniques. Examining data for groups of highly correlated values or distinctive themes is facilitated using different layers of evaluation or abstraction.

Machine learning techniques, whether neural networks, deep learning networks, and/or other experiential/observational learning system(s), can be used to generate optimal results, locate an object in an image, understand speech and convert speech into text, and improve the relevance of search engine results, for example. Deep learning is a subset of machine learning that uses a set of algorithms to model high-level abstractions in data using a deep graph with multiple processing layers including linear and non-linear transformations. While many machine learning systems are seeded with initial features and/or network weights to be modified through learning and updating of the machine learning network, a deep learning network trains itself to identify "good" features for analysis. Using a multilayered architecture, machines employing deep learning techniques can process raw data better than machines using conventional machine learning techniques. Examining data for groups of highly correlated values or distinctive themes is facilitated using different layers of evaluation or abstraction.

For example, deep learning that utilizes a convolutional neural network (CNN) segments data using convolutional filters to locate and identify learned, observable features in the data. Each filter or layer of the CNN architecture transforms the input data to increase the selectivity and invariance of the data. This abstraction of the data allows the machine to focus on the features in the data it is attempting to classify and ignore irrelevant background information.

Deep learning operates on the understanding that many datasets include high level features which include low level features. While examining an image, for example, rather than looking for an object, it is more efficient to look for edges which form motifs which form parts, which form the object being sought. These hierarchies of features can be found in many different forms of data.

Learned observable features include objects and quantifiable regularities learned by the machine during supervised learning. A machine provided with a large set of well classified data is better equipped to distinguish and extract the features pertinent to successful classification of new data.

A deep learning machine that utilizes transfer learning can properly connect data features to certain classifications affirmed by a human expert. Conversely, the same machine can, when informed of an incorrect classification by a human expert, update the parameters for classification. Settings and/or other configuration information, for example, can be guided by learned use of settings and/or other configuration information, and, as a system is used more (e.g., repeatedly and/or by multiple users), a number of variations and/or other possibilities for settings and/or other configuration information can be reduced for a given situation.

An example deep learning neural network can be trained on a set of expert classified data, for example. This set of data builds the first parameters for the neural network, and this would be the stage of supervised learning. During the stage of supervised learning, the neural network can be tested whether the desired behavior has been achieved. Example flowcharts representative of machine readable instructions for training the EQ neural network 402 is illustrated and described in connection with FIGS. 7 and 16.

First Implementation: Filter-Based Equalization

In the first implementation, the example EQ neural network 402 of the illustrated example can be trained using a library of reference audio signals for which audio playback settings have been specifically tailored and optimized (e.g., by an audio engineering). In some examples, the EQ neural network 402 is trained by associating samples of ones of the reference audio signals (e.g., training data 408) with the known audio playback settings for the reference audio signals. For example, gain, frequency, and/or Q values for one or more filters that are recommended to be applied to the track can be associated with individual audio signal samples of the track, thus training the EQ neural network 402 to associate similar audio samples with the optimized playback settings (e.g., the gain, frequency, and/or Q values for one or more recommended filters). In some examples, various biases associated with different playback settings can be indicated as well. For example, if a first ten tracks are utilized for training and audio playback settings (e.g., EQ parameters corresponding to audio playback settings) for the first ten tracks were determined by a first engineer, and a second ten tracks are utilized for training and audio playback settings for the second ten tracks were determined by a second engineer, the EQ neural network 402 may additionally be trained to learn different preferences and/or biases associated with the first and second audio engineers and mitigate these to generate a more objective model.

In some examples, a loss function can be utilized for training the EQ neural network 402. For example, Equation 2, represents one example loss function that can be utilized, where f corresponds to frequency in Hertz, g corresponds to gain in Decibels, and q corresponds to the Q factor (unitless):

$$\mathcal{L}_{(g,f,q)} \propto \|g-\hat{g}\|_2^2 + \|q-\hat{q}\|_2^2 + \|\log_{10}(f) - \log_{10}(\hat{f})\|_2^2 \quad \text{Equation 2}$$

Once a desired neural network behavior has been achieved (e.g., a machine has been trained to operate according to a specified threshold, etc.), the neural network can be deployed for use (e.g., testing the machine with "real" data, etc.). During operation, neural network classifications can be confirmed or denied (e.g., by an expert user, expert system, reference database, etc.) to continue to improve neural network behavior. The example neural network is then in a state of transfer learning, as parameters for classification that determine neural network behavior are updated based on ongoing interactions. In certain examples, the neural network such as the EQ neural network 402 can provide direct feedback to another process, such as an audio EQ scoring engine 404, etc. In certain examples, the EQ neural network 402 outputs data that is buffered (e.g., via the cloud, etc.) and validated (e.g., via EQ validation data 410) before it is provided to another process.

In the example of FIG. 4, the EQ neural network 402 receives input from previous outcome data associated with audio playback settings training data, and outputs an algorithm to predict audio playback settings associated with audio signals. The EQ neural network 402 can be seeded with some initial correlations and can then learn from ongoing experience. In some examples, the EQ neural network 402 continually receives feedback from at least one audio playback settings training data. In the example of FIG. 4, throughout the operational life of the audio EQ engine 118, the EQ neural network 402 is continuously trained via feedback and the example audio EQ engine validator 406 can be updated based on the EQ neural network 402 and/or additional audio playback settings training data 408 as desired. The EQ neural network 402 can learn and evolve based on role, location, situation, etc.

In some examples, a level of accuracy of the model generated by the EQ neural network 402 can be determined by an example audio EQ engine validator 406. In such examples, at least one of the audio EQ scoring engine 404 and the audio EQ engine validator 406 receive a set of audio playback settings validation data 410. Further in such examples, the audio EQ scoring engine 404 receives inputs (e.g., CQT data) associated with the audio playback settings validation data 410 and predicts one or more audio playback settings associated with the inputs. The predicted outcomes are distributed to the audio EQ engine validator 406. The audio EQ engine validator 406 additionally receives known audio playback settings associated with the inputs and compares the known audio playback settings with the predicted audio playback settings received from the audio EQ scoring engine 404. In some examples, the comparison will yield a level of accuracy of the model generated by the EQ neural network 402 (e.g., if 95 comparison yield a match and 5 yield an error, the model is 95% accurate, etc.). Once the EQ neural network 402 reaches a desired level of accuracy (e.g., the EQ neural network 402 is trained and ready for deployment), the audio EQ engine validator 406 can output the model (e.g., the output 414) to the data store 224 of FIG. 2 for use by the media unit 106 to determine audio playback settings. In some examples, after being trained, the EQ neural network 402 outputs sufficiently accurate EQ filter settings (e.g., EQ filter settings 209) to the media unit 106.

Third Implementation: Thresholding-Based Equalization

In the third implementation, the example EQ neural network 402 of the illustrated example can be trained using a library of reference audio signals for which audio equalization profiles (e.g., gains, cuts, etc.) have been determined (e.g., by an audio engineer). In the illustrated example of FIG. 4, the EQ neural network 402 receives the example training data 408 (e.g., reference audio signals, EQ curves, and engineer tags). The engineer tags indicate, for specific tracks, which one of a plurality of audio engineers generated the equalization profile for the track. In some examples, the engineer tags may be represented by a one hot vector where each entry of the one hot vector corresponds to an engineer tag. In some examples, without informing the EQ neural network 402 of the engineer that generated the equalization profile for a track, the EQ neural network 402 may ultimately average the relative stylistic differences between different audio engineers. For example, if a first set of reference audio signals has EQ curves generated by an audio engineer that generally emphasizes the bass frequency range more, while a second set of reference audio signals has EQ curves generated by an audio engineer that generally emphasizes the middle frequency range more, the EQ neural network 402 may cancel these relative difference during training if it is unaware which audio engineer generated the EQ curves. By providing the engineer tags associated with the ones of the plurality of reference audio signals and corresponding EQ curves, the EQ neural network 402 intelligently learns to recognize different equalization styles and effectively utilize such styles when providing the output 414 (e.g., EQ gains/cuts 241) in response to the EQ input feature set 239. In some examples, the EQ neural network 402 is trained by associating samples of ones of the reference audio signals in the training data 408 with the known EQ curves for the reference audio signals.

In some examples, reference audio signals can be generated by taking professionally engineered tracks and deteriorating the audio by applying equalization curves to target a match with a spectral envelope of track that is not professionally engineered (e.g., from a lesser known artist). The EQ neural network 402 can then be trained to revert the deterioration by applying equalization curves to restore the track to its original quality level. Thus, any professionally engineered track can be utilized with this deterioration technique to enable high volume training.

In some examples, a loss function can be utilized for training the EQ neural network 402. For example, Equation 3, represents one example loss function that can be utilized, where $g_i$ is the ground truth gain value in bin "i," and $\hat{g}_i$ is the predicted value for that bin:

$$L = \sum_{i=1}^{25}(g_i - \hat{g}_i)^2 \quad \text{Equation 3}$$

Once a desired neural network behavior has been achieved (e.g., a machine has been trained to operate according to a specified threshold, etc.), the neural network can be deployed for use (e.g., testing the machine with "real" data, etc.). In some examples, the neural network can then be used without further modifications or updates to the neural network parameters (e.g., weights).

In some examples, during operation, neural network classifications can be confirmed or denied (e.g., by an expert user, expert system, reference database, etc.) to continue to improve neural network behavior. The example neural network is then in a state of transfer learning, as parameters for classification that determine neural network behavior are updated based on ongoing interactions. In some examples, the neural network such as the EQ neural network 402 can provide direct feedback to another process, such as an audio EQ scoring engine 404, etc. In some examples, the EQ neural network 402 outputs data that is buffered (e.g., via the cloud, etc.) and validated before it is provided to another process.

In some examples, the EQ neural network 402 can be seeded with some initial correlations and can then learn from ongoing experience. In some examples, throughout the operational life of the audio EQ engine 118, the EQ neural network 402 is continuously trained via feedback and the example audio EQ engine validator 406 can be updated based on the EQ neural network 402 and/or additional audio playback settings training data 408 as desired. In some examples, the EQ neural network 402 can learn and evolve based on role, location, situation, etc.

In some examples, a level of accuracy of the model generated by the EQ neural network 402 can be determined by an example audio EQ engine validator 406. In such examples, at least one of the audio EQ scoring engine 404 and the audio EQ engine validator 406 receive a set of audio playback settings training data (e.g., training data 408). The audio EQ scoring engine 404 of the illustrated example of FIG. 4 can determine an effectiveness of the output 414 (e.g., the EQ gains/cuts 241) output by the EQ neural network 402 in response to the input 412 (e.g., the EQ input feature set 239). In some examples, the audio EQ scoring engine 404 communicates with the audio EQ engine validator 406 during a validation procedure to determine how closely an output of the EQ neural network 402 in response to an input feature set corresponds to a known EQ curve for the input 412 (e.g., the EQ input feature set 239). For example, the EQ input feature set 239 can be an audio sample for which an audio engineer has provided an EQ curve, and the audio EQ engine validator 406 can compare the output (e.g., the EQ gains/cuts 241) output by the EQ neural network 402 with the EQ curve (e.g., gains/cuts) provided by the audio engineer.

The EQ neural network 402 of the illustrated example of FIG. 4, after being trained, responds to the input 412 (e.g., the EQ input feature set 239) by providing the output 414 (e.g., the EQ gains/cuts 241) to the media unit 106. For example, the EQ neural network 402 can determine a plurality of equalization adjustments (e.g., the EQ gains/cuts 241) based on an inference associated with at least the reference audio signals, the EQ curves, and the engineer tags. In some examples, the EQ gains/cuts 241 include a plurality of volume adjustment values (e.g., gains/cuts) corresponding to a plurality of frequency ranges. In some examples, the EQ gains/cuts 241 include a plurality of volume adjustment values corresponding to a plurality of frequency ranges. For example, the EQ gains/cuts 241 output by the EQ neural network 402 can include twenty-four gain or cut values corresponding to the twenty-four critical bands of hearing.

In some examples, the EQ neural network 402 may learn equalization settings based upon a user's input(s). For example, if a user continually adjusts the equalization in a particular manner (e.g., increasing volume at bass frequencies, decreasing volume at treble frequencies, etc.) the EQ neural network 402 may learn these adjustments and output the EQ gains/cuts 241 accounting for the user preference.

In some examples, the comparison will yield a level of accuracy of the model generated by the EQ neural network 402 (e.g., if 95 comparison yield a match and 5 yield an error, the model is 95% accurate, etc.). In some examples, once the EQ neural network 402 reaches a desired level of accuracy (e.g., the EQ neural network 402 is trained and ready for deployment), the audio EQ engine validator 406 can output the model to the data store 224 of FIG. 2 for use by the media unit 106 to determine audio playback settings.

While an example manner of implementing the audio EQ engine 118 of FIG. 1 is illustrated in FIG. 4, one or more of the elements, processes and/or devices illustrated in FIG. 4 may be combined, divided, re-arranged, omitted, eliminated and/or implemented in any other way. Further, the example EQ neural network 402, the example audio EQ scoring engine 404, the example audio EQ engine validator 406, and/or, more generally, the example audio EQ engine 118 of FIG. 4 may be implemented by hardware, software, firmware and/or any combination of hardware, software and/or firmware. Thus, for example, any of the example EQ neural network 402, the example audio EQ scoring engine 404, the example audio EQ engine validator 406, and/or, more generally, the example audio EQ engine 118 of FIG. 4 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example EQ neural network 402, the example audio EQ scoring engine 404, the example audio EQ engine validator 406, and/or, more generally, the example audio EQ engine 118 of FIG. 4 is/are hereby expressly defined to include a non-transitory computer readable storage device or storage disk such as a memory, a digital versatile disk (DVD), a compact disk (CD), a Blu-ray disk, etc. including the software and/or firmware. Further still, the example audio EQ engine 118 of FIG. 4 may include one or more elements, processes and/or devices in addition to, or instead of, those illustrated in FIG. 4, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Flowchart representative of example hardware logic, machine readable instructions, hardware implemented state machines, and/or any combination thereof for implementing the media unit 106 of FIGS. 1 and 2 are shown in FIGS. 5, 6, 11, 12, 14, and 15. The machine readable instructions may be an executable program or portion of an executable program for execution by a computer processor such as the processor 1812 shown in the example processor platform 1800 discussed below in connection with FIG. 18. The program may be embodied in software stored on a non-transitory computer readable storage medium such as a CD-ROM, a floppy disk, a hard drive, a DVD, a Blu-ray disk, or a memory associated with the processor 1812, but the entire program and/or parts thereof could alternatively be executed by a device other than the processor 1812 and/or embodied in firmware or dedicated hardware. Further, although the example program is described with reference to the flowchart illustrated in FIGS. 5, 6, 11, 12, 14, and 15, many other methods of implementing the example media unit 106 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

Figure 7:
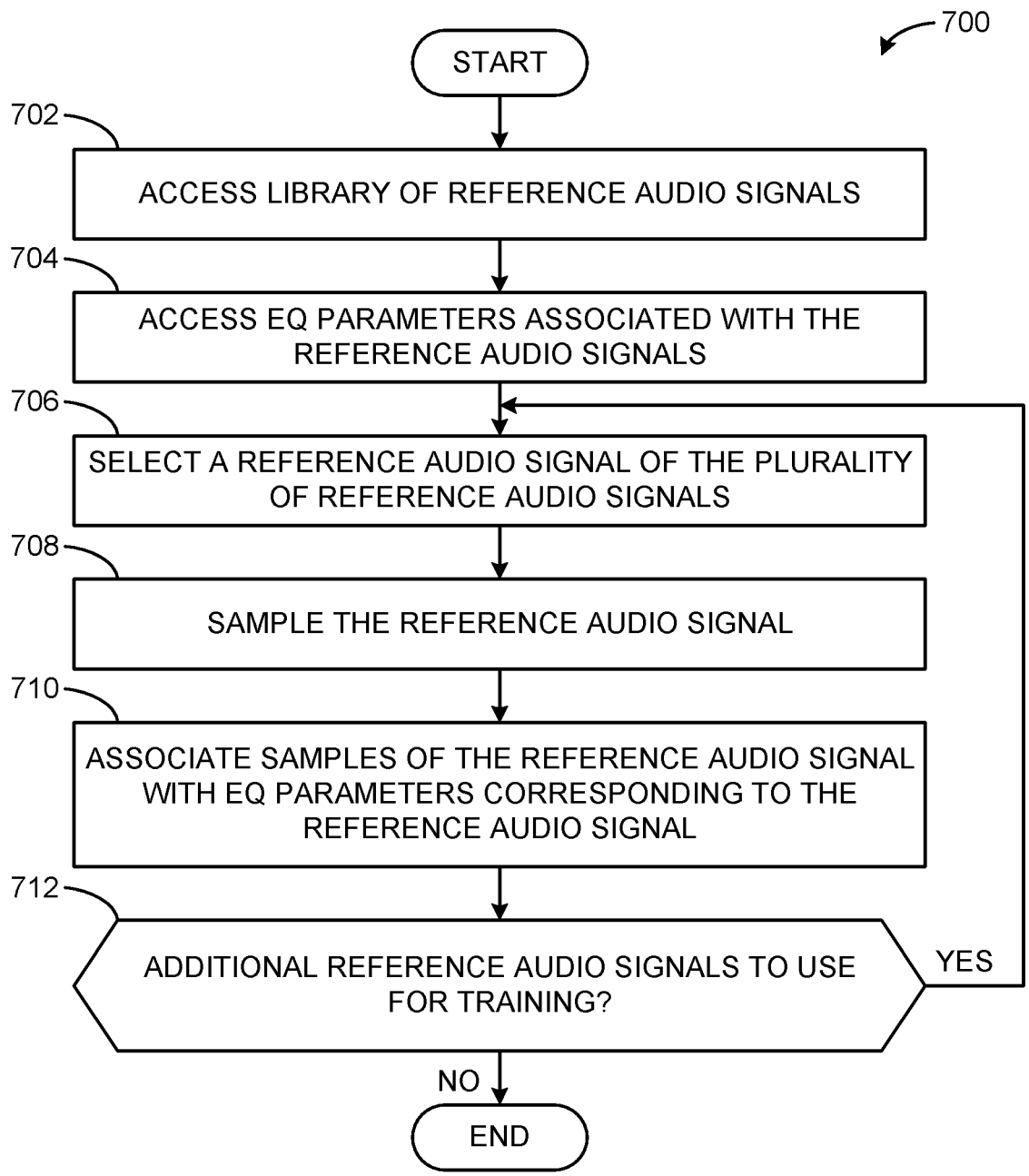
FIG. 7 is a flowchart representative of example machine readable instructions that may be executed to implement the audio EQ engine to train the EQ neural network according to the first implementation.
Figure 16:
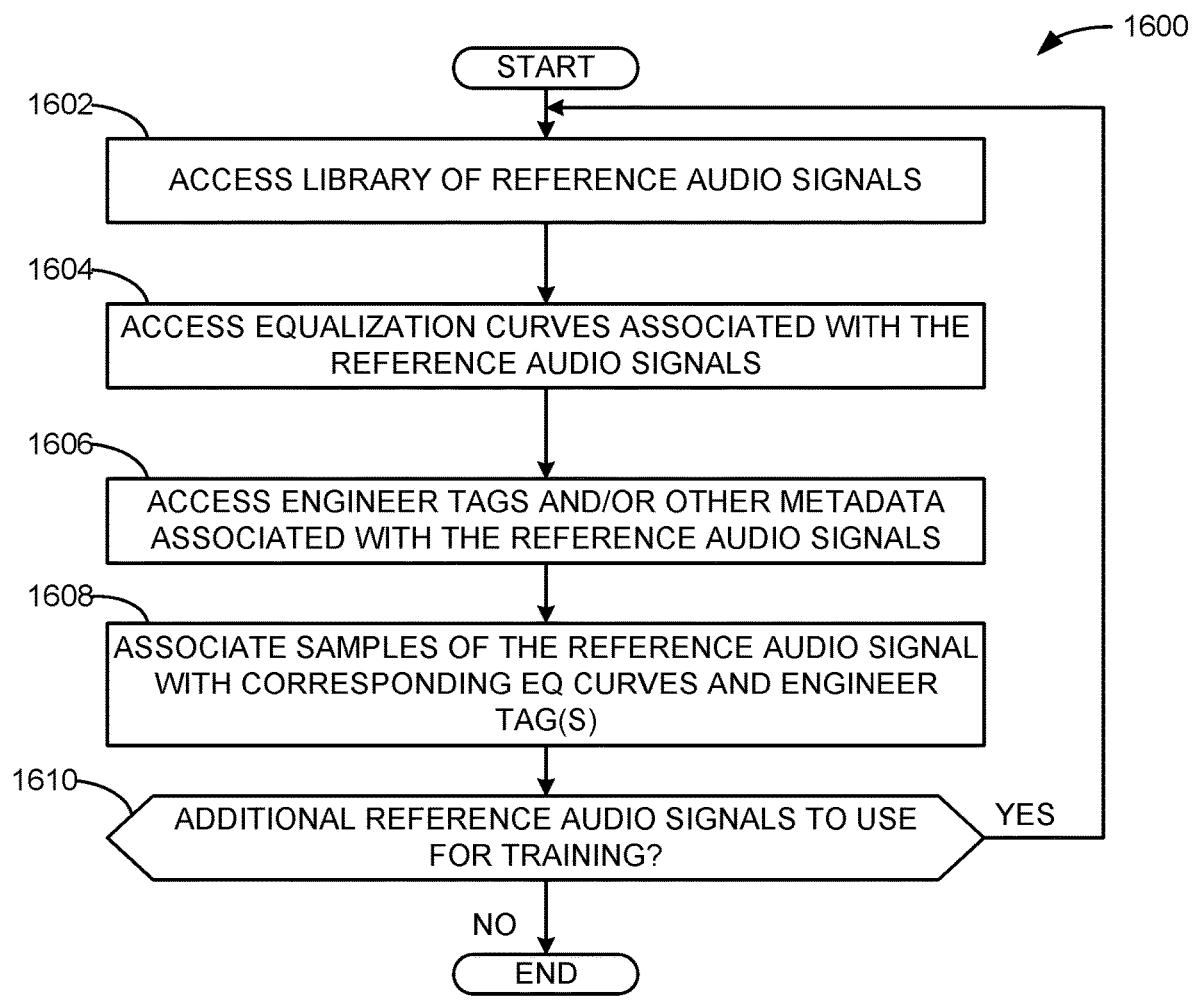
FIG. 16 is a flowchart representative of machine readable instructions that may be executed to implement the audio EQ engine of FIGS. 1 and 4 to assemble a dataset to train and/or validate a neural network based on reference audio signals according to the third implementation.

Flowchart representative of example hardware logic, machine readable instructions, hardware implemented state machines, and/or any combination thereof for implementing the audio EQ engine 118 of FIGS. 1 and 2 are shown in FIGS. 7 and 16. The machine readable instructions may be an executable program or portion of an executable program for execution by a computer processor such as the processor 1912 shown in the example processor platform 1900 discussed below in connection with FIG. 19. The program may be embodied in software stored on a non-transitory computer readable storage medium such as a CD-ROM, a floppy disk, a hard drive, a DVD, a Blu-ray disk, or a memory associated with the processor 1912, but the entire program and/or parts thereof could alternatively be executed by a device other than the processor 1912 and/or embodied in firmware or dedicated hardware. Further, although the example program is described with reference to the flowcharts illustrated in FIGS. 7 and 16, many other methods of implementing the example audio EQ engine 118 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

Figure 10:
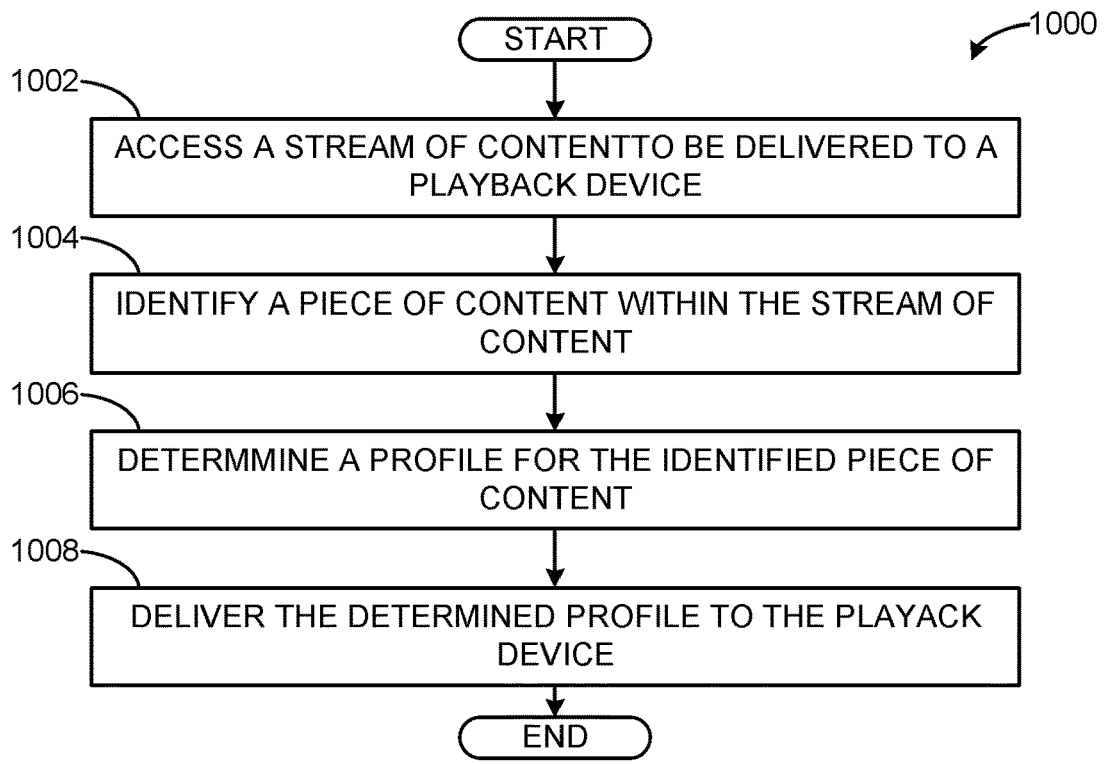
FIG. 10 is a flowchart representative of example machine readable instructions that may be executed to implement the content profile engine of FIGS. 1 and 3 to deliver profile information along with a stream of content to a playback device, according to the second implementation.

A flowchart representative of example hardware logic, machine readable instructions, hardware implemented state machines, and/or any combination thereof for implementing the content profile engine 116 of FIGS. 1 and 3 is shown in FIG. 10. The machine readable instructions may be an executable program or portion of an executable program for execution by a computer processor such as the processor 2012 shown in the example processor platform 2000 discussed below in connection with FIG. 20. The program may be embodied in software stored on a non-transitory computer readable storage medium such as a CD-ROM, a floppy disk, a hard drive, a DVD, a Blu-ray disk, or a memory associated with the processor 2012, but the entire program and/or parts thereof could alternatively be executed by a device other than the processor 2012 and/or embodied in firmware or dedicated hardware. Further, although the example program is described with reference to the flowchart illustrated in FIG. 10, many other methods of implementing the example content profile engine 116 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIGS. 5, 6, 7, 10, 11, 12, 14, 15, and 16 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

First Implementation: Filter-Based Equalization

Figure 5:
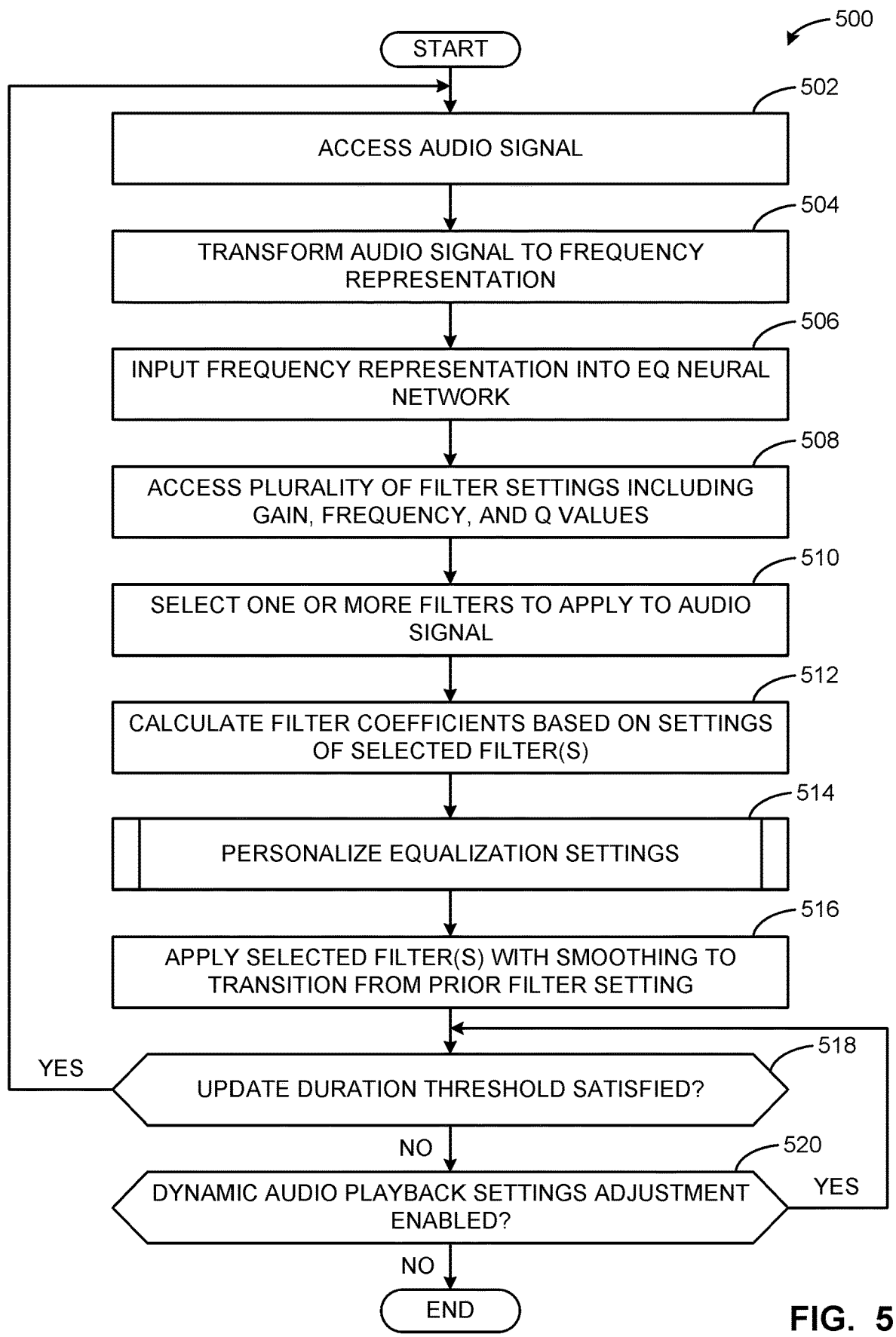
FIG. 5 is a flowchart representative of example machine readable instructions that may be executed to implement the media unit of FIGS. 1 and 2 to dynamically adjust media playback settings based on real-time analysis of media characteristics according to the first implementation.

FIG. 5 is a flowchart representative of example machine readable instructions 500 that may be executed to implement the media unit 106 of FIGS. 1 and 2 to dynamically adjust media playback settings based on real-time analysis of media characteristics according to the first implementation. With reference to the preceding figures and associated descriptions, the example machine readable instructions 500 begin with the example media unit 106 accessing an audio signal (block 502). In some examples the signal transformer 204 accesses the input media signal 202.

At block 504, the example media unit 106 transforms the audio signal to a frequency representation. In some examples, the signal transformer 204 transforms the input media signal 202 into a frequency and/or characteristic representation (e.g., a CQT representation, an FFT representation, etc.).

At block 506, the example media unit 106 inputs the frequency representation into an EQ neural network. In some examples, the EQ model query generator 206 inputs the frequency representation of the input media signal 202 to the EQ neural network 402. In some examples, the EQ model query generator 206 inputs the input media signal 202 to a model output by the EQ neural network 402.

At block 508, the example media unit 106 accesses a plurality of filter settings including gain, frequency, and Q values. In some examples, the EQ filter settings analyzer 208 accesses the plurality of filter settings including gain, frequency, and Q values. In some examples, the EQ filter settings analyzer 208 accesses a plurality of filter settings (e.g., sets of filter settings) including gain, frequency, and Q values as output by the EQ neural network 402. In some examples, the EQ filter settings analyzer 208 accesses one or more high shelf filters, one or more low shelf filters, and/or one or more peaking filters as output by the EQ neural network 402.

At block 510, the example media unit 106 selects one or more filters to apply to the input media signal 202. In some examples, the EQ filter selector 218 selects one or more filters to apply to the input media signal 202. For example, to implement a five-band filter, the EQ filter selector 218 may select one low-shelf filter, one high-shelf filter, and three peaking filters out of the sets of filters output by the EQ neural network 402.

At block 512, the example media unit 106 calculates filter coefficients based on settings of the selected filter(s). In some examples, the EQ filter settings analyzer 208 calculates filter coefficients based on filter settings of the selected filter(s) to enable application of the one or more filter(s) to the input media signal 202.

At block 514, the example media unit personalizes equalization settings. In some examples, the EQ personalization manager 210 personalized equalization settings (e.g., personalized EQ settings). Detailed example machine readable instructions to personalize equalization settings and illustrated and described in connection with FIG. 6.

At block 516, the example media unit 106 applies the selected filter(s) with smoothing to transition from prior filter settings (e.g., prior audio playback settings). In some examples, the EQ adjustment implementor 220 applies the selected filter(s), and transitions to the new playback settings based on a smoothing filter as indicated by the smoothing filter configurator 222. In some examples, the EQ adjustment implementor 220 may implement the EQ filters (e.g., audio playback settings) without a smoothing filter.

At block 518, the example media unit 106 determines if the update duration threshold is satisfied. In some examples, the update monitor 226 determines if the update duration threshold is satisfied. For example, if the update duration threshold is set to one second, the update monitor 226 determines whether one second has passed since previous audio playback settings have been determined and implemented. In response to the update duration threshold being satisfied, processing transfers to block 502. Conversely, in response to the update duration threshold not being satisfied, processing transfers to block 520.

At block 520, the example media unit 106 determines if dynamic audio playback settings adjustment is enabled. In response to dynamic audio playback settings adjustment being enabled, processing transfers to block 518. Conversely, in response to dynamic audio playback settings adjustment not being enabled, processing terminates.

Figure 6:
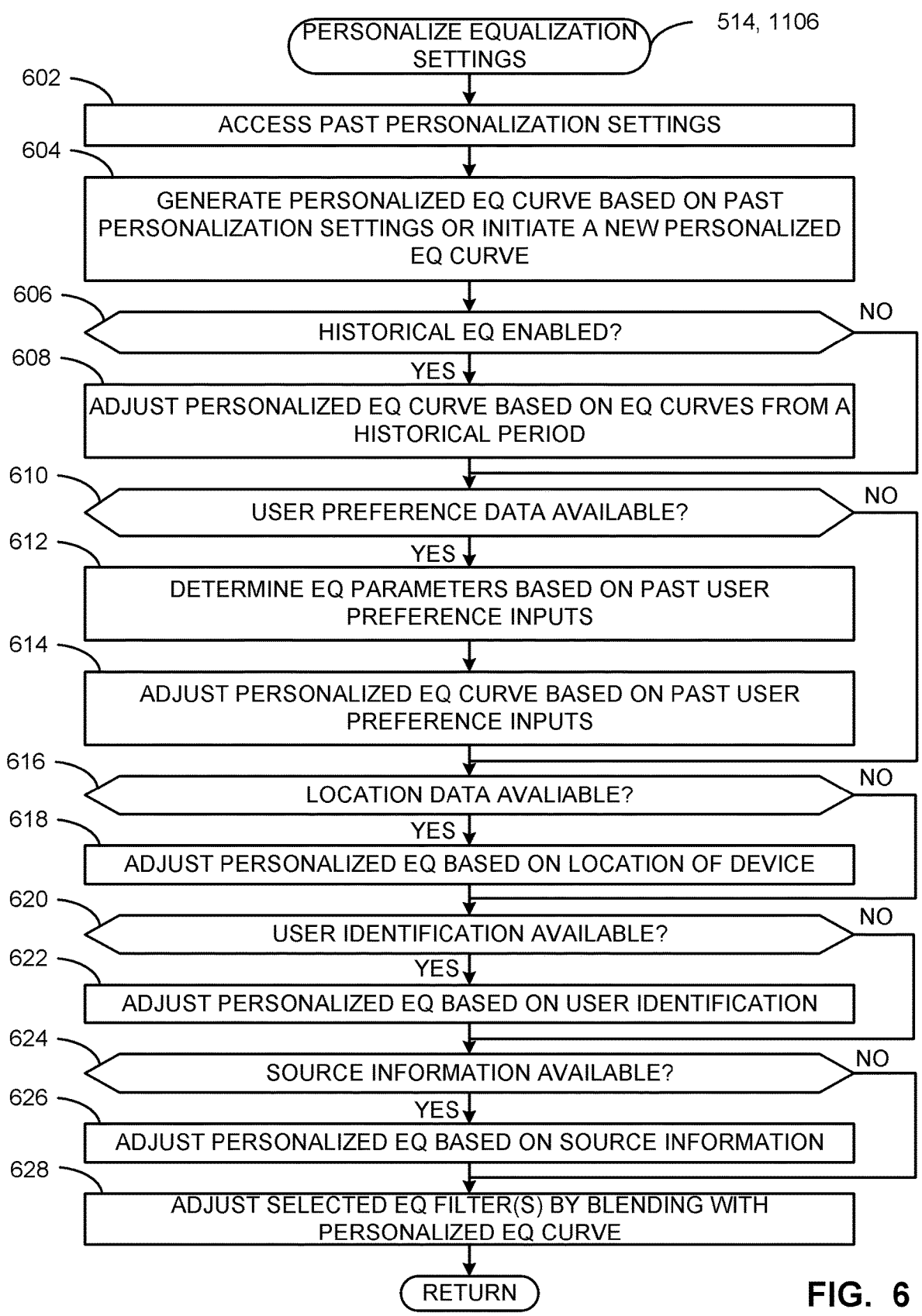
FIG. 6 is a flowchart representative of example machine readable instructions that may be executed to implement the media unit 106 of FIGS. 1 and 2 to personalize equalization settings.

FIG. 6 is a flowchart representative of example machine readable instructions 514 and/or example machine readable instructions 1106 that may be executed to implement the media unit 106 of FIGS. 1 and 2 to personalize equalization settings. With reference to the preceding figures and associated descriptions, the example machine readable instructions 514 and/or the example machine readable instructions 1106 begin with the example media unit 106 accessing past personalization settings (block 602).

At block 604, the example media unit 106 generates a personalized EQ curve based on past personalization settings or initiates a new personalized EQ curve. In some examples, the historical EQ manager 214 generates a personalized EQ curve based on past personalization settings or initiates a new personalized EQ curve.

At block 606, the example media unit 106 determines whether historical EQ is enabled. In some examples the historical EQ manager 214 determines whether historical EQ is enabled (e.g., historical equalization is enabled). In response to historical EQ being enabled, processing transfers to block 608. Conversely, in response to historical EQ not being enabled, processing transfer to block 610.

At block 608, the example media unit 106 adjusts the personalized EQ curve based on EQ curves from a historical period. In some examples, the historical EQ manager 214 adjusts the personalized EQ curve based on EQ curves from a historical period (e.g., the past hour, the past day, etc.).

At block 610, the media example unit 106 determines whether user preference data is available (e.g., data indicative of preferences of a user). In some examples, the user input analyzer 216 determines whether user preference data is available. For example, the user input analyzer 216 may determine user EQ preferences based on instances where the user pressed a "like" button while listening to music. In response to user preference data being available (e.g., availability of user preference data), processing transfers to block 612. Conversely, in response to user preference data not being available, processing transfers to block 616.

At block 612, the media example unit 106 determines EQ parameters based on past user preference inputs (e.g., "likes," ratings, etc.). In some examples, the user input analyzer 216 determine EQ parameters based on past user preference inputs.

At block 614, the example media unit 106 adjusts the personalized EQ curve based on past user preference inputs. In some examples the user input analyzer 216 adjusts the personalized EQ curve based on EQ curves from a historical period.

At block 616, the example media unit 106 determines whether location data is available. In some examples, the device parameter analyzer 212 determines whether location data is available. In response to location data being available (e.g., availability of location data), processing transfers to block 618. Conversely, in response to location data not being available, processing transfers to block 620.

At block 618, the example media unit 106 adjusts the personalized EQ curve based on the location of the device. In some examples, the device parameter analyzer 212 adjusts the personalized EQ curve based on the location of the device. For example, if the device is at a gym, a different personalized EQ curve may be generated than if the device is at a workplace.

At block 620, the example media unit 106 determines whether a user identification is available. In some examples, the device parameter analyzer 212 determines whether a user identification is available. In response to user identification being available (e.g., availability of user identification), processing transfers to block 622. Conversely, in response to user identification not being available, processing transfers to block 624.

At block 622, the example media unit 106 adjusts the personalized EQ curve based on a user identification. For example, the device parameter analyzer 212 may determine that a first user, who has a historical profile (e.g., according to the historical EQ manager 214) of listening to mostly rock music, is using the media unit 106. In such an example, the device parameter analyzer 212 can adjust the personalized EQ curve to be more suitable to rock music. Consequently, data stored in the historical EQ manager 214 may be filterable based on a specific user, a location, an app providing the audio, etc.

At block 624, the example media unit 106 determines whether source information is available. In some examples, the device parameter analyzer 212 determines whether source information is available. In response to source information being available (e.g., availability of source information), processing transfers to block 626. Conversely, in response to source information not being available, processing transfers to block 628.

At block 626, the example media unit 106 adjusts the personalized EQ curve based on source information. In some examples, the device parameter analyzer 212 adjusts the personalized EQ curve based on source information. For example, the source information may indicate a specific app (e.g., a music app, a fitness app, an audiobook app, etc.) of a mobile device. Based on the source of the input media signal 202, the personalized EQ curve can be adjusted.

At block 628, the example media unit 106 adjusts the selected EQ filter(s) to be applied to the input media signal 202 by blending the dynamically generated filter outputs with the personalized EQ curve. For example, weights may be applied to each of the dynamically generated curves (e.g., based on outputs from the query submitted to the EQ neural network) and the personalized EQ curves, and an average curve can be generated and applied to the input media signal 202. This average curve therefore accounts for both variances between tracks as well as personal preferences. After block 628, the machine readable instructions 514 and/or the machine readable instructions 1106 return to the machine readable instructions 500 at block 516 and to the machine readable instructions 1100 at block 1108, respectively.

FIG. 7 is a flowchart representative of example machine readable instructions 700 that may be executed to implement the audio EQ engine 118 of FIG. 4 to train the EQ neural network 402 according to the first implementation. With reference to the preceding figures and associated descriptions, the example machine readable instructions 700 begin with the example audio EQ engine 118 accessing a library of reference audio signals (block 702). In some examples, the EQ neural network 402 accesses the library of reference audio signals. The library of reference audio signals includes audio signals for which audio playback settings have been determined (e.g., by an expert).

At block 704, the example audio EQ engine 118 accesses EQ parameters associated with the reference audio signals. In some examples, the EQ neural network 402 accesses EQ parameters (e.g., audio playback settings) associated with the reference audio signals. For example, the EQ neural network 402 may accesses one or more filters, one or more gain values, frequencies values, Q values, etc.

At block 706, the example audio EQ engine 118 selects a reference audio signal of the plurality of reference audio signals. In some examples, the EQ neural network 402 selects a reference audio signal of the plurality of reference audio signals.

At block 708, the example audio EQ engine 118 samples the reference audio signal. In some examples, the EQ neural network 402 samples the reference audio signal by creating a pre-determined number of samples out of the audio signal (e.g., three-hundred, five-hundred, etc.).

At block 710, the example audio EQ engine 118 associates the samples of the reference audio signal with EQ parameters (e.g., audio playback settings) corresponding to the reference audio signal. In some examples, the EQ neural network 402 associates the samples of the reference audio signal with EQ parameters corresponding to the reference audio signal.

At block 712 the example audio EQ engine 118 determines whether there are additional reference audio signals to use for training. In some examples, the EQ neural network 402 determines whether there are additional reference audio signals to use for training. In response to there being additional reference audio signals to use for training, processing transfers to block 706. Conversely, in response to there not being additional reference audio signals to use for training, processing terminates.

Figure 8A:
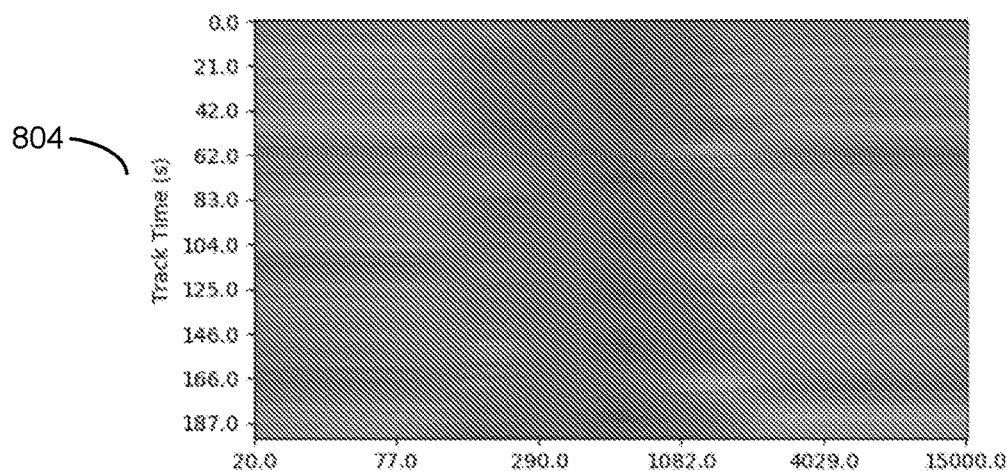
FIG. 8A is a first spectrogram of an audio signal which has undergone dynamic audio playback setting adjustment based on real-time analysis of audio characteristics, but without a smoothing filter, according to the first implementation.

FIG. 8A is a first spectrogram 800a of an audio signal which has undergone dynamic audio playback setting adjustment based on real-time analysis of audio characteristics, but without a smoothing filter. The first spectrogram 800a depicts frequency values in Hertz on the horizontal axis 802 (e.g., the x-axis) and time values in seconds of an audio signal on the vertical axis 804 (e.g., the y-axis). The shading of the first spectrogram 800a represents the amplitude of the audio signal at a specific frequency and time for the audio signal. The shading of the first spectrogram 800a depicts sharp transitions between audio signal amplitudes at numerous frequencies. For example, shading of the first spectrogram 800a transitions sharply between lighter shading and darker shading within individual frequency bands, at least partially due to the transitions between audio playback settings implemented by the dynamic audio playback settings adjustment techniques disclosed herein, as implemented without a smoothing filter.

Figure 8B:
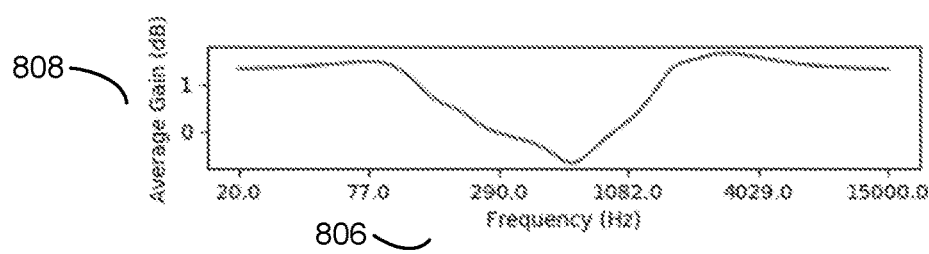
FIG. 8B is a plot depicting average gain values for frequency values for the first spectrogram of FIG. 8A.

FIG. 8B is a first plot 800b depicting average gain values for frequency values for the first spectrogram 800a of FIG. 8A. The first plot 800b includes frequency values in Hertz on the horizontal axis 806 (e.g., the x-axis) and average gain values in decibels on the vertical axis 808 (e.g., the y-axis). A comparison of the first plot 800b, representing average gain values of the audio signal with audio playback settings adjusted without smoothing, and the second plot 900b, representing average gain values of the audio signal with audio playback settings adjusted with smoothing, illustrates the advantages of applying the smoothing filter when transition between audio playback settings.

FIG. 9A is a second spectrogram 900a of an audio signal which has undergone dynamic audio playback setting adjustment based on real-time analysis of audio characteristics including a smoothing filter. The second spectrogram 900a includes frequency values in Hertz on the horizontal axis 902 (e.g., the x-axis) and time values in seconds on the vertical axis 904 (e.g., the (e.g., the y-axis). The second spectrogram 900a corresponds to the same original input audio signal of the first spectrogram 800a FIG. 8A, but a smoothing filter has been utilized when applying the audio playback settings throughout the track. Relative to the first spectrogram 800a, the second spectrogram 900a depicts smooth (e.g., gradual) transitions between audio signal amplitudes at numerous frequencies. For example, shading of the first spectrogram 800a transitions smoothly between lighter shading and darker shading within individual frequency bands, as opposed to the relatively sharp transitions exhibited in the first spectrogram 800a of FIG. 8A.

Figure 9B:
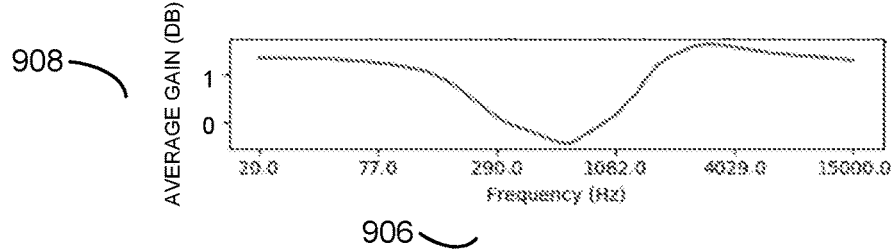
FIG. 9B is a plot depicting average gain values for frequency values in the second spectrogram of FIG. 9A.

FIG. 9B is a second plot 900b depicting average gain values for frequency values in the second spectrogram 900a of FIG. 9A. The second plot 900b includes frequency values in Hertz on the horizontal axis 906 (e.g., the x-axis) and average gain values in decibels on the vertical axis 908 (e.g., the y-axis). Relative to the first plot 800b of FIG. 8B, the second plot 900b depicts smoother transitions between average gain values in numerous frequency bands. For example, numerous sharp transitions in the average gain value that are visible around 77 Hz in the first plot 800b are not present in the second plot 900b, which depicts a gradual, smooth decrease in average gain value around 77 Hz.

Second Implementation: Profile-Based Equalization

FIG. 10 is a flowchart representative of example machine readable instructions 1000 that may be executed to implement the content profile engine 116 of FIGS. 1 and 3 to deliver profile information (e.g., the one or more profiles 229) along with a stream of content (e.g., the input media signal 202) to a playback device. As described herein, in some examples, the content profile engine 116 determines and/or generate one or more profiles 229 for the input media signal 202 to be delivered to the media device 102, the media device 104, and/or the media unit 106, among other things. With reference to the preceding figures and associated descriptions, the example machine readable instructions 1000 begin when the content profile engine 116 accesses a stream of content to be delivered to a playback device (block 1002). For example, the content retriever 302 may access the input media signal 202 from the content provider 114 that is providing the input media signal 202 to the playback device over the network 112. As another example, the content retriever 302 may access the input media signal 202 (e.g., a stream of content) from the content provider 114 that is locally stored by the playback device. As described herein, the content retriever 302 may access various types of content streams, such as audio content streams, video streams, and so on. For example, the content retriever 302 may access a stream of songs or other music, a stream of spoken content, a podcast, and so on.

At block 1004, the content profile engine 116 identifies a portion of the input media signal 202 (e.g., a portion of content within the stream of content) to be delivered to the playback device. For example, the content identifier 306 may identify the portion of the input media signal 202 using a variety of processes, including a comparison of a fingerprint for the content to a set of reference fingerprints associated with known content, such as reference fingerprints generated by the reference fingerprint generator 227. Of course, the content identifier 306 may identify the piece of content using other information, such as metadata (e.g., information identifying an associated title, artist, genre, and so on) associated with the piece of content, information associated with the content provider 114, and so on.

In some examples, the content identifier 306 may identify a certain category type or genre associated with the portion of the input media signal 202 (e.g., the piece of content). For example, instead of identifying the input media signal 202 as a specific piece of content (e.g., a specific song, YouTube™ videos/clips, TV programs, movies, podcast, and so on), the content identifier 306 may identify a genre or category applied to the portion of the input media signal 202 (e.g., the piece of content) using the techniques described herein.

At block 1006, the content profile engine 116 determines a profile for the identified piece of content. For example, the profiler 308 may determine one or more characteristics for an entire portion of the piece of content and/or may determine one or more characteristics for multiple portions of the portion of the input media signal 202 (e.g., the piece of content), such as frames or blocks of frames of the content. For example, the one or more profiles 229 may include a first set of one or more characteristics for a first portion of the input media signal 202 (e.g., the piece of content), a second set of one or more characteristics for a second portion of the input media signal 202 (e.g., the piece of content), and so on.

In some examples, the profiler 308 renders, generates, creates, and/or otherwise determines the one or more profiles 229 for the input media signal 202 (e.g., piece of content), such as audio content having a variety of different characteristics. For example, the determined or generated the one or more profiles 229 may include characteristics associated with equalization (EQ) settings, spatialization settings, virtualization settings, video settings, and so on.

At block 1008, the content profile engine 116 delivers the one or more profiles 229 to the playback device. For example, the profiler 308 may deliver the one or more profiles 229 to the playback device over the network 112 or via other communication channels.

For example, the content profile engine 116 may access a piece of content that is a song to be streamed to a playback device that is a car stereo, identify the song as a specific song, which is associated with a genre of "classical music," determine a profile that includes a set of equalization settings to be used when playing the song via the car stereo (e.g., signal strength indicators for different frequencies within the song, speaker spatialization settings, and so on), and deliver the profile to the car stereo to be consumed by a network associated with the car stereo, such as a car area network (CAN), which controls the operation of the car stereo.

In another example, the content profile engine 116 may access a piece of content that is a movie to be streamed via a broadcast network or the Internet to a playback device that is a TV set or set top box, identify the movie as being a specific movie as a specific movie, which is associated with a genre of "action", and as possessing a lot of fast action sequences, determine a profile that includes a set of image processing settings to be used when playing the movie via the TV set or other device (e.g. color palette settings, frame rate upscaling settings, contrast enhancement settings for low contrast scenes, etc.), and deliver the profile to the TV set or other device for adjusting the rendering and thus the content experience by the user.

Figure 11:
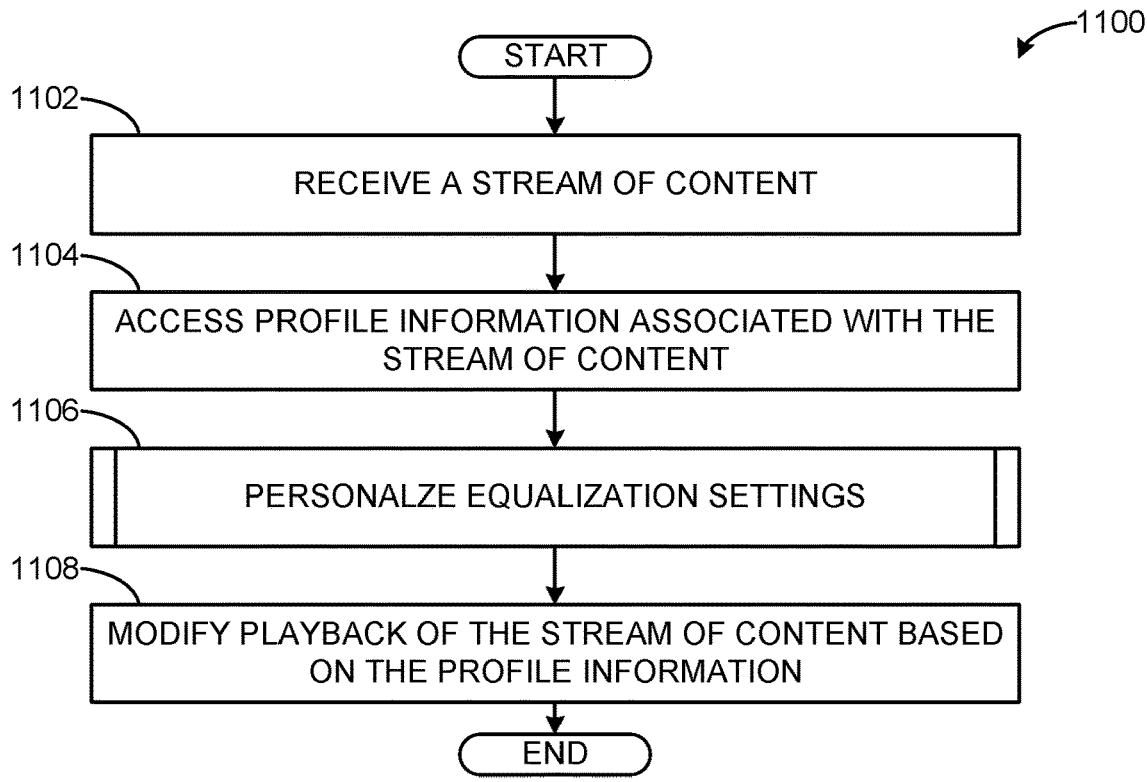
FIG. 11 is a flowchart representative of example machine readable instructions that may be executed to implement the media unit of FIGS. 1 and 2 to play content using modified playback settings, according to the second implementation.

FIG. 11 is a flowchart representative of example machine readable instructions 1100 that may be executed to implement the media unit 106 of FIGS. 1 and 2 to play content using modified playback settings. As described herein, in some examples, the media unit 106 modifies or adjusts the playback of content by the playback device (e.g., the media device 102, the media device 104, and/or the media unit 106), among other things. With reference to the preceding figures and associated descriptions, the example machine readable instructions 1100 begin when the media unit 106 receives and/or accesses a stream of content at or associated with a playback device (block 1102). For example, the media unit 106, and/or, more specifically, the synchronizer 228 may access the input media signal 202 (e.g., a content stream) to be played by a playback device.

At block 1104, the media unit 106 accesses profile information associated with the stream of content. For example, the media unit 106, and more specifically, the synchronizer 228 may receive a profile or profile information that is generated by the content profile engine 116. As described herein, the content profile engine 116 may determine the profile by identifying the stream of content based on a comparison of fingerprints associated with the stream of content to a set of fingerprints associated with known content, and select or otherwise determine the one or more profiles 229 that is associated with the identified input media signal 202 (e.g., stream of content).

The one or more profiles 229 may include various types of information, such as information identifying a category or genre associated with the song, information identifying a mood associated with the song, such as upbeat mood, a relaxed mood, a soft mood, and so on, information identifying signal strength parameters for different frequencies within the content, such as low frequencies for bass and other similar tones, high frequencies for spoken or sung tones, prosodic information and/or language information obtained from spoken content, and so on.

Additionally or alternatively, the one or more profiles 229 may include information identifying a category or genre associated with video, or a segment of a video clip, information identifying a mood associated with the video, information identifying brightness, color palette, color contrast, luminance range, blurriness, display format, video scene information, information obtained from visual object detection and/or recognition, or face detection and or recognition, or broadcast logo detection and/or recognition algorithms, presence and/or content of text or subtitles, presence and/or content of watermarks, and so on.

At block 1106, the media unit 106 personalizes equalization settings. In some examples, the EQ personalization manager 210 personalizes equalization settings. Detailed instructions to personalize equalization settings are illustrated and described in connection with FIG. 6.

At block 1108, the media unit 106 modifies the playback of the input media signal 202 (e.g., stream of content) based on the accessed profile information and/or based on the personalized EQ profile generated at block 1106. For example, the EQ adjustment implementor 220 may modify playback of the input media signal 202 on a playback device based on a blended equalization generated based on the one or more profiles 229 and the personalized EQ profile. In another example, the EQ adjustment implementor 220 may apply information within the one or more profiles 229 to modify or adjust the settings of an equalizer of the playback device, in order to adjust and/or tune the equalization during the playback of the input media signal 202 (e.g., stream of content). In addition to the equalization, the EQ adjustment implementor 220 may adjust a variety of different playback settings, such as virtualization settings, spatialization settings, and so on.

In some examples, the media unit 106 may access a profile that includes multiple settings that relate to different portions of the content. For example, a song may include portions having different tempos, and the corresponding profile generated for the song may include first portion having a setting of "slow," a second portion having a setting of "fast," and a third portion having the setting of "slow," among other things. The media unit 106, which may receive the profile from a different platform than the playback device, may synchronize the profile to the song in order to accurately adjust the playback settings using the multiple settings contained by the profile.

Figure 12:
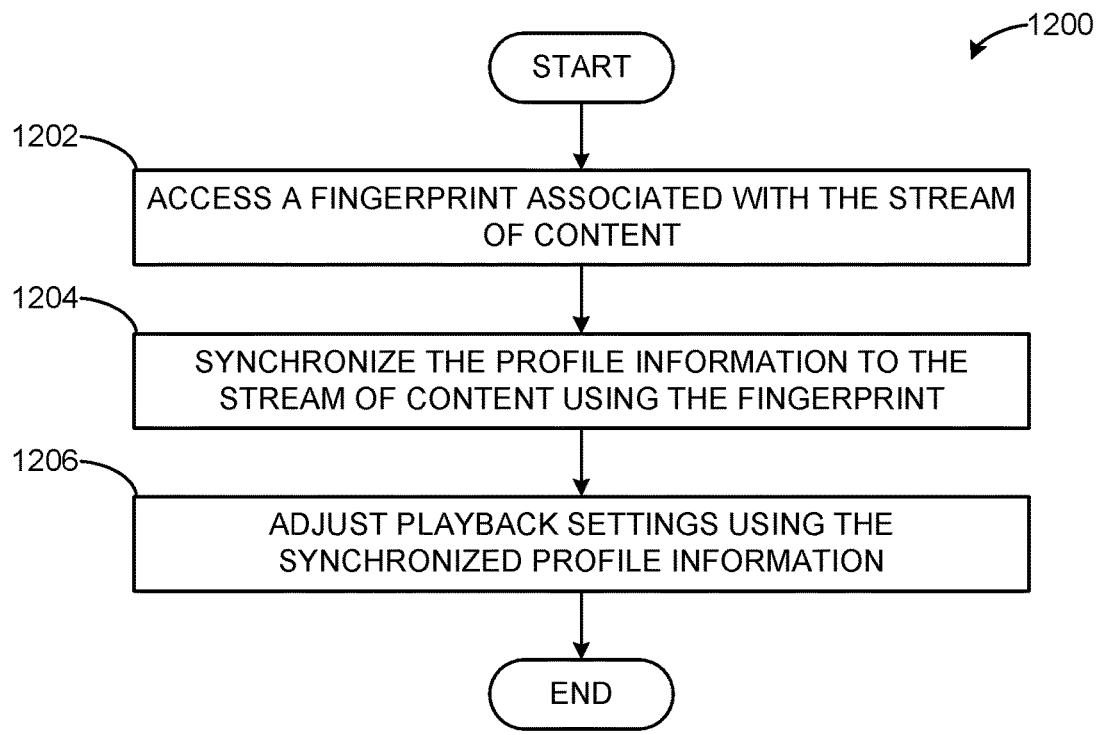
FIG. 12 is a flowchart representative of example machine readable instructions that may be executed to implement the media unit of FIGS. 1 and 2 to adjust playback settings based on profile information associated with content, according to the second implementation.

FIG. 12 is a flowchart representative of example machine readable instructions 1200 that may be executed to implement the media unit 106 of FIGS. 1 and 2 to adjust playback settings based on profile information associated with content. For example, the media unit 106 can adjusting playback settings based on profile information associated with content, according to some examples. With reference to the preceding figures and associated descriptions, the example machine readable instructions 1200 begin when the media unit 106 accesses the one or more profiles 229 for the input media signal 202 (e.g., the piece of content) (block 1202). For example, the media unit 106, and/or, more specifically, the synchronizer 228 may access different types of profiles, such as single setting profiles, multiple setting profiles, and so on.

At block 1204, the media unit 106 synchronizes the one or more profiles 229 to the input media signal 202 (e.g., the piece of content). For example, the synchronizer 228 may utilize a fingerprint or fingerprints associated with the input media signal 202 (e.g., the piece of content) to synchronize the input media signal 202 (e.g., the piece of content) to the one or more profiles 229. The one or more profiles 229 may include information that relates one or more settings to a known fingerprint for the piece of content and aligns the settings to a portion of the input media signal 202 (e.g., the piece of content) in order to synchronize the one or more profiles 229 to the piece of content during playback of the input media signal 202. As another example, the synchronizer 228 may identify various audio events within the piece of content (e.g., a snare hit, the beginning of a guitar solo, an initial vocal), and align the one or more profiles 229 to the events within the input media signal 202, in order to synchronize the one or more profiles 229 to the piece of content during playback of the input media signal 202.

At block 1206, the media unit 106 modifies the playback of the input media signal 202 utilizing the playback device (e.g., the media device 102, the media device 104, the media unit 106, etc.) based on the synchronized profile for the input media signal 202. For example, the EQ adjustment implementor 220 may apply information within the one or more profiles 229 to modify or adjust the settings of an equalizer of the playback device, in order to adjust and/or tune the equalization during the playback of the input media signal 202 (e.g., the stream of content). Likewise, when the content is video, the one or more profiles 229 may be used to adjust video-related settings.

Figure 13A:
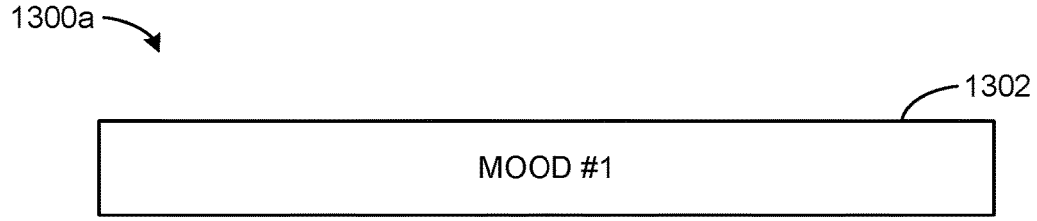
FIGS. 13A-13B are block diagrams of example content profiles, in accordance with the teachings of this disclosure.
Figure 13B:
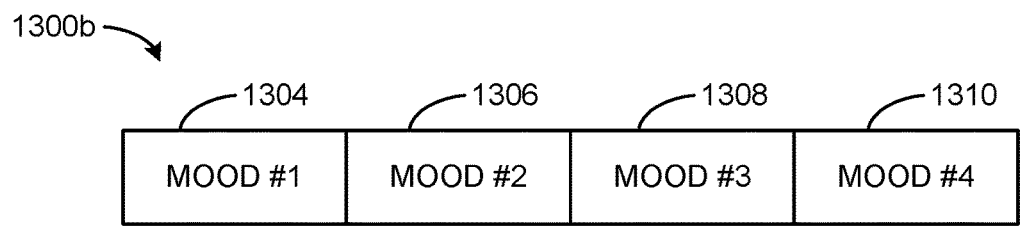

FIGS. 13A-13B are block diagrams of example content profiles, in accordance with the teachings of this disclosure. FIG. 13A depicts a content profile 1300a that includes a single setting 1302, or "mood #1" for an entire piece of content. On the other hand, FIG. 13B depicts a content profile 1300b that includes multiple different settings for the piece of content. For example, the content profile 1300b includes a first setting 1304 (e.g., "mood #1"), a second setting 1306 (e.g., "mood #2"), a third setting 1308 (e.g., "mood #3"), and a fourth setting 1310 (e.g., "mood #4), among other settings. Therefore, in some examples, the media unit 106 may utilize complex or multilayered profiles, which include different settings to be applied to different portions of content, in order to dynamically adjust the playback experience of the content at different times during the playback of the content, among other things.

Thus, the systems and methods described herein may provide a platform that facilitates a real-time, or near real-time, processing and delivery of profile information (e.g., a content profile) to a playback device, which utilizes the content profile to adjust a playback experience (e.g., video and/or audio experience) associated with playing the content to users, among other things. This may entail buffering the content before rendering of the content until a profile can be retrieved or predicted. In one example, a specific profile may be applied based on usage history (e.g. the user has consumed a specific content type associated with a specific profile at this time of day/week for the past several days/weeks, so the same profile will be applied again after determination of the usage pattern). In another example, the user has earlier established preference of a specific profile with a specific type of content (e.g. a video clip categorized as TV drama), so going forward content that profile will be automatically applied for the same or similar types of content. Another way of predicting a profile for a user may be through applying collaborative filtering methods, where profiles of other users are inferred on a particular user based on usage patterns, demographic information, or any other information about a user or user group. Yet another example is including device settings such as content source setting, e.g. the selected input on a TV set, such as the input that connects to a set top box, vs. the input that connects to a DVD player or game console, to determine or influence the profile selection.

Many playback devices may utilize such a platform, including: (1) A car stereo system that receives and plays content from an online, satellite, or terrestrial radio station and/or from a locally stored content player (e.g., CD player, MP3 player, and so on); (2) A home stereo system that receives and plays content from an online, satellite, or terrestrial radio station and/or from a locally stored content player (e.g., CD player, MP3 player, a TV set, a Set-Top-Box (STB), a game console, and so on); (3) A mobile device (e.g., smart phone or tablet) that receives and plays content (e.g., video and/or audio) from an online, satellite, or terrestrial radio station and/or from a locally stored content player (e.g., MP3 player); and so on.

In some examples, the systems and methods may enhance and/or optimize low quality or low volume recordings and other content. For example, the content profile engine 116 may identify a stream of content (e.g., a homemade podcast) as having low audio quality, and generate a profile for the low-quality stream of content that includes instructions to boost the playback of the content. The media unit 106 may then adjust the playback settings of the playback device (e.g., a mobile device, the media device 102, the media device 104, the media unit 106) to boost the fidelity of the playback of the low-quality content, among other things.

In some examples, the systems and methods may diminish the quality of certain types of content, such as advertisements within a content stream. For example, the content profile engine 116 may identify a stream of content includes a commercial break and generate a profile for the stream of content that lowers the playback quality during the commercial break. The media unit 106 may then adjust the playback settings of the playback device (e.g., a mobile device, the media device 102, the media device 104, the media unit 106) to lower the fidelity of the playback of the content during the commercial break, among other things. Of course, other scenarios may be possible.

Third Implementation: Thresholding-Based Equalization

Figure 14:
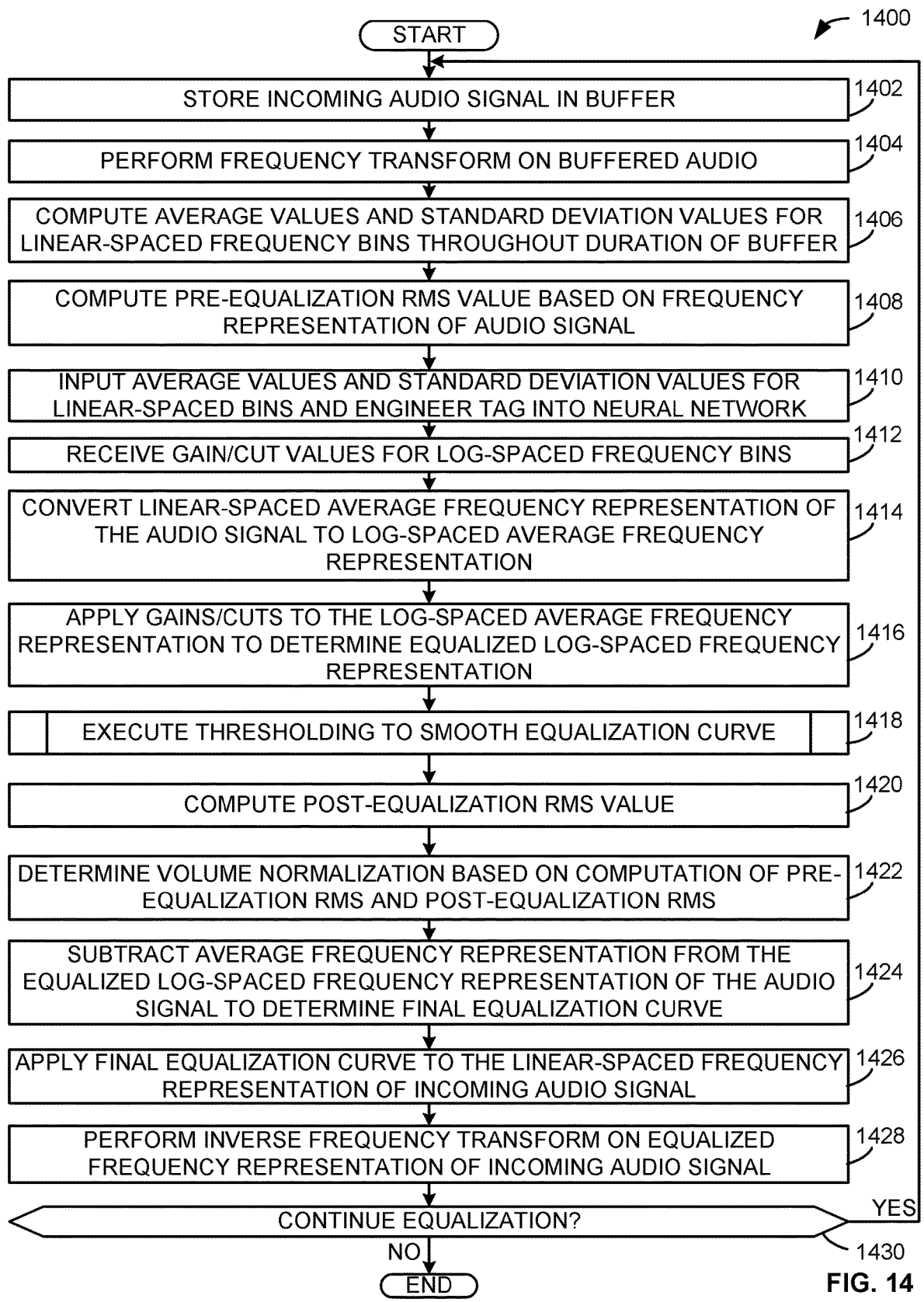
FIG. 14 is a flowchart representative of machine readable instructions that may be executed to implement the media unit of FIGS. 1 and 2 to perform real-time audio equalization according to the third implementation.

FIG. 14 is a flowchart representative of example machine readable instructions 1400 that may be executed to implement the media unit 106 of FIGS. 1 and 2 to perform audio equalization according to the third implementation. With reference to the preceding figures and associated description, the example machine readable instructions 1400 begin with the example media unit 106 storing the input media signal 202 in a buffer (block 1402). In some examples, the example buffer manager 230 stores the input media signal 202 in the data store 224. In some examples, the buffer manager 230 removes portions of the input media signal 202 which have exceeded their storage duration in the buffer (e.g., ten seconds, thirty seconds, etc.).

At block 1404, the example media unit 106 performs a frequency transform on the buffered audio. In some examples, the time to frequency domain converter 232 performs a frequency transform (e.g., an FFT) on the portion of the input media signal 202 in the buffer.

At block 1406, the example media unit 106 computes average values and standard deviation values for the linear-spaced frequency bins throughout the duration of the buffer. In some examples, the volume calculator 234 computes average values and standard deviation values for the linear-spaced frequency bins throughout the duration of the buffer. In some examples, the average volume values may be computed in a different domain (e.g., a time domain) or with a different unit spacing (e.g., a logarithmic spacing).

At block 1408, the example media unit 106 computes a pre-equalization RMS value based on a frequency representation of the input media signal 202. In some examples, the energy calculator 236 computes a pre-equalization RMS value based on the frequency representation of the input media signal 202. In some examples, the energy calculator 236 utilizes a different type of calculation to determine the energy value of the input media signal 202.

At block 1410, the example media unit 106 inputs average values and standard deviation values for linear-spaced bins, along with a representation of an engineer tag into the EQ neural network 402. In some examples, the input feature set generator 238 inputs the average values and standard deviation values for linear-spaced frequency bins throughout the duration of the buffer to the EQ neural network 402. For non-reference or otherwise unidentified audio, the engineer tag is set to one particular value in a set of possible values. For example, the input feature set generator 238 can be configured such that the engineer tag is always set to a specific engineer indication when the audio is unidentified. In some examples, the engineer tag is represented as a vector with one of the vector elements being set to "1" for the selected engineer and the remaining vector elements being set to "0." In some examples, average and/or standard deviation values for the input media signal 202 may be input into the EQ neural network 402 in another form (e.g., a time domain format, an instantaneous volume instead of average, etc.).

At block 1412, the example media unit 106 receives gain/cut values for log-spaced frequency bins from the EQ neural network 402. In some examples, the volume adjuster 242 receives gain/cut values for log-spaced frequency bins from the EQ neural network 402. In some examples, the gains/cut values may be in a linear-spaced frequency representation and/or another domain.

At block 1414, the example media unit 106 converts the linear-spaced average frequency representation of the input media signal 202 to a log-spaced average frequency representation. In some examples, the volume adjuster 242 converts the linear-spaced average frequency representation of the input media signal 202 to a log-spaced frequency representation in order to apply the EQ gains/cuts 241 which have been received in a log-spaced format. In some examples, if the EQ gains/cuts 241 are received in a different format, the volume adjuster 242 adjusts the average frequency representation of the input media signal 202 to correspond to the same format as the EQ gains/cuts 241.

At block 1416, the example media unit 106 applies the gains/cuts to the log-spaced average frequency representation to determine an equalized log-spaced frequency representation. In some examples, the volume adjuster 242 applies the gains/cuts to the log-spaced average frequency representation to determine an equalized log-spaced average frequency representation of the input media signal 202. As in all steps of the machine readable instructions 1400, in some examples, applying the gains/cuts to the average representation of the incoming audio signal may be done in a different domain and/or with a different unit spacing.

At block 1418, the example media unit 106 executes thresholding to smooth the equalization curve. In some examples, the thresholding controller 244 executes thresholding to smooth the equalization curve. Detailed instructions to execute thresholding to smooth the equalization curve are illustrated and described in connection with FIG. 15.

At block 1420, the example media unit 106 computes a post-equalization RMS value. In some examples, the energy calculator 236 calculates a post-equalization RMS value based on equalized audio signal after the thresholding controller 244 has finished smoothing the equalization curve (e.g., after reduction of irregularities). In some examples, the energy calculator 236 calculates another measure of energy of the equalized audio signal. In some examples, the energy calculator 236 calculates the post-equalization RMS value after the EQ curve generator 246 generates and applies the final equalization curve (e.g., in a linear-spaced frequency representation) to the input media signal 202.

At block 1422, the example media unit 106 determines a volume normalization based on computation of pre-equalization RMS and post-equalization RMS. In some examples, the energy calculator 236 calculates a ratio (or other comparison metric) of the post-equalization RMS and the pre-equalization RMS and the volume normalizer 248 determines whether this ratio exceeds a threshold associated with a maximum acceptable change (e.g., associated with acceptable change) in energy of the audio signal. In some such examples, in response to the ratio exceeding the threshold, the volume normalizer 248 applies a normalization overall gain to the equalized audio signal. For example, if the overall energy of the audio signal after equalization is twice the overall energy before equalization, the volume normalizer 248 can apply an overall gain of one half to normalize the overall volume of the audio signal.

At block 1424, the example media unit 106 subtracts the average frequency representation from the equalized log-spaced frequency representation of the audio signal to determine a final equalization curve. In some examples, the EQ curve generator 246 subtracts the average frequency representation from the equalized log-spaced frequency representation of the audio signal to determine a final equalization curve.

At block 1426, the example media unit 106 applies the final equalization curve to the linear-spaced frequency representation of the input media signal 202. In some examples, the EQ curve generator 246 applies the final equalization curve, and additionally makes any overall gain adjustment indicated by the volume normalizer 248. In some examples, the volume normalizer 248 may perform volume normalization before or after the EQ curve generator 246 applies the final equalization curve.

At block 1428, the example media unit 106 performs an inverse frequency transform on the equalized frequency representation of the input media signal 202. In some examples, the frequency to time domain converter 250 performs an inverse frequency transform on the equalized frequency representation of the input media signal 202 to generate the output media signal 252.

At block 1430, the example media unit 106 determines whether to continue equalization. In response to continuing equalization, processing transfers to block 1402. Conversely, in response to not continuing equalization, processing terminates.

Figure 15:
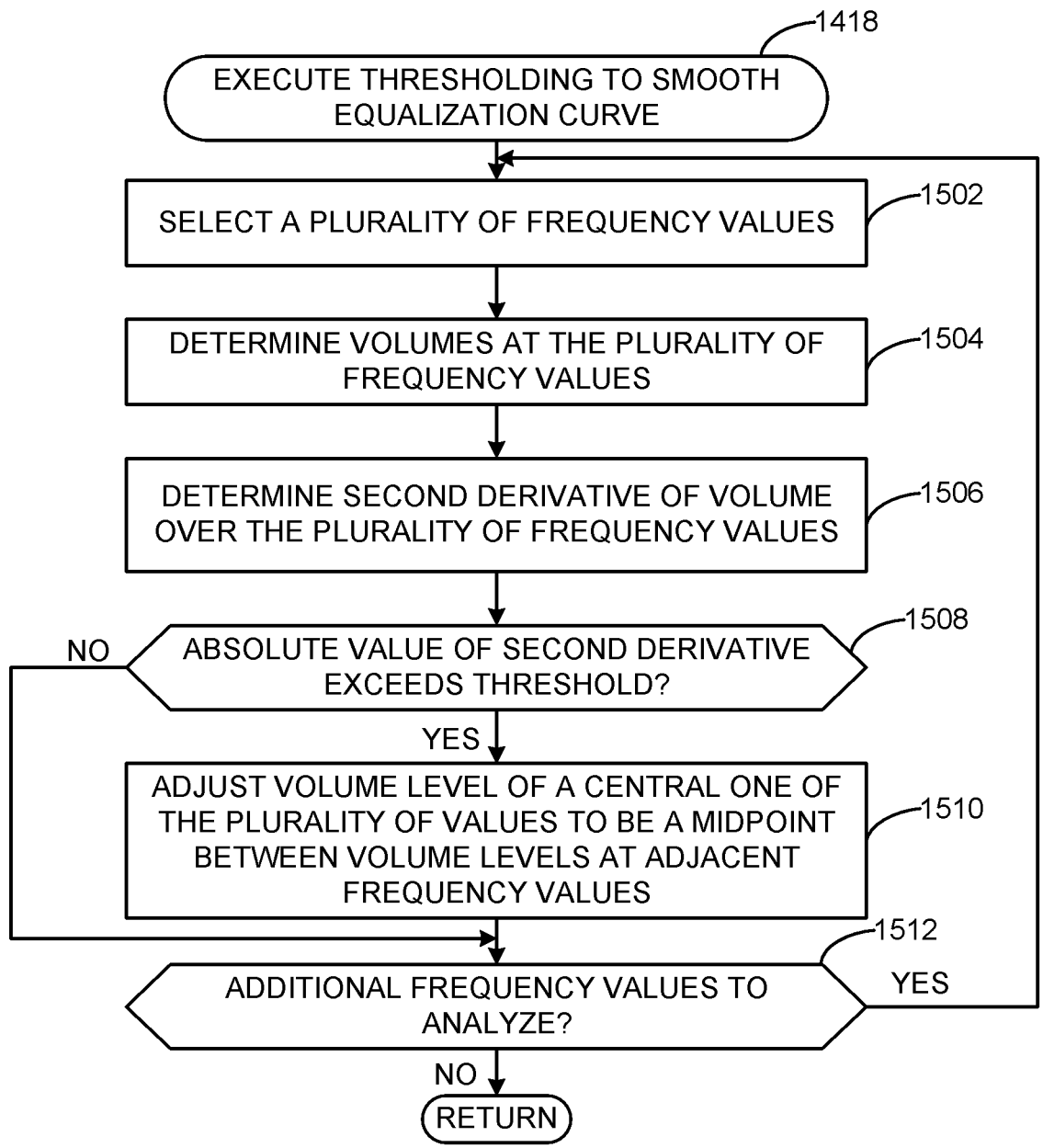
FIG. 15 is a flowchart representative of machine readable instructions that may be executed to implement the media unit of FIGS. 1 and 2 to smooth an equalization curve according to the third implementation.

FIG. 15 is a flowchart representative of example machine readable instructions 1500 that may be executed to implement the media unit 106 of FIGS. 1 and 2 to smooth an equalization curve according to the third implementation. With reference to the preceding figures and associated description, the example machine readable instructions 1500 begin with the example media unit 106 selecting a plurality of frequency values (block 1502). In some examples, the thresholding controller 244 selects a plurality of frequency values to analyze for irregular changes in volume (e.g., localized outliers). In some examples, the thresholding controller 244 selects a set of adjacent frequency values (e.g., three discrete consequent frequency values) to analyze at a time.

At block 1504, the example media unit 106 determines volumes at the plurality of frequency values. In some examples, the thresholding controller 244 determines volumes at the plurality of frequency values.

At block 1506, the example media unit 106 determines the second derivative of volume of the plurality of frequency values. In some examples, the thresholding controller 244 determines the second derivative of volume over the plurality of frequency values. In some examples, the thresholding controller 244 utilizes another technique to determine an amount of change in volume across the plurality of frequency values. One example technique to determine the second derivative of volume over the plurality of frequency values includes utilizing Equation 1, described in connection with FIG. 2 above in this description.

At block 1508, the example media unit 106 determines whether the absolute value of the second derivative exceeds a threshold. In some examples, the thresholding controller 244 determines whether the absolute value of the second derivative exceeds the threshold. In some examples, the thresholding controller 244 compares another calculation of the amount of change in volume across the plurality of frequency values to the threshold. In response to the absolute value of the second derivative exceeding the threshold, processing transfers to block 1510. Conversely, in response to the absolute value of the second derivative not exceeding the threshold, processing transfers to block 1512.

At block 1510, the example media unit 106 adjusts volume levels of a central one of the plurality of values to be a midpoint between volume levels at adjacent frequency values. In some examples, the thresholding controller 244 adjusts volume levels of a central one of the plurality of values to be a midpoint between volume levels at adjacent frequency values. In some examples, the thresholding controller 244 utilizes another method to adjust the central one of the plurality of values to be more similar to volumes at the adjacent frequency values, thereby reducing the irregularity in the equalization curve.

At block 1512, the example media unit 106 determines whether there are any additional frequency values to analyze. In some examples, the thresholding controller 244 determines whether there are any additional frequency values to analyze. In some examples, the thresholding controller 244 iterates through analyzing all of the frequency values one or more times. In some examples, the thresholding controller 244 iterates until all irregularities are removed, or until only a threshold number of irregularities remain. In response to there being additional frequency values to analyze, processing transfers to block 1502. Conversely, in response to there not being additional frequency values to analyze, processing returns to the machine readable instructions of FIG. 14 and proceeds to block 1420.

FIG. 16 is a flowchart representative of example machine readable instructions 1600 that may be executed to implement the audio EQ engine 118 of FIG. 4 to assemble a dataset to train and/or validate a neural network based on reference audio signals according to the third implementation. With reference to the preceding figures and associated description, the example machine readable instructions 1600 begin with the example audio EQ engine 118 accessing a library of reference audio signals (block 1602). In some examples, the EQ neural network 402 accesses a library of reference audio signals.

At block 1604, the example audio EQ engine 118 accesses equalization curves associated with the reference audio signals. In some examples, the EQ neural network 402 accesses the equalization curves associated with the reference audio signals.

At block 1606, the example audio EQ engine 118 accesses engineer tags and/or other metadata associated with the reference audio signals. In some examples, the EQ neural network 402 accesses engineer tags and/or other metadata associated with the reference audio signals.

At block 1608, the example audio EQ engine 118 associates samples of the reference audio signal with corresponding EQ curves and engineer tag(s). In some examples, the EQ neural network 402 associates samples of the reference audio signal with corresponding EQ curves and engineer tag(s).

At block 1610, the example audio EQ engine 118 determines whether there are additional reference audio signals to use for training. In some examples, the EQ neural network 402 determines whether there are additional ones of the reference audio signals, EQ curves, engineer tags to utilize for training. In response to there being additional reference audio signals to use for training, processing transfers to block 1602. Conversely, in response to there not being additional reference audio signals to use for training, processing terminates.

Figure 17A:
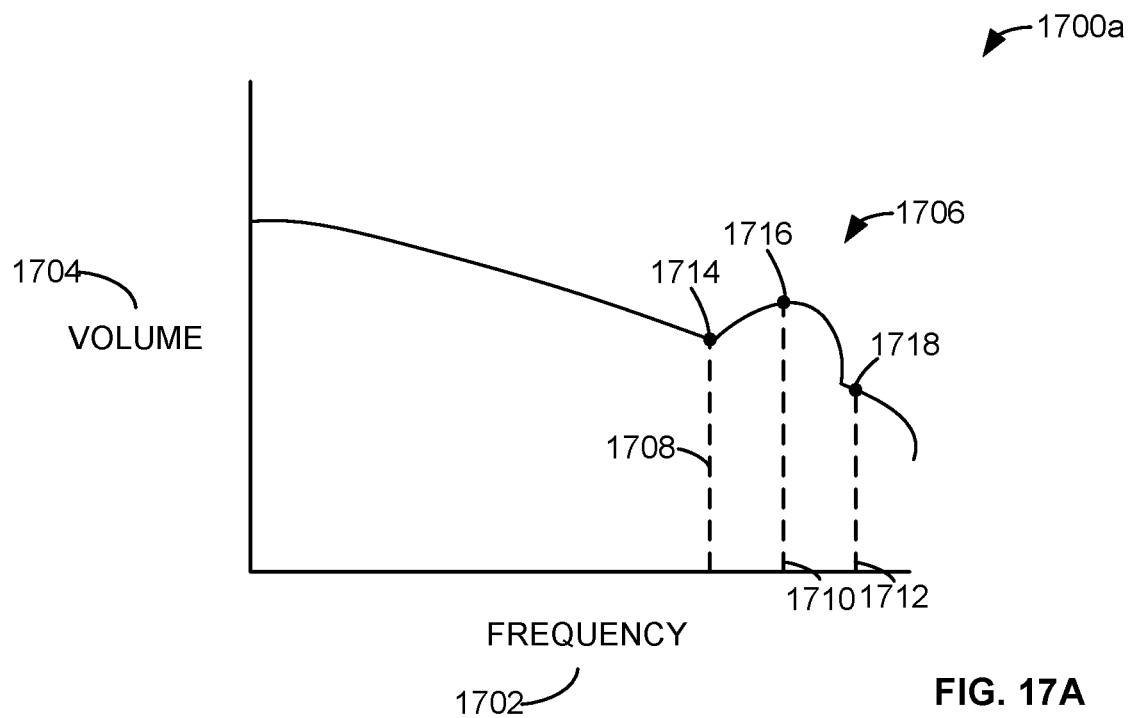
FIG. 17A is an example representation of an equalized audio signal prior to performing the smoothing techniques illustrated and described in connection with FIG. 15.
Figure 17B:
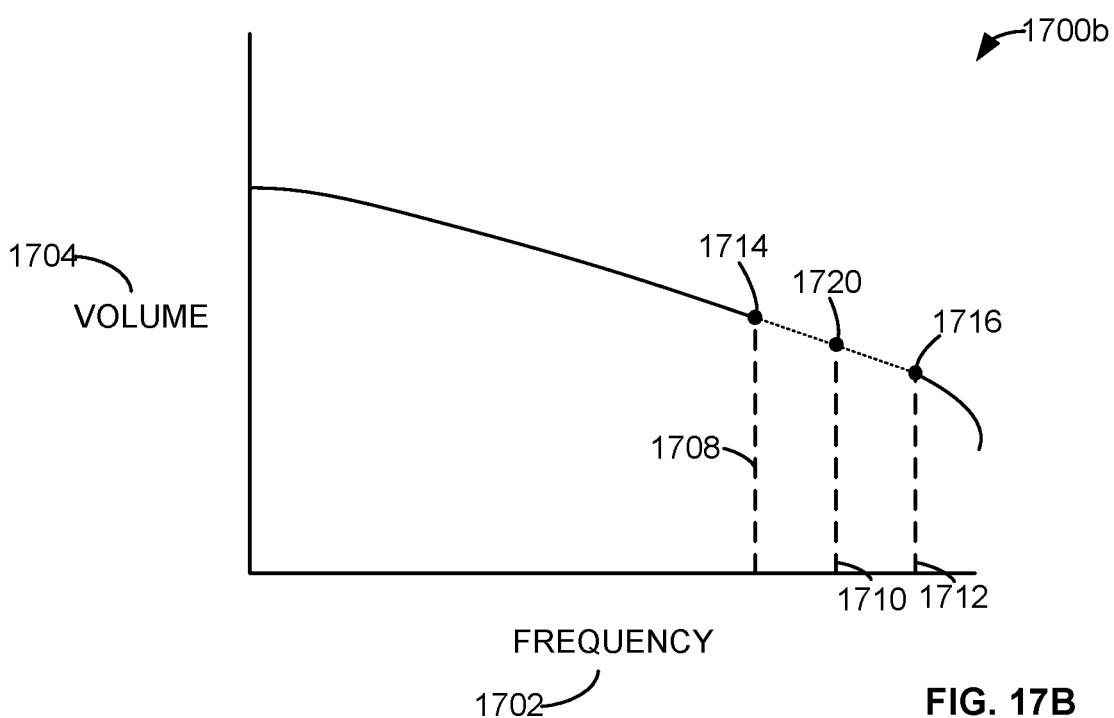
FIG. 17B is an example representation of the audio signal in FIG. 17A after performing the smoothing techniques illustrated and described in connection with FIG. 15, according to the third implementation.

FIG. 17A is an example first plot 1700 of an equalized audio signal prior to performing the smoothing techniques illustrated and described in connection with FIG. 15.

The example first plot 1700a includes an example frequency axis 1702, illustrating frequency values increasing from left-to-right (e.g., across the x-axis). The first plot 1700a includes an example volume axis 1704, illustrating volume values increasing from bottom-to-top (e.g., across the y-axis). In general, the first plot 1700a illustrates that the audio signal has higher volume levels at lower frequency values and the volume generally decreases as the frequency values increase. However, the first plot 1700a includes an example irregularity 1706.

The first plot 1700a includes an example first frequency value 1708, an example second frequency value 1710, and an example third frequency value 1712. The first frequency value 1708 corresponds to an example first volume 1714, the second frequency value 1710 corresponds to an example second volume 1716, and the third frequency value 1712 corresponds to an example third volume 1718. If the media unit 106 were to execute a thresholding procedure (e.g., via the thresholding controller 244) on the signal illustrated in the first plot 1700a, it may detect the irregularity 1706 (e.g., a localized outlier), since the volume changes significantly between the first frequency value 1708 and the second frequency value 1710, as well as between the second frequency value 1710 and the third frequency value 1712. If the thresholding controller 244 calculate the second derivative of volume (or other measure of volume change) between the volume levels at the first frequency value 1708, the second frequency value 1710, and the third frequency value 1712, it may determine that the second derivative exceeds a threshold and corresponds to the irregularity 1706.

FIG. 17B is an example second plot 1700b of the audio signal in FIG. 17A after performing the smoothing techniques illustrated and described in connection with FIG. 15. In the illustrated example of FIG. 17B, after detecting the irregularity 1706, the thresholding controller 244 adjusts a volume level associated with the second frequency value 1710 (e.g., a central one of the three frequency values under analysis). The second plot 1700b of FIG. 17B is substantially identical to the first plot 1700a, except that the second frequency value 1710 corresponds to an example fourth volume 1720 instead of the prior second volume 1716. In the illustrated example, the thresholding controller 244 adjusted the second volume 1716 to be the fourth volume 1720 by setting the volume at the second frequency value 1710 to the midpoint of the first volume 1714 and the third volume 1718. In the illustrated example, the remainder of the equalization curve between these frequency values is then generated as a smooth line. In the illustrated example of FIG. 17B, the adjusted portion of the equalization curve is illustrated as a dashed line connecting the first volume 1714, the fourth volume 1720, and the third volume 1718. The thresholding controller 244 may utilize any other technique to adjust volume levels at detected irregularities.

Figure 18:
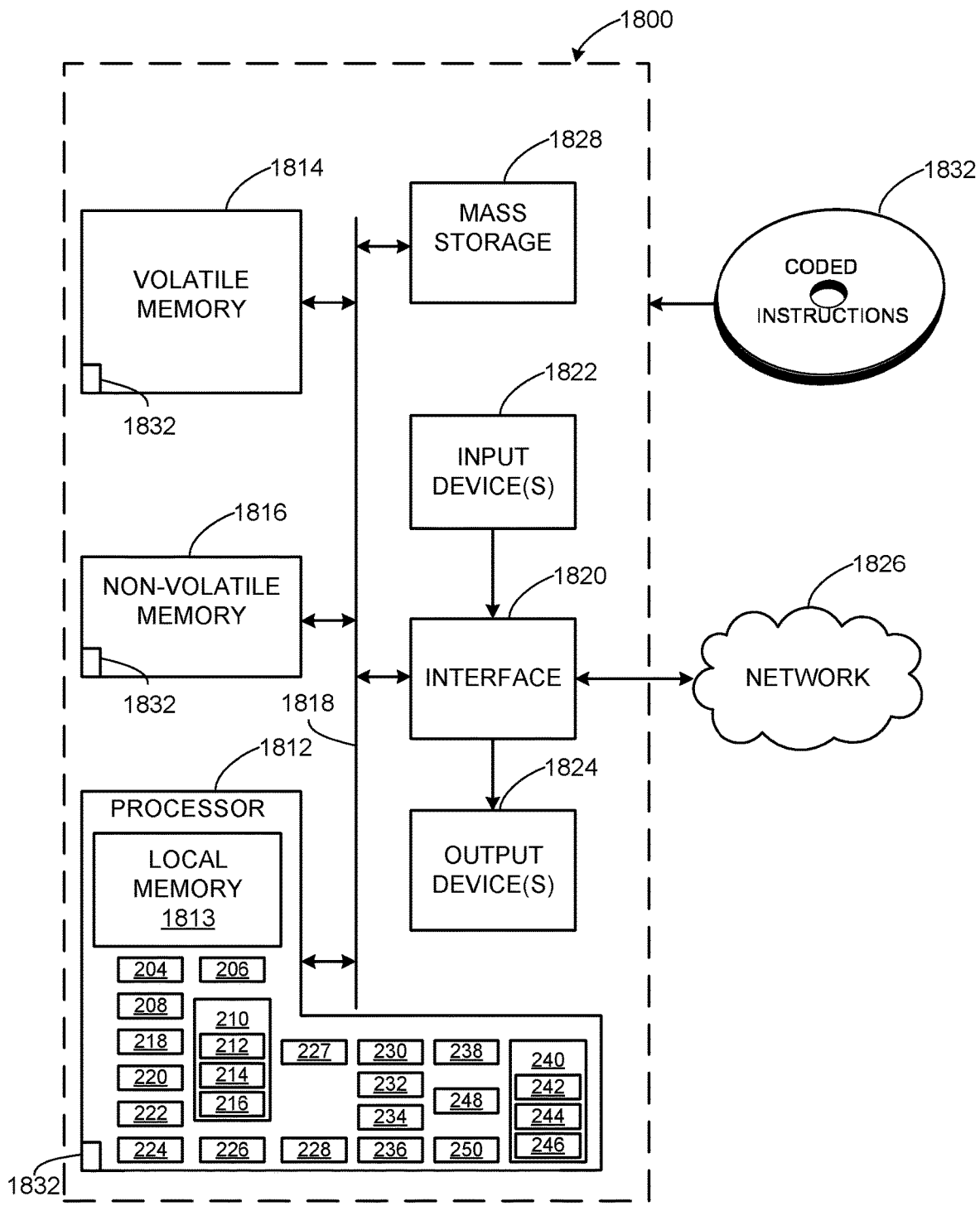
FIG. 18 is a block diagram of an example first processing platform structured to execute the instructions of FIGS. 5, 6, 11, 12, 14, and 15 to implement the media unit of FIGS. 1 and 2.

FIG. 18 is a block diagram of an example processor platform 1800 structured to execute the instructions of FIGS. 5, 6, 11, 12, 14, and 15 to implement the media unit 106 of FIGS. 1 and 2. The processor platform 1800 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1800 of the illustrated example includes a processor 1812. The processor 1812 of the illustrated example is hardware. For example, the processor 1812 can be implemented by one or more integrated circuits, logic circuits, microprocessors, GPUs, DSPs, or controllers from any desired family or manufacturer. The hardware processor 1812 may be a semiconductor based (e.g., silicon based) device. In this example, the processor 1812 implements the example signal transformer 204, the example EQ model query generator 206, the example EQ filter settings analyzer 208, the example EQ personalization manager 210, the example device parameter analyzer 212, the example historical EQ manager 214, the example user input analyzer 216, the example EQ filter selector 218, the example EQ adjustment implementor 220, the example smoothing filter configurator 222, the example data store 224, the example update monitor 226, the example fingerprint generator 227, the example synchronizer 228, the example buffer manager 230, the example time to frequency domain converter 232, the example volume calculator 234, the example energy calculator 236, the example input feature set generator 238, the example EQ manager 240, the example volume adjuster 242, the example thresholding controller 244, the example EQ curve generator 246, the example volume normalizer 248, and/or the example frequency to time domain converter 250.

The processor 1812 of the illustrated example includes a local memory 1813 (e.g., a cache). The processor 1812 of the illustrated example is in communication with a main memory including a volatile memory 1814 and a non-volatile memory 1816 via a bus 1818. The volatile memory 1814 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1816 may be implemented by flash memory and/or any other desired type of memory device. Access to the main memory 1814, 1816 is controlled by a memory controller.

The processor platform 1800 of the illustrated example also includes an interface circuit 1820. The interface circuit 1820 may be implemented by any type of interface standard, such as an Ethernet interface, a universal serial bus (USB), a Bluetooth® interface, a near field communication (NFC) interface, and/or a PCI express interface.

In the illustrated example, one or more input devices 1822 are connected to the interface circuit 1820. The input device(s) 1822 permit(s) a user to enter data and/or commands into the processor 1812. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1824 are also connected to the interface circuit 1820 of the illustrated example. The output devices 1824 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1820 of the illustrated example, thus, typically includes a graphics driver card, a graphics driver chip and/or a graphics driver processor.

The interface circuit 1820 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1826. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1800 of the illustrated example also includes one or more mass storage devices 1828 for storing software and/or data. Examples of such mass storage devices 1828 include floppy disk drives, hard drive disks, compact disk drives, Blu-ray disk drives, redundant array of independent disks (RAID) systems, and digital versatile disk (DVD) drives.

The machine readable instructions 1832 of FIG. 18, the machine readable instructions 500 of FIG. 5, the machine readable instructions 514 of FIG. 6, the machine readable instructions 1100 of FIG. 11, the machine readable instructions 1106 of FIG. 6, the machine readable instructions 1200 of FIG. 12, the machine readable instructions 1400 of FIG. 14, and/or the machine readable instructions 1418 of FIG. 15 may be stored in the mass storage device 1828, in the volatile memory 1814, in the non-volatile memory 1816, and/or on a removable non-transitory computer readable storage medium such as a CD or DVD.

Figure 19:
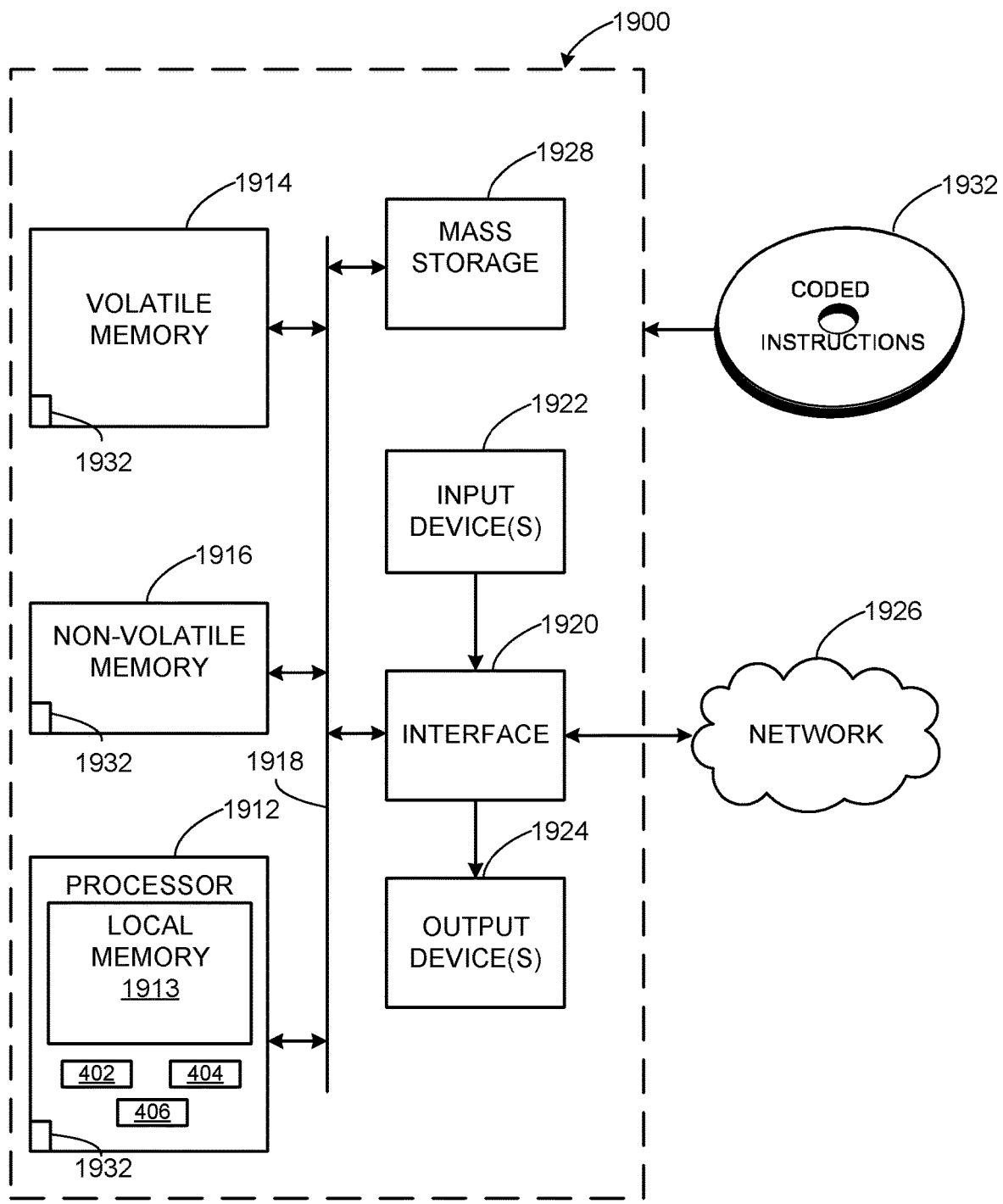
FIG. 19 is a block diagram of an example second processing platform structure to execute the instructions of FIGS. 7 and 16 to implement the audio EQ engine of FIGS. 1 and 4.

FIG. 19 is a block diagram of an example processor platform 1900 structured to execute the instructions of FIGS. 7 and 16 to implement the audio EQ engine 118 of FIGS. 1 and 4. The processor platform 1900 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1900 of the illustrated example includes a processor 1912. The processor 1912 of the illustrated example is hardware. For example, the processor 1912 can be implemented by one or more integrated circuits, logic circuits, microprocessors, GPUs, DSPs, or controllers from any desired family or manufacturer. The hardware processor 1912 may be a semiconductor based (e.g., silicon based) device. In this example, the processor 1912 implements the example EQ neural network 402, the example audio EQ scoring engine 404, and/or the example audio EQ engine validator 406.

The processor 1912 of the illustrated example includes a local memory 1913 (e.g., a cache). The processor 1912 of the illustrated example is in communication with a main memory including a volatile memory 1914 and a non-volatile memory 1916 via a bus 1918. The volatile memory 1914 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1916 may be implemented by flash memory and/or any other desired type of memory device. Access to the main memory 1914, 1916 is controlled by a memory controller.

The processor platform 1900 of the illustrated example also includes an interface circuit 1920. The interface circuit 1920 may be implemented by any type of interface standard, such as an Ethernet interface, a universal serial bus (USB), a Bluetooth® interface, a near field communication (NFC) interface, and/or a PCI express interface.

In the illustrated example, one or more input devices 1922 are connected to the interface circuit 1920. The input device(s) 1922 permit(s) a user to enter data and/or commands into the processor 1912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1924 are also connected to the interface circuit 1920 of the illustrated example. The output devices 1924 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1920 of the illustrated example, thus, typically includes a graphics driver card, a graphics driver chip and/or a graphics driver processor.

The interface circuit 1920 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1926. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1900 of the illustrated example also includes one or more mass storage devices 1928 for storing software and/or data. Examples of such mass storage devices 1928 include floppy disk drives, hard drive disks, compact disk drives, Blu-ray disk drives, redundant array of independent disks (RAID) systems, and digital versatile disk (DVD) drives.

The machine readable instructions 1932 of FIG. 19, the machine readable instructions 700 of FIG. 7, and/or the machine readable instructions 1600 of FIG. 16 may be stored in the mass storage device 1928, in the volatile memory 1914, in the non-volatile memory 1916, and/or on a removable non-transitory computer readable storage medium such as a CD or DVD.

Figure 20:
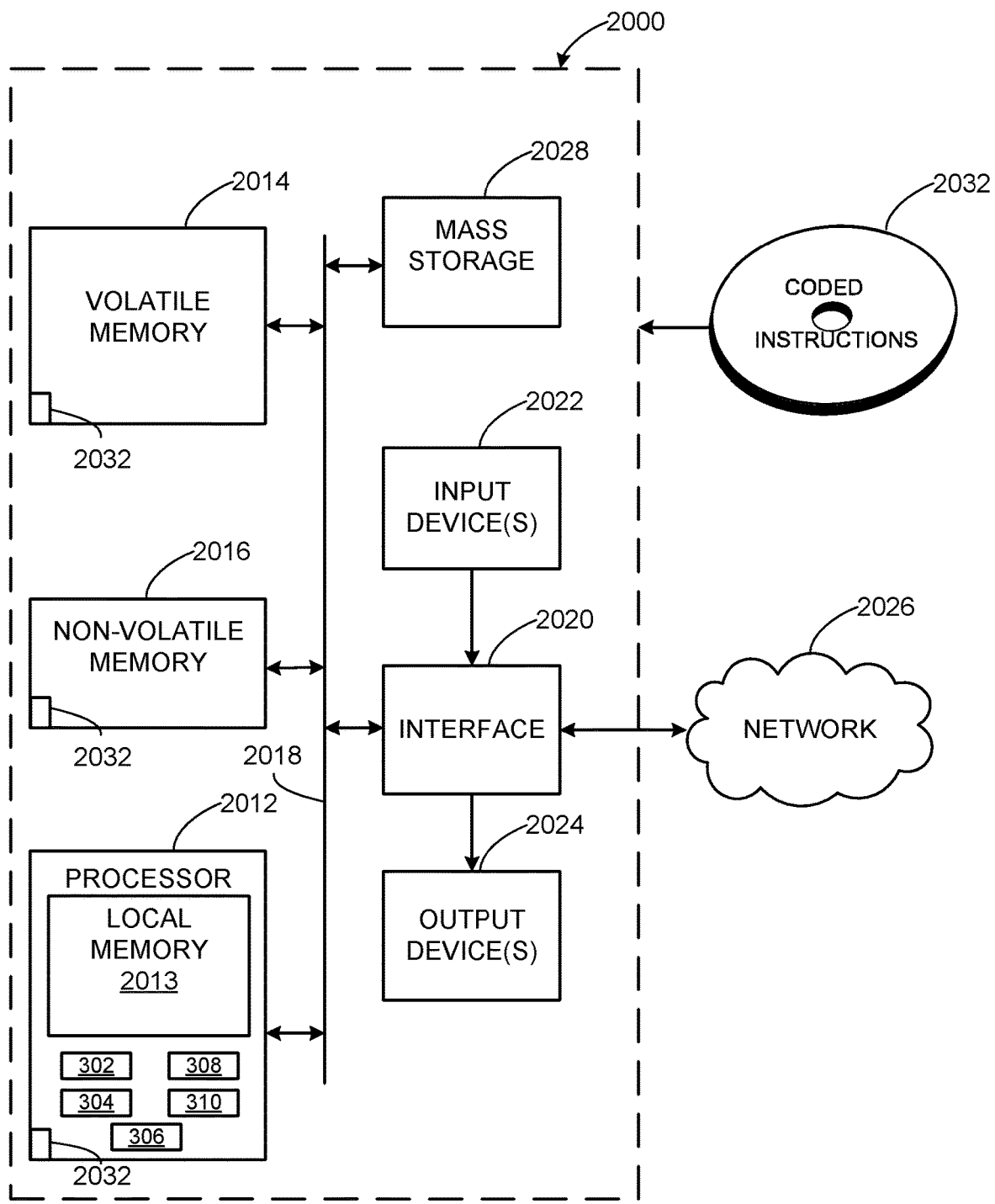
FIG. 20 is a block diagram of an example second processing platform structure to execute the instructions of FIG. 10 to implement the content profile engine of FIGS. 1 and 3.

FIG. 20 is a block diagram of an example processor platform 2000 structured to execute the instructions of FIG. 10 to implement the content profile engine 116 of FIGS. 1 and 3. The processor platform 2000 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 2000 of the illustrated example includes a processor 2012. The processor 2012 of the illustrated example is hardware. For example, the processor 2012 can be implemented by one or more integrated circuits, logic circuits, microprocessors, GPUs, DSPs, or controllers from any desired family or manufacturer. The hardware processor 2012 may be a semiconductor based (e.g., silicon based) device. In this example, the processor 2012 implements the example content retriever 302, the example fingerprint generator 304, the example content identifier 306, the example profiler 308, and/or the example profile data store 310.

The processor 2012 of the illustrated example includes a local memory 2013 (e.g., a cache). The processor 2012 of the illustrated example is in communication with a main memory including a volatile memory 2014 and a non-volatile memory 2016 via a bus 2018. The volatile memory 2014 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 2016 may be implemented by flash memory and/or any other desired type of memory device. Access to the main memory 2014, 2016 is controlled by a memory controller.

The processor platform 2000 of the illustrated example also includes an interface circuit 2020. The interface circuit 2020 may be implemented by any type of interface standard, such as an Ethernet interface, a universal serial bus (USB), a Bluetooth® interface, a near field communication (NFC) interface, and/or a PCI express interface.

In the illustrated example, one or more input devices 2022 are connected to the interface circuit 2020. The input device(s) 2022 permit(s) a user to enter data and/or commands into the processor 2012. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 2024 are also connected to the interface circuit 2020 of the illustrated example. The output devices 2024 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 2020 of the illustrated example, thus, typically includes a graphics driver card, a graphics driver chip and/or a graphics driver processor.

The interface circuit 2020 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 2026. The communication can be via, for example, an Ethernet connection, a digital subscriber line (DSL) connection, a telephone line connection, a coaxial cable system, a satellite system, a line-of-site wireless system, a cellular telephone system, etc.

The processor platform 2000 of the illustrated example also includes one or more mass storage devices 2028 for storing software and/or data. Examples of such mass storage devices 2028 include floppy disk drives, hard drive disks, compact disk drives, Blu-ray disk drives, redundant array of independent disks (RAID) systems, and digital versatile disk (DVD) drives.

The machine readable instructions 2032 of FIG. 20 and/or the machine readable instructions 1000 of FIG. 10 may be stored in the mass storage device 2028, in the volatile memory 2014, in the non-volatile memory 2016, and/or on a removable non-transitory computer readable storage medium such as a CD or DVD.

From the foregoing, it will be appreciated that example methods, apparatus and articles of manufacture have been disclosed that dynamically adjust audio playback settings to adapt to changes in individual tracks, changes between tracks, changes in genres, and/or any other changes in audio signals by analyzing the audio signals and utilizing a neural network to determine optimal audio playback settings. Further, example methods, apparatus, and articles of manufacture have been disclosed that utilize a smoothing filter to intelligently adjust audio playback settings without perceptible sharp shifts in volume levels or equalization settings. Additionally, techniques disclosed herein enable an equalization approach which synthesizes dynamic adjustments from track-to-track as well as user preferences (represented in a personalized EQ profile).

Moreover, the example methods, apparatus, and articles of manufacture disclosed herein intelligently equalize audio signals accounting for differences in source and/or other characteristics of the audio signals (e.g., genre, instruments present, etc.). Example techniques disclosed herein utilize a neural network trained with reference audio signals that have been equalized by audio engineers and input into the neural network with an indication of the specific audio engineers that equalized the reference audio signals. Utilization of such training enables the neural network to provide expert equalization outputs and make nuanced adjustments both between different tracks and even within same tracks. Further, example techniques disclosed herein improve upon the equalization outputs of the neural network by performing a thresholding technique to ensure that the final equalization curve applied on the incoming audio signal is smooth and has minimal irregularities that may be perceptible to a listener.

Example methods, apparatus, systems, and articles of manufacture for playback using pre-processed profile information and personalization are disclosed herein. Further examples and combinations thereof include the following:

Example 1 includes an apparatus comprising an equalization (EQ) model query generator to generate a query to a neural network, the query including a representation of a sample of an audio signal, an EQ filter settings analyzer to access a plurality of audio playback settings determined by the neural network based on the query, and determine a filter coefficient to apply to the audio signal based on the plurality of audio playback settings, and an EQ adjustment implementor to apply the filter coefficient to the audio signal in a first duration.

Example 2 includes the apparatus of example 1, wherein the representation of the sample of the audio signal corresponds to a frequency representation of the sample of the audio signal.

Example 3 includes the apparatus of example 1, wherein the plurality of audio playback settings includes one or more filters, wherein each of the one or more filters include one or more respective gain values, respective frequency values, or respective quality factor values associated with the sample of the audio signal.

Example 4 includes the apparatus of example 1, wherein the EQ filter settings analyzer is to determine the filter coefficient to apply to the audio signal based on a type of a filter associated with the filter coefficient to be applied to the audio signal.

Example 5 includes the apparatus of example 1, wherein the EQ adjustment implementor is to apply a smoothing filter to the audio signal to reduce sharp transitions in average gain values of the audio signal between the first duration and a second duration.

Example 6 includes the apparatus of example 1, further including a signal transformer to transform the audio signal to a frequency representation of the sample of the audio signal.

Example 7 includes the apparatus of example 1, wherein the EQ adjustment implementor is to adjust at least one of an amplitude characteristic, a frequency characteristic, or a phase characteristic of the audio signal based on the filter coefficient.

Example 8 includes a non-transitory computer readable storage medium comprising instructions which, when executed, cause one or more processors to at least generate a query to a neural network, the query including a representation of a sample of an audio signal, access a plurality of audio playback settings determined by the neural network based on the query, determine a filter coefficient to apply to the audio signal based on the plurality of audio playback settings, and apply the filter coefficient to the audio signal in a first duration.

Example 9 includes the non-transitory computer readable storage medium of example 8, wherein the representation of the sample of the audio signal corresponds to a frequency representation of the sample of the audio signal.

Example 10 includes the non-transitory computer readable storage medium of example 8, wherein the plurality of audio playback settings includes one or more filters, wherein each of the one or more filters include one or more respective gain values, respective frequency values, or respective quality factor values associated with the sample of the audio signal.

Example 11 includes the non-transitory computer readable storage medium of example 8, wherein the instructions, when executed, cause the one or more processors to determine the filter coefficient to apply to the audio signal based on a type of a filter associated with the filter coefficient to be applied to the audio signal.

Example 12 includes the non-transitory computer readable storage medium of example 8, wherein the instructions, when executed, cause the one or more processors to apply a smoothing filter to the audio signal to reduce sharp transitions in average gain values of the audio signal between the first duration and a second duration.

Example 13 includes the non-transitory computer readable storage medium of example 8, wherein the instructions, when executed, cause the one or more processors to transform the audio signal to a frequency representation of the sample of the audio signal.

Example 14 includes the non-transitory computer readable storage medium of example 8, wherein the instructions, when executed, cause the one or more processors to adjust at least one of an amplitude characteristic, a frequency characteristic, or a phase characteristic of the audio signal based on the filter coefficient.

Example 15 includes a method comprising generating a query to a neural network, the query including a representation of a sample of an audio signal, accessing a plurality of audio playback settings determined by the neural network based on the query, determining a filter coefficient to apply to the audio signal based on the plurality of audio playback settings, and applying the filter coefficient to the audio signal in a first duration.

Example 16 includes the method of example 15, wherein the representation of the sample of the audio signal corresponds to a frequency representation of the sample of the audio signal.

Example 17 includes the method of example 15, wherein the plurality of audio playback settings includes one or more filters, wherein each of the one or more filters include one or more respective gain values, respective frequency values, or respective quality factor values associated with the sample of the audio signal.

Example 18 includes the method of example 15, further including determining the filter coefficient to apply to the audio signal based on a type of a filter associated with the filter coefficient to be applied to the audio signal.

Example 19 includes the method of example 15, further including applying a smoothing filter to the audio signal to reduce sharp transitions in average gain values of the audio signal between the first duration and a second duration.

Example 20 includes the method of example 15, further including transforming the audio signal to a frequency representation of the sample of the audio signal.

Example 21 includes an apparatus comprising an equalization (EQ) model query generator to generate a query to a neural network, the query including a representation of a sample of an audio signal, an EQ filter settings analyzer to access a plurality of audio playback settings determined by the neural network based on the query, and determine a filter coefficient to apply to the audio signal based on the plurality of audio playback settings, an EQ personalization manager to, generate a personalized EQ setting, and an EQ adjustment implementor to blend the personalized EQ setting and the filter coefficient to generate a blended equalization, and apply the blended equalization to the audio signal in a first duration.

Example 22 includes the apparatus of example 21, further including a historical EQ manager to generate the personalized EQ setting based on past personalization settings, and in response to historical equalization being enabled, adjust the personalized EQ setting based on EQ settings associated with a previous period of time.

Example 23 includes the apparatus of example 21, further including a user input analyzer to in response to availability of data indicative of preferences of a user, determine EQ parameters based on the data indicative of preferences of the user, the EQ parameters corresponding to audio playback settings, and adjust the personalized EQ setting based on the EQ parameters determined based on the data indicative of preferences of the user.

Example 24 includes the apparatus of example 21, further including a device parameter analyzer to in response to availability of location data of a playback device, adjust the personalized EQ setting based on the location data of the playback device, in response to availability of identification of a user, adjust the personalized EQ setting based on a profile associated with the user, and in response to availability of information associated with a source of the audio signal, adjust the personalized EQ setting based on the source of the audio signal.

Example 25 includes the apparatus of example 21, wherein the EQ adjustment implementor is to apply weights to a first personalized EQ setting, a second personalized EQ setting, and the filter coefficient to generate the blended equalization.

Example 26 includes the apparatus of example 21, wherein the personalized EQ setting is based on at least one of EQ settings associated with a previous period of time, data indicative of preferences of a user, location data of a playback device, a profile associated with the user, or a source of the audio signal.

Example 27 includes the apparatus of example 21, wherein the EQ adjustment implementor is to apply a smoothing filter to the audio signal to reduce sharp transitions in average gain values of the audio signal between the first duration and a second duration.

Example 28 includes a non-transitory computer readable storage medium comprising instructions which, when executed, cause one or more processors to at least generate a query to a neural network, the query including a representation of a sample of an audio signal, access a plurality of audio playback settings determined by the neural network based on the query, determine a filter coefficient to apply to the audio signal based on the plurality of audio playback settings, generate a personalized EQ setting, blend the personalized EQ setting and the filter coefficient to generate a blended equalization, and apply the blended equalization to the audio signal in a first duration.

Example 29 includes the non-transitory computer readable storage medium of example 28, wherein the instructions, when executed, cause the one or more processors to generate the personalized EQ setting based on past personalization settings, and in response to historical equalization being enabled, adjust the personalized EQ setting based on EQ settings associated with a previous period of time.

Example 30 includes the non-transitory computer readable storage medium of example 28, wherein the instructions, when executed, cause the one or more processors to in response to availability of data indicative of preferences of a user, determine EQ parameters based on the data indicative of preferences of the user, the EQ parameters corresponding to audio playback settings, and adjust the personalized EQ setting based on the EQ parameters determined based on the data indicative of preferences of the user.

Example 31 includes the non-transitory computer readable storage medium of example 28, wherein the instructions, when executed, cause the one or more processors to in response to availability of location data of a playback device, adjust the personalized EQ setting based on the location data of the playback device, in response to availability of identification of a user, adjust the personalized EQ setting based on a profile associated with the user, and in response to availability of information associated with a source of the audio signal, adjust the personalized EQ setting based on the source of the audio signal.

Example 32 includes the non-transitory computer readable storage medium of example 28, wherein the instructions, when executed, cause the one or more processors to apply weights to a first personalized EQ setting, a second personalized EQ setting, and the filter coefficient to generate the blended equalization.

Example 33 includes the non-transitory computer readable storage medium of example 28, wherein the personalized EQ setting is based on at least one of EQ settings associated with a previous period of time, data indicative of preferences of a user, location data of a playback device, a profile associated with the user, or a source of the audio signal.

Example 34 includes the non-transitory computer readable storage medium of example 28, wherein the instructions, when executed, cause the one or more processors to apply a smoothing filter to the audio signal to reduce sharp transitions in average gain values of the audio signal between the first duration and a second duration.

Example 35 includes a method comprising generating a query to a neural network, the query including a representation of a sample of an audio signal, accessing a plurality of audio playback settings determined by the neural network based on the query, determining a filter coefficient to apply to the audio signal based on the plurality of audio playback settings, generating a personalized EQ setting, blending the personalized EQ setting and the filter coefficient to generate a blended equalization, and applying the blended equalization to the audio signal in a first duration.

Example 36 includes the method of example 35, further including generating the personalized EQ setting based on past personalization settings, and in response to historical equalization being enabled, adjusting the personalized EQ setting based on EQ settings associated with a previous period of time.

Example 37 includes the method of example 35, further including in response to availability of data indicative of preferences of a user, determining EQ parameters based on the data indicative of preferences of the user, the EQ parameters corresponding to audio playback settings, and adjusting the personalized EQ setting based on the EQ parameters determined based on the data indicative of preferences of the user.

Example 38 includes the method of example 35, further including in response to availability of location data of a playback device, adjusting the personalized EQ setting based on the location data of the playback device, in response to availability of identification of a user, adjusting the personalized EQ setting based on a profile associated with the user, and in response to availability of information associated with a source of the audio signal, adjusting the personalized EQ setting based on the source of the audio signal.

Example 39 includes the method of example 35, further including applying weights to a first personalized EQ setting, a second personalized EQ setting, and the filter coefficient to generate the blended equalization.

Example 40 includes the method of example 35, wherein the personalized EQ setting is based on at least one of EQ settings associated with a previous period of time, data indicative of preferences of a user, location data of a playback device, a profile associated with the user, or a source of the audio signal.

Example 41 includes an apparatus comprising a synchronizer to, in response to receiving a media signal to be played on a playback device, access an equalization (EQ) profile corresponding to the media signal, an EQ personalization manager to generate a personalized EQ setting, and an EQ adjustment implementor to modify playback of the media signal on the playback device based on a blended equalization generated based on the EQ profile and the personalized EQ setting.

Example 42 includes the apparatus of example 41, further including a historical EQ manager to generate the personalized EQ setting based on past personalization settings, and in response to historical equalization being enabled, adjust the personalized EQ setting based on EQ settings associated with a previous period of time.

Example 43 includes the apparatus of example 41, further including a user input analyzer to in response to availability of data indicative of preferences of a user, determine EQ parameters based on the data indicative of preferences of the user, the EQ parameters corresponding to audio playback settings, and adjust the personalized EQ setting based on the EQ parameters determined based on the data indicative of preferences of the user.

Example 44 includes the apparatus of example 41, further including a device parameter analyzer to in response to availability of location data of the playback device, adjust the personalized EQ setting based on the location data of the playback device, in response to availability of identification of a user, adjust the personalized EQ setting based on a user profile, and in response to availability of information associated with a source of the media signal, adjust the personalized EQ setting based on the source of the media signal.

Example 45 includes the apparatus of example 41, wherein the EQ adjustment implementor is to apply weights to a first personalized EQ setting, a second personalized EQ setting, and the EQ profile to generate the blended equalization.

Example 46 includes the apparatus of example 41, wherein the personalized EQ setting is based on at least one of EQ settings associated with a previous period of time, data indicative of preferences of a user, location data of the playback device, a user profile, or a source of the media signal.

Example 47 includes the apparatus of example 41, wherein the EQ profile includes playback attributes corresponding to at least one of (1) information identifying a category associated with a song, (2) information identifying a category associated with a video segment, (3) information identifying a mood associated with the song or the video segment, or (4) information identifying signal strength parameters for different frequencies with a portion of the media signal.

Example 48 includes a non-transitory computer readable storage medium comprising instructions which, when executed, cause one or more processors to at least in response to receiving a media signal to be played on a playback device, access an equalization (EQ) profile corresponding to the media signal, generate a personalized EQ setting, and modify playback of the media signal on the playback device based on a blended equalization generated based on the EQ profile and the personalized EQ setting.

Example 49 includes the non-transitory computer readable storage medium of example 48, wherein the instructions, when executed, cause the one or more processors to generate the personalized EQ setting based on past personalization settings, and in response to historical equalization being enabled, adjust the personalized EQ setting based on EQ settings associated with a previous period of time.

Example 50 includes the non-transitory computer readable storage medium of example 48, wherein the instructions, when executed, cause the one or more processors to in response to availability of data indicative of preferences of a user, determine EQ parameters based on the data indicative of preferences of the user, the EQ parameters corresponding to audio playback settings, and adjust the personalized EQ setting based on the EQ parameters determined based on the data indicative of preferences of the user.

Example 51 includes the non-transitory computer readable storage medium of example 48, wherein the instructions, when executed, cause the one or more processors to in response to availability of location data of the playback device, adjust the personalized EQ setting based on the location data of the playback device, in response to availability of identification of a user, adjust the personalized EQ setting based on a user profile, and in response to availability of information associated with a source of the media signal, adjust the personalized EQ setting based on the source of the media signal.

Example 52 includes the non-transitory computer readable storage medium of example 48, wherein the instructions, when executed, cause the one or more processors to apply weights to a first personalized EQ setting, a second personalized EQ setting, and the EQ profile to generate the blended equalization.

Example 53 includes the non-transitory computer readable storage medium of example 48, wherein the personalized EQ setting is based on at least one of EQ settings associated with a previous period of time, data indicative of preferences of a user, location data of the playback device, a user profile, or a source of the media signal.

Example 54 includes the non-transitory computer readable storage medium of example 48, wherein the EQ profile includes playback attributes corresponding to at least one of (1) information identifying a category associated with a song, (2) information identifying a category associated with a video segment, (3) information identifying a mood associated with the song or the video segment, or (4) information identifying signal strength parameters for different frequencies with a portion of the media signal.

Example 55 includes a method comprising in response to receiving a media signal to be played on a playback device, accessing an equalization (EQ) profile corresponding to the media signal, generating a personalized EQ setting, and modifying playback of the media signal on the playback device based on a blended equalization generated based on the EQ profile and the personalized EQ setting.

Example 56 includes the method of example 55, further including generating the personalized EQ setting based on past personalization settings, and in response to historical equalization being enabled, adjusting the personalized EQ setting based on EQ settings associated with a previous period of time.

Example 57 includes the method of example 55, further including in response to availability of data indicative of preferences of a user, determining EQ parameters based on the data indicative of preferences of the user, the EQ parameters corresponding to audio playback settings, and adjusting the personalized EQ setting based on the EQ parameters determined based on the data indicative of preferences of the user.

Example 58 includes the method of example 55, further including in response to availability of location data of the playback device, adjusting the personalized EQ setting based on the location data of the playback device, in response to availability of identification of a user, adjusting the personalized EQ setting based on a user profile, and in response to availability of information associated with a source of the media signal, adjusting the personalized EQ setting based on the source of the media signal.

Example 59 includes the method of example 55, further including applying weights to a first personalized EQ setting, a second personalized EQ setting, and the EQ profile to generate the blended equalization.

Example 60 includes the method of example 55, wherein the personalized EQ setting is based on at least one of EQ settings associated with a previous period of time, data indicative of preferences of a user, location data of the playback device, a user profile, or a source of the media signal.

Example 61 includes an apparatus comprising a volume adjuster to apply a plurality of equalization adjustments to an audio signal to generate an equalized audio signal, the plurality of equalization adjustments output from a neural network in response to an input feature set including an average volume representation of the audio signal, a thresholding controller to detect an irregularity in a frequency representation of the audio signal after application of the plurality of equalization adjustments, the irregularity corresponding to a change in volume between adjacent frequency values exceeding a threshold, and adjust a volume at a first frequency value of the adjacent frequency values to reduce the irregularity, an equalization (EQ) curve generator to generate an EQ curve to apply to the audio signal when the irregularity has been reduced, and a frequency to time domain converter to output the equalized audio signal in a time domain based on the EQ curve.

Example 62 includes the apparatus of example 61, further including an energy calculator to determine a first root mean square (RMS) value of the frequency representation of the audio signal prior to application of the plurality of equalization adjustments, determine a second RMS value of the frequency representation of the audio signal after reduction of the irregularity, and determine a ratio between the second RMS value and the first RMS value.

Example 63 includes the apparatus of example 61, further including a volume normalizer to determine whether a ratio between (1) a first RMS value of the frequency representation of the audio signal after reduction of the irregularity and (2) a second RMS value of the frequency representation of the audio signal prior to application of the plurality of equalization adjustments exceeds a threshold associated with acceptable change in energy of the audio signal, and in response to the ratio exceeding the threshold, apply a normalization of a gain of the frequency representation of the audio signal.

Example 64 includes the apparatus of example 61, wherein the plurality of equalization adjustments includes a plurality of volume adjustment values corresponding to a plurality of frequency ranges.

Example 65 includes the apparatus of example 61, wherein the thresholding controller is to select a plurality of frequency values in the frequency representation of the audio signal, determine a plurality of volume values associated with the plurality of frequency values, determine a second derivative of the volume over the plurality of frequency values, and in response to an absolute value of the second derivative exceeding the threshold, adjust the volume at the first frequency value of the adjacent frequency values to reduce the irregularity.

Example 66 includes the apparatus of example 61, wherein the plurality of equalization adjustments is based on at least reference audio signals, EQ curves, and tags associated with a plurality of audio engineers that generated the EQ curves, and wherein the neural network determines the plurality of equalization adjustments based on an inference associated with at least the reference audio signals, the EQ curves, and the tags associated with the plurality of audio engineers.

Example 67 includes the apparatus of example 66, wherein the input feature set includes the average volume representation of the audio signal and average standard deviation measurements for frequency bins of a frequency representation of the audio signal.

Example 68 includes a non-transitory compute readable storage medium comprising instructions which, when executed, cause one or more processors to at least apply a plurality of equalization adjustments to an audio signal to generate an equalized audio signal, the plurality of equalization adjustments output from a neural network in response to an input feature set including an average volume representation of the audio signal, detect an irregularity in a frequency representation of the audio signal after application of the plurality of equalization adjustments, the irregularity corresponding to a change in volume between adjacent frequency values exceeding a threshold, adjust a volume at a first frequency value of the adjacent frequency values to reduce the irregularity, generate an equalization (EQ) curve to apply to the audio signal when the irregularity has been reduced, and output the equalized audio signal in a time domain based on the EQ curve.

Example 69 includes the non-transitory computer readable storage medium of example 68, wherein the instructions, when executed, cause the one or more processors to determine a first root mean square (RMS) value of the frequency representation of the audio signal prior to application of the plurality of equalization adjustments, determine a second RMS value of the frequency representation of the audio signal after reduction of the irregularity, and determine a ratio between the second RMS value and the first RMS value.

Example 70 includes the non-transitory computer readable storage medium of example 68, wherein the instructions, when executed, cause the one or more processors to determine whether a ratio between (1) a first RMS value of the frequency representation of the audio signal after reduction of the irregularity and (2) a second RMS value of the frequency representation of the audio signal prior to application of the plurality of equalization adjustments exceeds a threshold associated with acceptable change in energy of the audio signal, and in response to the ratio exceeding the threshold, apply a normalization of a gain of the frequency representation of the audio signal.

Example 71 includes the non-transitory computer readable storage medium of example 68, wherein the plurality of equalization adjustment includes a plurality of volume adjustment values corresponding to a plurality of frequency ranges.

Example 72 includes the non-transitory computer readable storage medium of example 68, wherein the instructions, when executed, cause the one or more processors to select a plurality of frequency values in the frequency representation of the audio signal, determine a plurality of volume values associated with the plurality of frequency values, determine a second derivative of the volume over the plurality of frequency values, and in response to an absolute value of the second derivative exceeding the threshold, adjust the volume at the first frequency value of the adjacent frequency values to reduce the irregularity.

Example 73 includes the non-transitory computer readable storage medium of example 68, wherein the plurality of equalization adjustments is based on at least reference audio signals, EQ curves, and tags associated with a plurality of audio engineers that generated the EQ curves, and wherein the neural network determines the plurality of equalization adjustments based on an inference associated with at least the reference audio signals, the EQ curves, and the tags associated with the plurality of audio engineers.

Example 74 includes the non-transitory computer readable storage medium of example 73, wherein the input feature set includes the average volume representation of the audio signal and average standard deviation measurements for frequency bins of a frequency representation of the audio signal.

Example 75 includes a method comprising applying a plurality of equalization adjustments to an audio signal to generate an equalized audio signal, the plurality of equalization adjustments output from a neural network in response to an input feature set including an average volume representation of the audio signal, detecting an irregularity in a frequency representation of the audio signal after application of the plurality of equalization adjustments, the irregularity corresponding to a change in volume between adjacent frequency values exceeding a threshold, adjusting a volume at a first frequency value of the adjacent frequency values to reduce the irregularity, generating an equalization (EQ) curve to apply to the audio signal when the irregularity has been reduced, and outputting the equalized audio signal in a time domain based on the EQ curve.

Example 76 includes the method of example 75, further including determining a first root mean square (RMS) value of the frequency representation of the audio signal prior to application of the plurality of equalization adjustments, determining a second RMS value of the frequency representation of the audio signal after reduction of the irregularity, and determining a ratio between the second RMS value and the first RMS value.

Example 77 includes the method of example 75, further including determining whether a ratio between (1) a first RMS value of the frequency representation of the audio signal after reduction of the irregularity and (2) a second RMS value of the frequency representation of the audio signal prior to application of the plurality of equalization adjustments exceeds a threshold associated with acceptable change in energy of the audio signal, and in response to the ratio exceeding the threshold, applying a normalization of a gain of the frequency representation of the audio signal.

Example 78 includes the method of example 75, wherein the plurality of equalization adjustments includes a plurality of volume adjustment values corresponding to a plurality of frequency ranges.

Example 79 includes the method of example 75, further including selecting a plurality of frequency values in the frequency representation of the audio signal, determining a plurality of volume values associated with the plurality of frequency values, determining a second derivative of the volume over the plurality of frequency values, and in response to an absolute value of the second derivative exceeding the threshold, adjusting the volume at the first frequency value of the adjacent frequency values to reduce the irregularity.

Example 80 includes the method of example 75, wherein the plurality of equalization adjustments is based on at least reference audio signals, EQ curves, and tags associated with a plurality of audio engineers that generated the EQ curves, and wherein the neural network determines the plurality of equalization adjustments based on an inference associated with at least the reference audio signals, the EQ curves, and the tags associated with the plurality of audio engineers.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The invention claimed is:

1. A non-transitory computer readable storage medium comprising instructions which, when executed, cause one or more processors to perform a set of operations comprising:
   accessing a first equalization profile corresponding to a media signal;
   generating a personalized equalization setting based on at least a second equalization profile corresponding to an application associated with the media signal;
   generating a blended equalization by applying a first weight to the first equalization profile and a second weight to the personalized equalization setting; and
   modifying playback of the media signal on a playback device based on the blended equalization.

2. The non-transitory computer readable storage of claim 1, wherein the first equalization includes playback attributes corresponding to at least one of (1) information identifying a category associated with a song, (2) information identifying a category associated with a video segment, (3) information identifying a mood associated with a song, (4) information identifying a mood associated with a video segment, and (5) information identifying signal strength parameters for different frequencies with a portion of the media signal.

3. The non-transitory computer readable storage of claim 1, wherein the second equalization includes playback attributes corresponding to at least one of (1) information identifying a category associated with a song, (2) information identifying a category associated with a video segment, (3) information identifying a mood associated with a song, (4) information identifying a mood associated with a video segment, and (5) information identifying signal strength parameters for different frequencies with a portion of the media signal.

4. The non-transitory computer readable storage of claim 1, wherein the personalized equalization setting comprises one or more previous personalization equalization settings.

5. The non-transitory computer readable storage of claim 1, wherein the set of operations further comprise adjusting the personalized equalization setting based on one or more previous personalization equalization settings.

6. The non-transitory computer readable storage of claim 1, wherein the personalized equalization setting is based on data indicating one or more preferences of a user.

7. The non-transitory computer readable storage of claim 1, wherein the set of operations further comprise adjusting the personalized equalization setting based on data indicating one or more preferences of a user.

8. The non-transitory computer readable storage of claim 1, wherein the personalized equalization setting is based on data indicating a location of the playback device.

9. The non-transitory computer readable storage of claim 1, wherein the set of operations further comprise adjusting the personalized equalization setting based on data indicating a location of the playback device.

10. The non-transitory computer readable storage of claim 1, wherein accessing the first equalization profile corresponding to the media signal is in response to receiving the media signal to be played on the playback device.

11. A method comprising:
accessing a first equalization profile corresponding to a media signal;
generating a personalized equalization setting based on at least a second equalization profile corresponding to an application associated with the media signal;
generating a blended equalization by applying a first weight to the first equalization profile and a second weight to the personalized equalization setting; and
modifying playback of the media signal on a playback device based on the blended equalization.

12. The method of claim 11, wherein the first equalization includes playback attributes corresponding to at least one of (1) information identifying a category associated with a song, (2) information identifying a category associated with a video segment, (3) information identifying a mood associated with a song, (4) information identifying a mood associated with a video segment, and (5) information identifying signal strength parameters for different frequencies with a portion of the media signal.

13. The method of claim 11, wherein the second equalization includes playback attributes corresponding to at least one of (1) information identifying a category associated with a song, (2) information identifying a category associated with a video segment, (3) information identifying a mood associated with a song, (4) information identifying a mood associated with a video segment, and (5) information identifying signal strength parameters for different frequencies with a portion of the media signal.

14. The method of claim 11, wherein the personalized equalization setting comprises one or more previous personalization equalization settings.

15. The method of claim 11, wherein the set of operations further comprise adjusting the personalized equalization setting based on one or more previous personalization equalization settings.

16. The method of claim 11, wherein the personalized equalization setting is based on data indicating one or more preferences of a user.

17. The method of claim 11, wherein the set of operations further comprise adjusting the personalized equalization setting based on data indicating one or more preferences of a user.

18. The method of claim 11, wherein the personalized equalization setting is based on data indicating a location of the playback device.

19. The method of claim 11, wherein the set of operations further comprise adjusting the personalized equalization setting based on data indicating a location of the playback device.

20. A computing device comprising:
one or more processors; and
a non-transitory computer readable storage medium comprising instructions which, when executed, cause the one or more processors to perform a set of operations comprising:
  accessing a first equalization profile corresponding to a media signal;
  generating a personalized equalization setting based on at least a second equalization profile corresponding to an application associated with the media signal;
  generating a blended equalization by applying a first weight to the first equalization profile and a second weight to the personalized equalization setting; and
  modifying playback of the media signal on a playback device based on the blended equalization.

* * * * *